(12) United States Patent
Yamazaki et al.

(10) Patent No.: US 9,391,096 B2
(45) Date of Patent: Jul. 12, 2016

(54) SEMICONDUCTOR DEVICE AND METHOD FOR MANUFACTURING THE SAME

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Daisuke Matsubayashi, Kanagawa (JP); Hideomi Suzawa, Kanagawa (JP); Tetsuhiro Tanaka, Kanagawa (JP); Hirokazu Watanabe, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/154,483

(22) Filed: Jan. 14, 2014

(65) Prior Publication Data

US 2014/0203276 A1    Jul. 24, 2014

(30) Foreign Application Priority Data

Jan. 18, 2013   (JP) ................... 2013-007894

(51) Int. Cl.
*H01L 29/10* (2006.01)
*H01L 27/12* (2006.01)
*H01L 29/49* (2006.01)
(Continued)

(52) U.S. Cl.
CPC ........ *H01L 27/1225* (2013.01); *H01L 27/1222* (2013.01); *H01L 29/4908* (2013.01); *H01L 29/66969* (2013.01); *H01L 29/7869* (2013.01); *H01L 29/78633* (2013.01); *H01L 29/78648* (2013.01); *H01L 29/78696* (2013.01)

(58) Field of Classification Search
None
See application file for complete search history.

(56) References Cited

U.S. PATENT DOCUMENTS 5,528,032 A   6/1996   Uchiyama
5,731,856 A   3/1998   Kim et al.
5,744,864 A   4/1998   Cillessen et al.
(Continued)

FOREIGN PATENT DOCUMENTS

EP   1737044 A   12/2006
EP   2226847 A   9/2010
(Continued)

OTHER PUBLICATIONS

Ono et al., "Novel High Performance IGZO-TFT with High Mobility over 40 cm2/Vs and High Photostability Incorporated Oxygen Diffusion,", IDW '11 : Proceedings of the 18th International Display Workshops, Dec. 7, 2011, pp. 1689-1690.
(Continued)

*Primary Examiner* — Benjamin Sandvik
*Assistant Examiner* — Herve Assouman
(74) *Attorney, Agent, or Firm* — Nixon Peabody LLP; Jeffrey L. Costellia

(57) ABSTRACT

To provide a highly reliable semiconductor device. The semiconductor device includes a first oxide layer over an insulating film; an oxide semiconductor layer over the first oxide layer; a gate insulating film over the oxide semiconductor layer; and a gate electrode over the gate insulating film. The first oxide layer contains indium. The oxide semiconductor layer contains indium and includes a channel formation region. The distance from the interface to the channel formation region is 20 nm or more, preferably 30 nm or more, further preferably 40 nm or more, still further preferably 60 nm or more.

40 Claims, 30 Drawing Sheets

(51) Int. Cl.
*H01L 29/66* (2006.01)
*H01L 29/786* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,923,722 B2 | 4/2011 | Ryu et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,421,083 B2 | 4/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1* | 10/2008 | Hoffman et al. ............ 438/104 |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0181565 A1 | 7/2010 | Sakata et al. |
| 2010/0224871 A1* | 9/2010 | Yamaguchi et al. ............ 257/43 |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0090204 A1 | 4/2011 | Yamazaki et al. |
| 2011/0140100 A1* | 6/2011 | Takata et al. ..................... 257/43 |
| 2011/0175080 A1* | 7/2011 | Kim et al. ....................... 257/43 |
| 2011/0193083 A1 | 8/2011 | Kim et al. |
| 2011/0215328 A1 | 9/2011 | Morosawa et al. |
| 2011/0240987 A1* | 10/2011 | Lee ................... H01L 29/78648 257/43 |
| 2011/0240991 A1 | 10/2011 | Yamazaki |
| 2011/0240992 A1* | 10/2011 | Yamazaki ........... H01L 27/1225 257/43 |
| 2012/0097942 A1* | 4/2012 | Imoto ............... H01L 21/02554 257/43 |
| 2012/0119205 A1 | 5/2012 | Taniguchi et al. |
| 2012/0153278 A1 | 6/2012 | Jeong et al. |
| 2012/0305913 A1 | 12/2012 | Yamazaki et al. |
| 2013/0009209 A1 | 1/2013 | Yamazaki |
| 2013/0270552 A1 | 10/2013 | Yamazaki et al. |
| 2013/0320330 A1 | 12/2013 | Yamazaki |
| 2013/0320334 A1 | 12/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | H06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002/270617 | 9/2002 |

(56) References Cited

FOREIGN PATENT DOCUMENTS

| JP | 2002-289859 A | 10/2002 |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006165528 | 6/2006 |
| JP | 2007-096055 | 4/2007 |
| JP | 2007-123861 | 5/2007 |
| JP | 2009-231613 | 10/2009 |
| JP | 2010-016347 | 1/2010 |
| JP | 4415062 | 2/2010 |
| JP | 2010067954 | 3/2010 |
| JP | 2010-073881 | 4/2010 |
| JP | 2010-177431 | 8/2010 |
| JP | 4571221 | 10/2010 |
| JP | 2011124360 | 6/2011 |
| JP | 2011-243745 | 12/2011 |
| JP | 2012-160679 | 8/2012 |
| WO | WO-2004/114391 | 12/2004 |
| WO | WO2008/133345 | 11/2008 |

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

Kimizuka et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$-$ZnGa_2O_4$-$ZnO$ System", Journal of Solid State Chemistry, 1995, vol. 116, pp. 170-178.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures Over 1000°C", Journal of Solid State Chemistry, 1985, vol. 60, pp. 382-384.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZNO TFTS) for AMLCDS", Journal of the SID, 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al. "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Asaoka.Y et al., "29.1,Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2. Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Cho.D et al., "21.2AL and SN-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Ohara.H et al., "21.3:4.0 IN. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Osada,T et al., "Development of Driver-Integrated Panel Using Amorphous In-Ga-Zn-Oxide TFT", AM-FPD '09 Digest of Technical Papers, Jul. 1, 2009, pp. 33-36.

Godo.H et al., "Temperature Dependence of Characteristics and Electronic Structure For Amorphous In-Ga-Zn-Oxide TFT", AM-FPD '09 Digest of Technical Papers, Jul. 1, 2009, pp. 41-44.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp.165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters), 2005, vol.87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by AR Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-635.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 65, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Orm et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

CAAC nc

FIG. 16A1
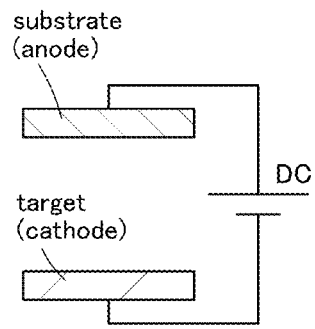
FIG. 16A2
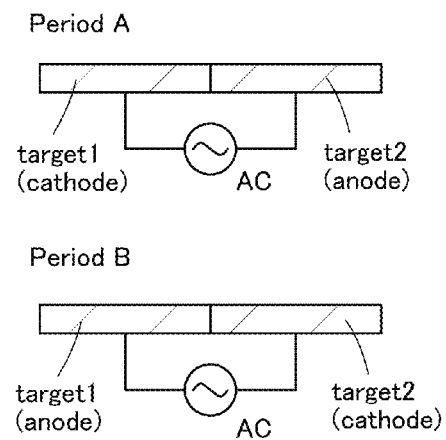
FIG. 16B1
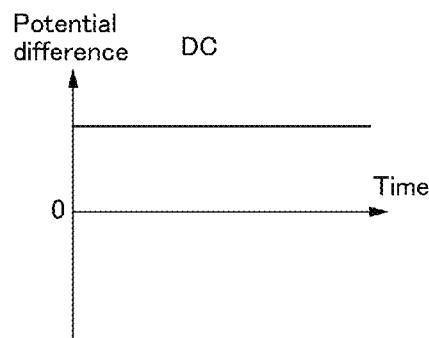
FIG. 16B2
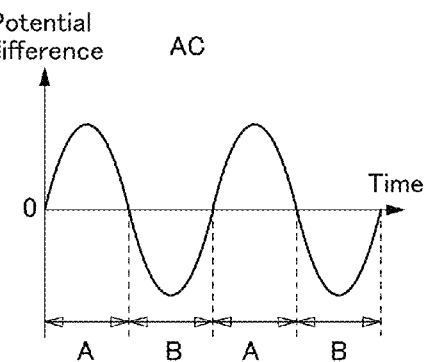
FIG. 16C1
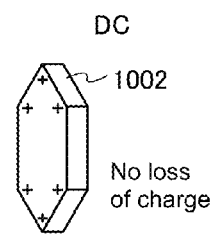
FIG. 16C2
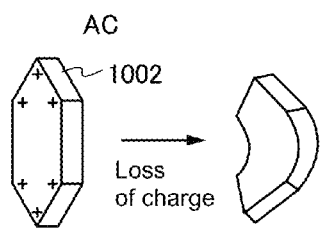

Oxide layer 206a 20nm, L 0.48μm, W 1μm

Oxide layer 206a 20nm, L 1.1μm, W 1μm

Oxide layer 206a 40nm, L 0.46μm, W 1μm

Oxide layer 206a 40nm, L 1.1μm, W 1μm

Oxide layer 206a 20nm, L 0.48μm, W 1μm

Oxide layer 206a 20nm, L 0.48μm, W 1μm

Oxide layer 206a 40nm, L 0.46μm, W 1μm

Oxide layer 206a 40nm, L 0.46μm, W 1μm

SEMICONDUCTOR DEVICE AND METHOD FOR MANUFACTURING THE SAME

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor layer, a semiconductor device, a display device, a liquid crystal display device, or a light-emitting device. In addition, the present invention relates to a method for manufacturing a semiconductor device, a display device, a liquid crystal display device, or a light-emitting device. Alternatively, the present invention relates to a driving method of a semiconductor device, a display device, a liquid crystal display device, or a light-emitting device. In particular, the present invention relates to a semiconductor device, a display device, or a light-emitting device each including a transistor, or a driving method thereof, for example. Further, the present invention relates to, for example, an electronic device including the semiconductor device, the display device, or the light-emitting device.

Note that in this specification, a semiconductor device refers to any device that can function by utilizing semiconductor characteristics, and an electro-optical device, a semiconductor circuit, an electronic device, and the like are all included in the category of the semiconductor device.

2. Description of the Related Art

A technique for forming a transistor by using a semiconductor layer formed over a substrate having an insulating surface has attracted attention. The transistor is applied to a wide range of semiconductor devices such as an integrated circuit and a display device. A silicon layer is known as a semiconductor layer applicable to a transistor.

Whether an amorphous silicon layer or a polycrystalline silicon layer is used as a semiconductor layer in a transistor depends on the purpose. For example, in the case of a transistor included in a large display device, an amorphous silicon layer, which can be formed using an established technique for forming a film over a large substrate, is preferably used. On the other hand, in the case of a transistor included in a high-performance display device where driver circuits are formed over the same substrate, a polycrystalline silicon layer, which can form a transistor having a high field-effect mobility, is preferably used. As a method for forming a polycrystalline silicon layer, high-temperature heat treatment or laser light treatment which is performed on an amorphous silicon layer has been known.

In recent years, an oxide semiconductor layer has attracted attention. For example, a transistor which includes an amorphous oxide semiconductor layer containing indium, gallium, and zinc has been disclosed (see Patent Document 1). Further, a transistor including three amorphous oxide semiconductor layers which are stacked has been disclosed (see Patent Document 2 and Patent Document 3).

An oxide semiconductor layer can be formed by a sputtering method or the like, and thus can be used for a channel formation region of a transistor in a large display device. A transistor including an oxide semiconductor layer has a high field-effect mobility; therefore, a high-performance display device where driver circuits are formed over the same substrate can be formed. Moreover, there is an advantage that capital investment can be reduced because part of production equipment for a transistor including an amorphous silicon layer can be improved to be used for an oxide semiconductor layer.

Note that homologous compounds represented by $InMO_3(ZnO)_m$ (M is Fe, Ga, or Al and m is a natural number) are known (see Non-Patent Document 1). Among homologous compounds represented by $InMO_3(ZnO)_m$, a crystal where M is gallium (Ga) is sometimes referred to as "Kumizuka crystal" named after Dr. Noboru Kimizuka who succeeded in synthesizing the crystal for the first time.

REFERENCE

Patent Document

[Patent Document 1] Japanese Published Patent Application No. 2006-165528
[Patent Document 2] Japanese Published Patent Application No. 2010-67954
[Patent Document 3] Japanese Published Patent Application No. 2011-124360
[Non-Patent Document 1] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System", *J. Solid State Chem.*, 1995, Vol. 116, pp. 170-178

SUMMARY OF THE INVENTION

An object is to provide a highly reliable semiconductor device or the like.

Another object is to provide a transistor or the like with a small influence of an interface state. Another object is to provide a transistor or the like having stable electrical characteristics. Another object is to provide a transistor or the like having low off-state current. Another object is to provide a transistor or the like having high field-effect mobility. Another object is to provide a transistor or the like with a small number of steps. Another object is to provide a transistor or the like with high yield. Another object is to provide a semiconductor device or the like including the transistor or the like. Another object is to provide a novel semiconductor device or the like.

Note that the descriptions of these objects do not disturb the existence of other objects. Note that in one embodiment of the present invention, there is no need to achieve all the objects. Other objects will be apparent from and can be derived from the description of the specification, the drawings, the claims, and the like.

An embodiment of the present invention is a transistor with small deterioration due to electric charge captured by trap states, for example. Another embodiment of the present invention is a semiconductor device including the transistor.

Another embodiment of the present invention is a transistor with a low density of trap states, for example. Another embodiment of the present invention is a semiconductor device including the transistor.

Another embodiment of the present invention is a semiconductor device including, for example, a first oxide layer over an insulating film; an oxide semiconductor layer over the first oxide layer; a gate insulating film over the oxide semiconductor layer; and a gate electrode over the gate insulating film. The first oxide layer contains indium. The oxide semiconductor layer contains indium and includes a channel formation region. An interface state is formed at an interface between the first oxide layer and the insulating film. The distance from the interface to the channel formation region is 20 nm or more, preferably 30 nm or more, further preferably 40 nm or more, still further preferably 60 nm or more.

Another embodiment of the present invention is a semiconductor device including, for example, a first oxide layer over an insulating film; an oxide semiconductor layer over the first oxide layer; a gate insulating film over the oxide semiconductor layer; and a gate electrode over the gate insulating film. The first oxide layer contains indium, gallium, and zinc. The oxide semiconductor layer contains indium, gallium, and zinc and includes a channel formation region. An interface state is formed at an interface between the first oxide layer and the insulating film. The distance from the interface to the channel formation region is 20 nm or more, preferably 30 nm or more, further preferably 40 nm or more, still further preferably 60 nm or more.

Another embodiment of the present invention is a semiconductor device including, for example, a first oxide layer over an insulating film; an oxide semiconductor layer over the first oxide layer; a gate insulating film over the oxide semiconductor layer; and a gate electrode over the gate insulating film. The oxide semiconductor layer includes a channel formation region. An interface state is formed at an interface between the first oxide layer and the insulating film. The distance from the interface to the channel formation region is 20 nm or more, preferably 30 nm or more, further preferably 40 nm or more, still further preferably 60 nm or more.

The semiconductor device of one embodiment of the present invention includes, for example, a second oxide layer containing one or more kinds of metal elements forming the oxide semiconductor layer, between the oxide semiconductor layer and the gate insulating film.

The semiconductor device of one embodiment of the present invention includes, for example, a source electrode and a drain electrode between the oxide semiconductor layer and the second oxide layer.

In the semiconductor device of one embodiment of the present invention, for example, the oxide semiconductor layer includes a crystal part whose c-axis is aligned in a direction parallel to a vector normal to an interface between the oxide semiconductor layer and the first oxide layer.

In the semiconductor device of one embodiment of the present invention, for example, the first oxide layer includes a crystal part whose size is greater than or equal to 1 nm and less than or equal to 10 nm.

In the semiconductor device of one embodiment of the present invention, for example, the second oxide layer includes a crystal part whose size is greater than or equal to 1 nm and less than or equal to 10 nm.

Another embodiment of the present invention is a method for manufacturing a semiconductor device including the steps of, for example, forming a first oxide layer over a first insulating film from which oxygen is released by heat treatment; forming an oxide semiconductor layer over the first oxide layer; forming a source electrode and a drain electrode over the oxide semiconductor layer; forming a second oxide layer so as to cover the first insulating film, the first oxide layer, the oxide semiconductor layer, the source electrode, and the drain electrode and then performing heat treatment; forming a second insulating film over the second oxide layer; forming a conductive film over the second insulating film; forming a gate electrode by etching part of the conductive film; forming a gate insulating film by etching part of the second insulating film; and forming a third oxide layer by etching part of the second oxide layer.

Another embodiment of the present invention is a method for manufacturing a semiconductor device including the steps of, for example, forming a first oxide layer over a first insulating film from which oxygen is released by heat treatment; forming an oxide semiconductor layer over the first oxide layer; forming a second oxide layer so as to cover the first insulating film, the first oxide layer, and the oxide semiconductor layer and then performing heat treatment; forming a second insulating film over the second oxide layer; forming a conductive film over the second insulating film; forming a gate electrode by etching part of the conductive film; forming a gate insulating film by etching part of the second insulating film; and forming a third oxide layer by etching part of the second oxide layer.

In any of the above methods, the gate insulating film is an insulating film from which oxygen is released by heat treatment.

Any of the above methods further includes the steps of forming a third insulating film over the first insulating film, the first oxide layer, the oxide semiconductor layer, the source electrode, the drain electrode, the third oxide layer, the gate insulating film, and the gate electrode; and forming a fourth insulating film having a function of blocking oxygen over the third insulating film.

Accordingly, a highly reliable semiconductor device can be provided.

Alternatively, a transistor with a small influence of an interface state can be provided. Alternatively, a transistor with stable electric characteristics can be provided. Alternatively, a transistor with low off-state current can be provided. Alternatively, a transistor having high field-effect mobility can be provided. Alternatively, a transistor fabrication with a small number of steps can be provided. Alternatively, a transistor fabrication with high yield can be provided. Alternatively, a semiconductor device including the transistor can be provided. Alternatively, a novel semiconductor device can be provided.

BRIEF DESCRIPTION OF THE DRAWINGS

In the accompanying drawings:

FIGS. 16A1, 16A2, 16B1, 16B2, 16C1, and 16C2 are diagrams illustrating plasma discharge in a sputtering method using a DC source and an AC source;

DETAILED DESCRIPTION OF THE INVENTION

Figure 1A:
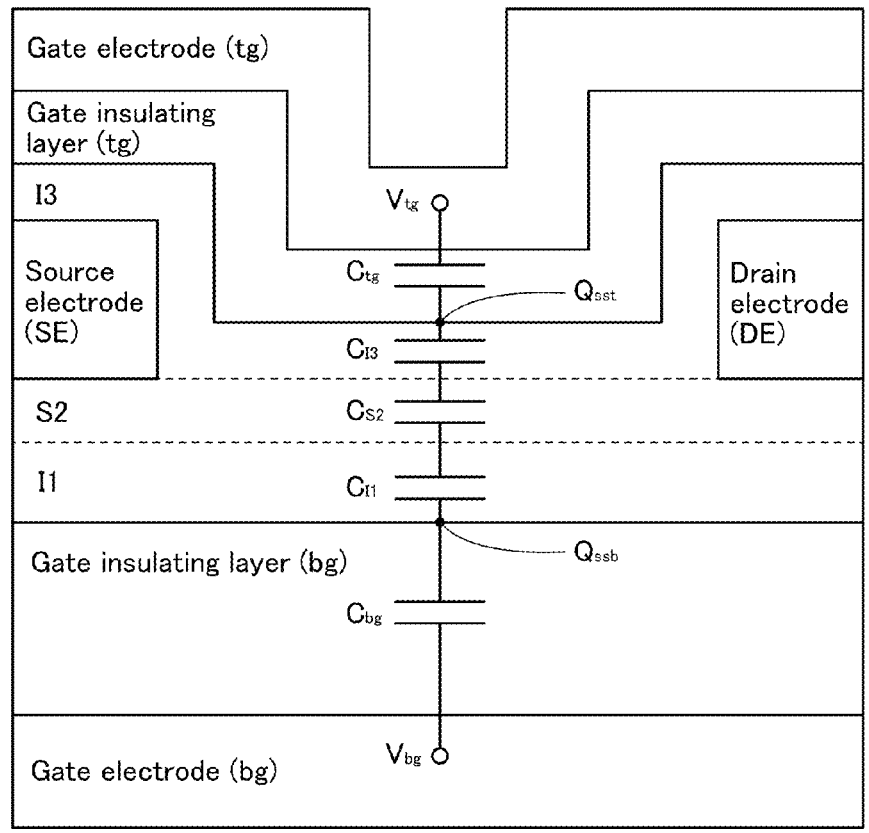
FIG. 1A is a cross-sectional view of a transistor and FIG. 1B is an equivalent circuit diagram.

Embodiments of the present invention will be described in detail below with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that what is described (or part thereof) in one embodiment can be applied to, combined with, or exchanged with another content in the same embodiment.

Note that the size, the thickness of layers, or regions in diagrams is sometimes exaggerated for simplicity. Therefore, embodiments of the present invention are not limited to such scales.

Note that drawings are schematic views of ideal examples, and the embodiments of the present invention are not limited to the shape or the value illustrated in the drawings. For example, the following can be included: variation in shape due to a manufacturing technique; variation in shape due to an error; variation in signal, voltage, or current due to noise; variation in signal, voltage, or current due to a difference in timing; or the like.

A voltage usually refers to a difference in electric potential (more simply referred to as potential) between a given potential and a reference potential (e.g., a source potential or a ground potential (GND)). Thus, a voltage can be referred to as a potential and vice versa.

Further, even when the expression "to be electrically connected" is used in this specification, there is a case in which no physical connection is made and a wiring is just extended in an actual circuit.

Note that the ordinal numbers such as "first" and "second" in this specification are used for convenience and do not denote the order of steps or the stacking order of layers. In addition, the ordinal numbers in this specification do not denote particular names which specify the present invention.

In this specification, for example, when the shape of an object is described with use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor layer refers to, for example, elements other than the main components of a semiconductor layer. For example, an element with a concentration lower than 0.1 atomic % is an impurity. When an impurity is contained, carrier traps may be formed in the semiconductor layer, the carrier mobility may be decreased, or the crystallinity may be decreased, for example. When states are formed in the semiconductor layer, electrons or holes are generated from the states, whereby the carrier density may be increased or trap states may be formed, for example. When the semiconductor layer is an oxide semiconductor layer, examples of an impurity which changes the characteristics of the semiconductor layer include Group 1 elements, Group 2 elements, Group 14 elements, Group 15 elements, and transition metals other than the main components; specifically, there are hydrogen (including water), lithium, sodium, silicon, boron, phosphorus, carbon, and nitrogen, for example. When the semiconductor layer is an oxide semiconductor layer, oxygen vacancies may be formed by entry of impurities. The oxygen vacancies in the oxide semiconductor layer might serve as carrier generation sources or trap states, for example. Further, when the semiconductor layer is a silicon layer, examples of an impurity which changes the characteristics of the semiconductor layer include oxygen, Group 1 elements except hydrogen, Group 2 elements, Group 13 elements, and Group 15 elements.

<Deterioration Model of Transistor>

In order to increase reliability of a transistor in which a channel is formed in an oxide semiconductor layer, for example, it is effective to construct a deterioration model of the transistor. By construction of the deterioration model, it is possible to highlight a cause of deterioration of the transistor, and thus a measure for improving reliability is made easily. Thus, a deterioration model of a transistor in which a channel is formed in an oxide semiconductor layer and has variation in electric characteristics is considered below.

FIG. 1A is an example of a cross-sectional view of a transistor whose channel is formed in an oxide semiconductor layer. The transistor illustrated in FIG. 1A includes a gate electrode (bg); a gate insulating film (bg) over the gate electrode (bg); an oxide layer (I1) over the gate insulating film (bg); an oxide semiconductor layer (S2) over the oxide layer (I1); a source electrode and a drain electrode over the oxide semiconductor layer (S2); an oxide layer (I3) over the oxide semiconductor layer (S2), the source electrode, and the drain electrode; a gate insulating film (tg) over the oxide layer (I3); and a gate electrode (tg) over the gate insulating film (tg). Note that the transistor illustrated in FIG. 1A includes the gate electrode (bg) for easy understanding, but the deterioration model described below can be applied to a transistor without the gate electrode (bg). In addition, when the transistor does not include the gate electrode (bg), the gate insulating film (bg) serves as a base insulating film.

Here, the oxide layer (I1) and the oxide layer (I3) include, for example, at least one metal element, preferably at least two metal elements, further preferably at least three metal elements of metal elements contained in the oxide semiconductor layer (S2). In addition, the gate insulating film (bg) does not include any of the metal elements contained in the oxide layer (I1), for example. In addition, the gate insulating film (tg) does not include any of the metal elements contained in the oxide layer (I3), for example.

The interface between the gate insulating film (bg) and the oxide layer (I1) is a bonding interface between different substances, so that the interface state density is high. Further, the interface between the gate insulating film (tg) and the oxide layer (I3) is a bonding interface between different substances, so that the interface state density is high.

On the other hand, the interface between the oxide layer (I1) and the oxide semiconductor layer (S2) is a bonding interface between the same types of substances, so that the interface state density is low. Further, the interface between the oxide layer (I3) and the oxide semiconductor layer (S2) is a bonding interface between the same types of substances, so that the interface state density is low.

Here, the interface state at the interface between the gate insulating film (bg) and the oxide layer (I1) is assumed to be a charge trap. Further, the interface state at the interface between the gate insulating film (tg) and the oxide layer (I3) is assumed to be a charge trap. In addition, when it is assumed that a charge trapped in the trap state has an extremely long relaxation time, the charge might shift the threshold voltage of the transistor. A charge can be trapped in the trap state, resulting from an operation stress of the transistor.

Here, the charge trapped at the interface between the gate insulating film (bg) and the oxide layer (I1) is referred to as $Q_{ssb}$. The charge trapped at the interface between the gate insulating film (tg) and the oxide layer (I3) is referred to as $Q_{sst}$. It is verified below that $Q_{ssb}$ and $Q_{sst}$ shift the threshold voltage of the transistor.

Note that the potential of the gate electrode (bg) is fixed, for example. Accordingly, the transistor is controlled to be turned on or off, for example, by the gate electrode (tg). FIG. 1A illustrates the state where the gate electrode (bg) and the gate insulating film (bg) are provided, as an non-limiting example. As the gate electrode (bg), a conductive layer, a semiconductor layer, or a semiconductor layer doped with an impurity (for example, a p-type semiconductor or an n-type semiconductor) may be provided. In addition, the gate electrode (bg) does not necessarily acts as a gate electrode. The gate insulating film (bg) does not necessarily act as a gate insulating film.

Figure 1B:
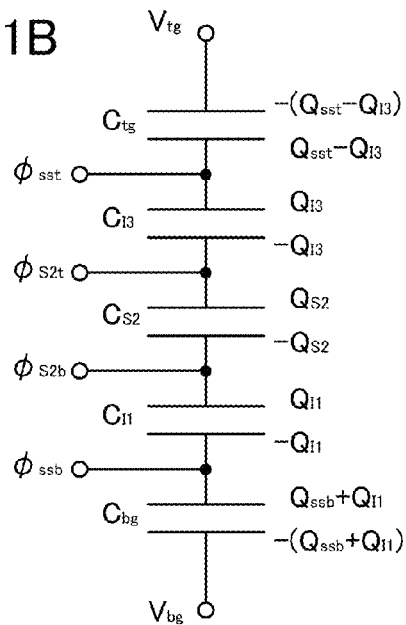

FIG. 1B is an equivalent circuit of a stacked structure up to the gate electrode (tg) from the gate electrode (bg) in the transistor in FIG. 1A. The capacitance of the gate insulating film (bg) is referred to as $C_{bg}$, the capacitance of the oxide layer (I1) is referred to as $C_{I1}$, the capacitance of the oxide semiconductor layer (S2) is referred to as $C_{S2}$, the capacitance of the oxide layer (I3) is referred to as $C_{I3}$, and the capacitance of the gate insulating film (tg) is referred to as $C_{tg}$. As illustrated in FIG. 1B, the stacked structure up to the gate electrode (tg) from the gate electrode (bg) in the transistor in FIG. 1A can be illustrated as an equivalent circuit having a capacitor where components between the gate electrode (bg) and the gate electrode (tg), i.e., the gate insulating film (bg), the oxide layer (I1), the oxide semiconductor layer (S2), the oxide layer (I3), and the gate insulating film (tg) are connected in series.

The potential of the gate electrode (bg) is $V_{bg}$ and the potential of the gate electrode (tg) is $V_{tg}$. The potential of the interface between the gate insulating film (bg) and the oxide layer (I1) is $\phi_{ssb}$, the potential of the interface between the oxide layer (I1) and the oxide semiconductor layer (S2) is $\phi_{S2b}$, the potential of the interface between the oxide semiconductor layer (S2) and the oxide layer (I3) is $\phi_{S2t}$, and the potential of the interface between the oxide layer (I3) and the gate insulating film (tg) is $\phi_{sst}$.

The gate insulating film (bg) has a charge $-(Q_{ssb}+Q_{I1})$ on the gate electrode (bg) side, and a charge $Q_{ssb}+Q_{I1}$ on the oxide layer (I1) side. The oxide layer (I1) has a charge $-Q_{I1}$ on the gate insulating film (bg) side, and a charge $Q_{I1}$ on the oxide semiconductor layer (S2) side. The oxide semiconductor layer (S2) has a charge $-Q_{S2}$ on the oxide layer (I1) side, and a charge $Q_{S2}$ on the oxide layer (I3) side. The oxide layer (I3) has a charge $-Q_{I3}$ on the oxide semiconductor layer (S2) side, and has a charge $Q_{I3}$ on the gate insulating film (tg) side. The gate insulating film (tg) has a charge $Q_{sst}-Q_{I3}$ on the oxide layer (I3) side, and has a charge $-(Q_{sst}-Q_{I3})$ on the gate electrode (tg) side.

The relations between capacitances and charges are expressed below. Note that the oxide layer (I1) and the oxide layer (I3) are assumed to be insulators.

In the gate insulating film (tg), the relation between a capacitance and a charge is expressed by an equation (1). Note that $V_{fbt}$ is a flat band voltage.

[Equation 1]

$$C_{tg}[(V_{tg}-V_{fbt})-\phi_{sst}]=-(Q_{sst}-Q_{I3}) \quad (1)$$

In the oxide layer (I3), the relation between a capacitance and a charge is expressed by an equation (2).

[Equation 2]

$$C_{I3}(\phi_{sst}-\phi_{S2t})=Q_{I3} \quad (2)$$

In the oxide semiconductor layer (S2), the relation between a capacitance and a charge is expressed by an equation (3).

[Equation 3]

$$C_{S2}(\phi_{S2t}-\phi_{S2b})=Q_{S2} \quad (3)$$

In the oxide layer (I1), the relation between a capacitance and a charge is expressed by an equation (4).

[Equation 4]

$$C_{I1}(\phi_{S2b}-\phi_{ssb})=Q_{I1} \quad (4)$$

In the gate insulating film (bg), the relation between a capacitance and a charge is expressed by an equation (5).

[Equation 5]

$$C_{bg}[\phi_{ssb}-(V_{bg}V_{fbb})]=Q_{ssb}+Q_{I1} \quad (5)$$

Next, an equation (6) is obtained by eliminating $\phi_{sst}$ from the equation (1) and the equation (2).

[Equation 6]

$$(V_{tg} - V_{fbt}) = \phi_{S2t} + \frac{Q_{sst}}{C_{tg}} = \left(\frac{1}{C_{tg}} + \frac{1}{C_{I3}}\right)Q_{I3} \quad (6)$$

In addition, an equation (7) is obtained by eliminating $\phi_{ssb}$ from the equation (4) and the equation (5). Note that $V_{fbb}$ is a flat band voltage.

[Equation 7]

$$\phi_{S2b} - (V_{bg} - V_{fbb}) - \frac{Q_{ssb}}{C_{bg}} = \left(\frac{1}{C_{bg}} + \frac{1}{C_{I1}}\right)Q_{I1} \quad (7)$$

The whole oxide semiconductor layer (S2) is assumed to be depleted. In other words, $\phi(x)<0$ is satisfied when $0<x<t_{S2}$ where $t_{S2}$ is a thickness of the oxide semiconductor layer (S2) (x represents a coordinate in the oxide semiconductor layer (S2) along the thickness direction, and x=0 at the interface between the oxide layer (I1) and the oxide semiconductor layer (S2)). At this time, Poisson's equation in the oxide semiconductor layer (S2) is expressed by an equation (8).

[Equation 8]

$$\frac{d^2\phi}{dx^2} = -\frac{e(N_D - n)}{\varepsilon_{S2}} \quad (8)$$

In the equation 8, e is an elementary charge, $N_D$ is a donor density of the oxide semiconductor layer (S2), n is an electron density of the oxide semiconductor layer (S2), and $\varepsilon_{S2}$ is a dielectric constant of the oxide semiconductor layer (S2).

When the whole the oxide semiconductor layer (S2) is depleted, the equation 8 can be approximated to an equation (9) because of $N_D \gg n$.

[Equation 9]

$$\frac{d^2\phi}{dx^2} = -\frac{eN_D}{\varepsilon_{S2}} \quad (9)$$

Next, the equation (9) is modified into an equation (10) and an equation (11) where E(x) is an electric field in a film-thickness direction and k1 and k2 are undetermined coefficients.

[Equation 10]

$$\phi(x) = -\frac{eN_D}{2\varepsilon_{S2}}x^2 + k_1 x + k_2 \quad (10)$$

[Equation 11]

$$E(x) = -\frac{d\phi}{dx} = \frac{eN_D}{\varepsilon_{S2}}x - k_1 \quad (11)$$

Under boundary conditions $\phi(0)=\phi_{S2t}$ and $\phi(t_{S2})=\phi_{S2b}$, $k_1$ and $k_2$ are obtained as expressed in an equation (12) and an equation (13) from the equation (10) and the equation (11).

[Equation 12]

$$k_1 = \frac{\phi_{S2b} - \phi_{S2t}}{t_{S2}} + \frac{eN_D t_{S2}}{2\varepsilon_{S2}} \quad (12)$$

[Equation 13]

$$k_2 = \phi_{S2t} \quad (13)$$

In addition, based on Gauss's law, a surface charge density is expressed by an equation (14) and an equation (15).

[Equation 14]

$$Q_{I3}=\varepsilon_{S2}E(0) \quad (14)$$

[Equation 15]

$$Q_{I1}=\varepsilon_{S2}E(t_{S2}) \quad (15)$$

Accordingly, $Q_{I3}$ and $Q_{I1}$ are obtained as expressed by an equation (16) and an equation (17).

[Equation 16]

$$Q_{I3} = C_{S2}(\phi_{S2t} - \phi_{S2b}) - \frac{eN_D t_{S2}}{2} \quad (16)$$

[Equation 17]

$$Q_{I1} = C_{S2}(\phi_{S2t} - \phi_{S2b}) + \frac{eN_D t_{S2}}{2} \quad (17)$$

An equation (18) and an equation (19) are obtained by substituting the equation (16) and the equation (17) into the equation (6) and the equation (7).

[Equation 18]

$$(V_{tg} - V_{fbt}) + \frac{Q_{sst}}{C_{tg}} = \left[\left(\frac{1}{C_{tg}} + \frac{1}{C_{I3}}\right)C_{S2} + 1\right]\phi_{S2t} - \left(\frac{1}{C_{tg}} + \frac{1}{C_{I3}}\right)\left(C_{S2}\phi_{S2b} + \frac{eN_D t_{S2}}{2}\right) \quad (18)$$

[Equation 19]

$$(V_{bg} - V_{fbb}) + \frac{Q_{ssb}}{C_{bg}} = -\left(\frac{1}{C_{bg}} + \frac{1}{C_{I1}}\right)\left(C_{S2}\phi_{S2t} + \frac{eN_D t_{S2}}{2}\right) + \left[\left(\frac{1}{C_{bg}} + \frac{1}{C_{I1}}\right)C_{S2} + 1\right]\phi_{S2b} \quad (19)$$

Here, when a channel of a transistor is assumed to be formed at the side of the interface between the oxide layer (I1) and the oxide semiconductor layer (S2), the threshold voltage $V_{th}$ is $V_{tg}$ when $\phi_{S2b}$=0. Therefore, the equation (18) and the equation (19) are calculated as simultaneous equations and $\phi_{S2t}$ is eliminated, so that the threshold voltage $V_{th}$ is obtained as expressed in an equation (20).

[Equation 20]

$$V_{th} = V_{fbt} - \frac{Q_{sst}}{C_{tg}} - \left(\frac{1}{C_{tg}} + \frac{1}{C_{I1}} + \frac{1}{C_{S2}}\right)\frac{C_{I1}}{C_{bg} + C_{I1}}[Q_{ssb} + C_{bg}(V_{bg} - V_{fbb})] - \left(\frac{1}{C_{tg}} + \frac{1}{C_{I3}} + \frac{1}{2C_{I3}}\right)eN_D t_{S2} \quad (20)$$

Accordingly, the shift amount $\Delta V_{th}$ in the threshold voltage $V_{th}$ due to the charge $Q_{sst}$ and the charge $Q_{ssb}$ is expressed in an equation (21).

[Equation 21]

$$\Delta V_{th} = -\frac{Q_{sst}}{C_{tg}} - \left(\frac{1}{C_{tg}} + \frac{1}{C_{I3}} + \frac{1}{C_{S2}}\right)\frac{C_{I1}}{C_{bg} + C_{I1}}Q_{ssb} \quad (21)$$

According to the above equation, $Q_{ssb}$ contributes less to $\Delta V_{th}$ by increasing $C_{I3}$ (for example, the thickness of the oxide layer (I3) is reduced). $Q_{ssb}$ contributes less to $\Delta V_{th}$ by increasing $C_{S2}$ (for example, the thickness of the oxide semiconductor layer (S2) is reduced). $Q_{ssb}$ contributes less to $\Delta V_{th}$ by decreasing CI1 (for example, the thickness of the oxide layer (I1) is increased).

In addition, by increasing $C_{tg}$ (the thickness of the gate insulating film (tg) is reduced), $Q_{ssb}$ contributes less to $\Delta V_{th}$. By increasing $C_{bg}$ (the thickness of the gate insulating film (bg) is reduced), $Q_{ssb}$ contributes less to $\Delta V_{th}$.

On the other hand, $C_{I3}$, $C_{S2}$, and $C_{I1}$ do not influence the contribution of $Q_{sst}$ to $V_{th}$. In addition, by increasing $C_{tg}$ (reducing the thickness of the gate insulating film (tg)), $Q_{sst}$ contributes less to $\Delta V_{th}$.

Figure 2A:
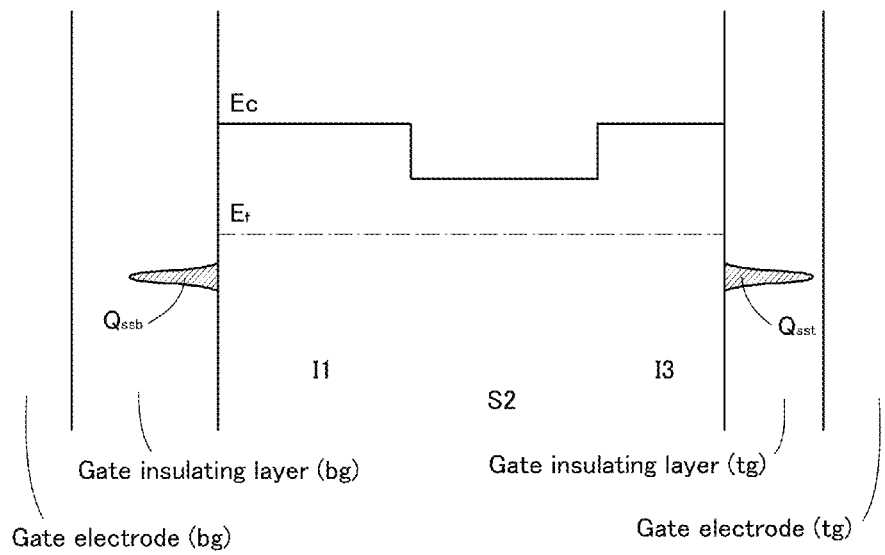
FIGS. 2A and 2B are band structure diagrams.

Further, the channel of the transistor is formed in the oxide semiconductor layer (S2). In other words, the oxide layer (I1) and the oxide layer (I3) have higher energy (Ec) at the bottom of the conduction band than that of the oxide semiconductor layer (S2). The band structure at this time of the transistor is illustrated in FIGS. 2A and 2B.

In the above-described model of deterioration, the potential at the interface state between the gate insulating film (bg) and the oxide layer (I1) and the potential at the interface state between the gate insulating film (tg) and the oxide layer (I3) are lower than the Fermi level. In this case, when the potentials of the gate electrode (bg) and the gate electrode (tg) are 0V, electrons are trapped in the interface state between the oxide layer (I1) and the gate insulating layer (bg) and in the interface state between the oxide layer (I3) and the gate insulating layer (tg), and a charge $Q_{ssb}$ and a charge $Q_{sst}$ are accumulated (see FIG. 2A).

On the other hand, when the transistor includes the oxide layer (I1) and the oxide layer (I3), the potentials at the interfaces are higher than Fermi level (are closer to energy at the bottom of the conduction band) as compared to the transistor not including the oxide layer (I1) and the oxide layer (I3) in some cases. When the potentials at the interface states are higher than the Fermi level, electrons are not trapped in the interface states and thus the charge $Q_{ssb}$ and the charge $Q_{sst}$ are not accumulated (see FIG. 2B). In addition, by application of voltage to the gate electrode (tg) or the like, charges are trapped in the interface states in some cases. The trapped charge is eliminated in a short relaxation time, since the potentials at the interface states are close to energy at the bottom of the conduction band. Accordingly, each interface state hardly causes the shift in the threshold voltage of the transistor.

Figure 2B:
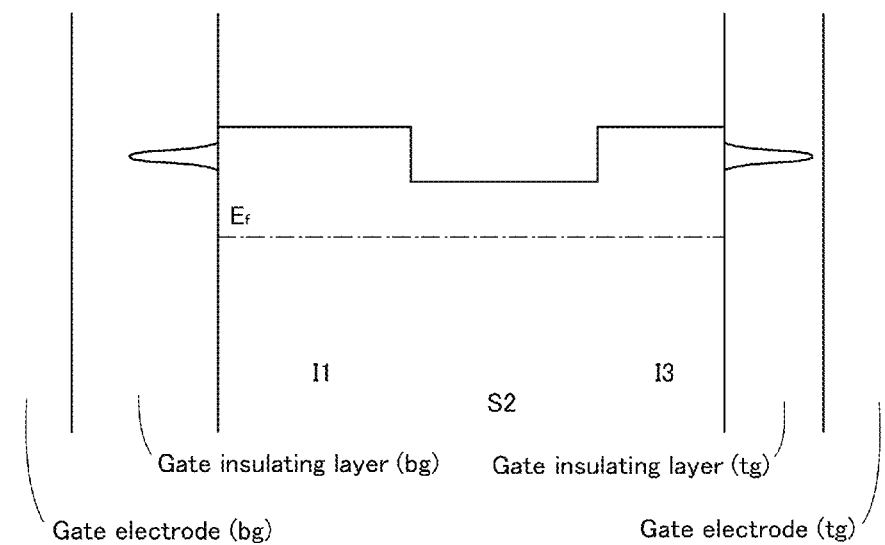

As illustrated in FIG. 2B, because of the magnitude relation between the potential at each interface state and the Fermi level, the charge $Q_{sst}$ is not accumulated by formation of the oxide layer (I3) in some cases. When the charge $Q_{sst}$ is not accumulated, the reliability of the transistor is high because the cause of deterioration does not exist.

<Transistor>

A transistor whose channel is formed in an oxide semiconductor layer is described below.

<Transistor Structure 1>

An example of a top-gate and top-contact transistor is described first.

Figure 3A:
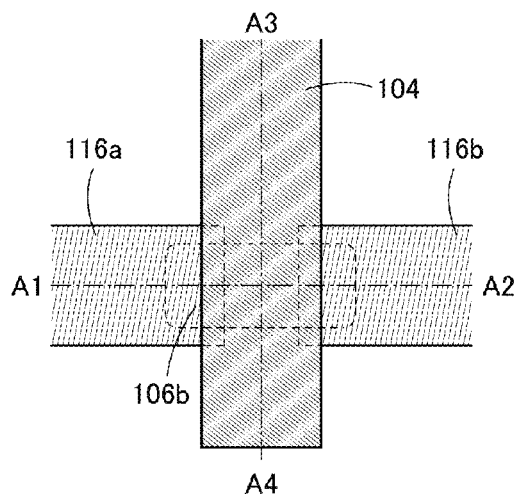
FIGS. 3A to 3C are a top view and cross-sectional views illustrating an example of a transistor in accordance with one embodiment of the present invention.
Figure 3C:
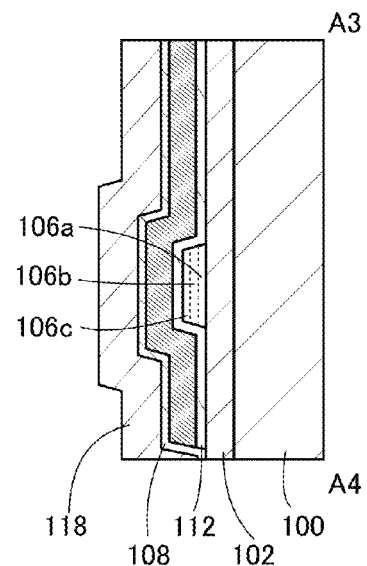
Figure 3B:
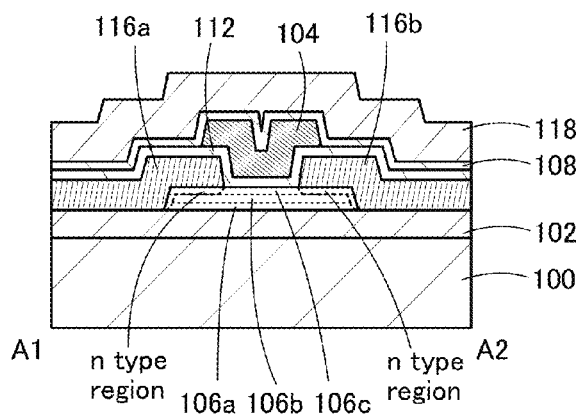

FIGS. 3A to 3C are a top view and cross-sectional views of the transistor. FIG. 3A is the top view of the transistor. FIG. 3B is the cross-sectional view taken along dashed-dotted line A1-A2 in FIG. 3A. FIG. 3C is the cross-sectional view taken along dashed-dotted line A3-A4 in FIG. 3A.

The transistor illustrated in FIG. 3B includes a base insulating film 102 over a substrate 100; an oxide layer 106a over the base insulating film 102; an oxide semiconductor layer 106b over the oxide layer 106a; an oxide layer 106c over the oxide semiconductor layer 106b; a source electrode 116a and a drain electrode 116b in contact with the oxide layer 106c; a gate insulating film 112 over the oxide layer 106c, the source electrode 116a, and the drain electrode 116b; and a gate electrode 104 over the gate insulating film 112. Preferably, a protective insulating film 108 is formed over the gate insulating film 112 and the gate electrode 104, and a protective insulating film 118 is formed over the protective insulating film 108. The transistor does not necessarily include the base insulating film 102.

The base insulating film 102 in the transistor illustrated in FIGS. 3A to 3C corresponds to, for example, the gate insulating film (bg) in the transistor illustrated in FIG. 1A. In addition, the transistor illustrated in FIGS. 3A to 3C may include, for example, the gate electrode (bg) in the transistor illustrated in FIG. 1A. The transistor illustrated in FIGS. 3A to 3C may include, for example, a back gate electrode that is opposite to the gate electrode 104 and is in contact with the bottom surface of the base insulating film 102. In addition, in the transistor illustrated in FIGS. 3A to 3C, if the substrate 100 has a conductivity, the substrate 100 can correspond to the gate insulating film (bg) in the transistor illustrated in FIG. 1A, for example. In the transistor illustrated in FIGS. 3A to 3C, if a conductive film serving as a wiring or the like is provided below the base insulating film 102, the conductive film can correspond to the gate insulating film (bg) in the transistor illustrated in FIG. 1A.

Some of materials used for the conductive film serving as the source electrode 116a and the drain electrode 116b deprives parts of the oxide semiconductor layer 106b and the oxide layer 106c of oxygen or form a mixed layer, so that an n-type region (low-resistant region) might be formed in the oxide semiconductor layer 106b and the oxide layer 106c.

In FIG. 3A, the distance between the source electrode 116a and the drain electrode 116b in a region overlapping with the gate electrode 104 is called a channel length. Note that when the transistor includes an n-type region, the distance between the source region and the drain region in a region overlapping the gate electrode 104 may be called a channel length.

Note that a channel formation region refers to a region, which overlaps with the gate electrode 104 and is interposed between the source electrode 116a and the drain electrode 116b, in the oxide layer 106a, the oxide semiconductor layer 106b, and the oxide layer 106c (see FIG. 3B). Further, a channel refers to a main current path in the channel formation region.

Note that as illustrated in the top view of FIG. 3A, part of the oxide semiconductor layer 106b is provided outside the gate electrode 104. However, the oxide semiconductor layer 106b may be provided inside the gate electrode 104. This can suppress generation of carriers in the oxide semiconductor layer 106b due to incident light from the gate electrode 104 side. In other words, the gate electrode 104 functions as a light-blocking film.

The positions of the protective insulating film 118 and the protective insulating film 108 may be reversed. For example, the protective insulating film 108 may be provided over the protective insulating film 118.

The oxide layer 106a, the oxide semiconductor layer 106b, and the oxide layer 106c are described below.

The oxide semiconductor layer 106b is an oxide containing indium. An oxide can have a high carrier mobility (electron mobility) by containing indium, for example. In addition, the oxide semiconductor layer 106b preferably includes an element M. The element M is aluminum, gallium, yttrium, or tin, for example. The element M is an element having a high bonding energy with oxygen, for example. The element M is an element that can increase the energy gap of the oxide, for example. In addition, the oxide semiconductor layer 106b preferably contains zinc. When the oxide contains zinc, the oxide can be easily crystallized, for example. The energy at the top of the valence band of the oxide can be controlled with the atomic ratio of zinc, for example.

Note that the oxide semiconductor layer 106b is not limited to the oxide containing indium. The oxide semiconductor layer 106b may be, for example, a Zn—Sn oxide or a Ga—Sn oxide.

The oxide layer 106a is an oxide layer which includes one or more kinds of elements included in the oxide semiconductor layer 106b other than oxygen. Further, since the oxide layer 106a includes one or more kinds of elements included in the oxide semiconductor layer 106b other than oxygen, an interface state is unlikely to be formed at the interface between the oxide semiconductor layer 106b and the oxide layer 106a.

The oxide layer 106c is an oxide layer which includes one or more kinds of elements included in the oxide semiconductor layer 106b other than oxygen. Further, since the oxide layer 106c includes one or more kinds of elements included in the oxide semiconductor layer 106b other than oxygen, an interface state is unlikely to be formed at the interface between the oxide semiconductor layer 106b and the oxide layer 106c.

When an In-M-Zn oxide is used for the oxide layer 106a, the proportions of In and M when summation of In and M is assumed to be 100 atomic % is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %. In the case of using an In-M-Zn oxide as the oxide semiconductor layer 106b, when summation of In and M is assumed to be 100 atomic %, the proportions of In and M are preferably greater than or equal to 25 atomic % and less than 75 atomic %, respectively, and more preferably greater than or equal to 34 atomic % and less than 66 atomic %, respectively. When an In-M-Zn oxide is used for the oxide layer 106c, the proportions of In and M when summation of In and M is assumed to be 100 atomic % is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %. Note that the oxide layer 106c may be an oxide that is the same type as that of the oxide layer 106a.

Figure 11:
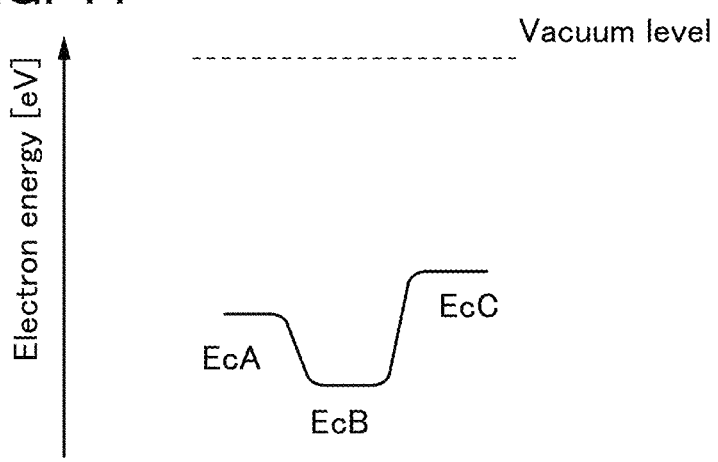
FIG. 11 is a band structure diagram of an oxide stack in accordance with one embodiment of the present invention.

Here, in some cases, there is a mixed region of the oxide layer 106a and the oxide semiconductor layer 106b between the oxide layer 106a and the oxide semiconductor layer 106b. Here, in some cases, there is a mixed region of the oxide semiconductor layer 106b and the oxide layer 106c between the oxide semiconductor layer 106b and the oxide layer 106c. The mixed region has a low density of interface states. For that reason, the stack where the oxide layer 106a, the oxide semiconductor layer 106b, and the oxide layer 106c are stacked has a band structure where energy at each interface is changed continuously (continuous junction) (see FIG. 11). Note that the energy at the bottom of the conduction band of the oxide layer 106a is EcA, the energy at the bottom of the conduction band of the oxide semiconductor layer 106b is EcB, and the energy at the bottom of the conduction band of the oxide layer 106c is EcC.

An oxide with a wide energy gap is used for the oxide semiconductor layer 106b. For example, the energy gap of the oxide semiconductor layer 106b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. Further, for example, the energy gap of the oxide layer 106c is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

An oxide with a wide energy gap is used for the oxide layer 106a. Further, for example, the energy gap of the oxide layer 106a is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

An oxide with a wide energy gap is used for the oxide layer 106c. Further, for example, the energy gap of the oxide layer 106c is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV. Note that the oxide 106a and the oxide layer 106c are oxides having energy gaps wider than that of the oxide semiconductor layer 106b.

An oxide having a higher electron affinity than the oxide layer 106a is used as the oxide semiconductor layer 106b. For example, as the oxide semiconductor layer 106b, an oxide having higher electron affinity than the oxide layer 106a by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy gap between the vacuum level and the bottom of the conduction band.

The oxide semiconductor layer 106b is an oxide having a higher electron affinity than that of the oxide semiconductor layer 106c. For example, as the oxide semiconductor layer 106b, an oxide having a higher electron affinity than the oxide layer 106c by 0.07 eV or higher and 1.3 eV, or lower, preferably 0.1 eV or higher 0.7 eV or lower, more preferably 0.15 eV or higher and 0.4 eV or lower is used.

At this time, when an electric field is applied to the gate electrode 104, a channel is formed in the oxide semiconductor layer 106b that has the highest electron affinity of the oxide layer 106a, the oxide semiconductor layer 106b, and the oxide layer 106c.

As described above in the model of deterioration of the transistor, preferably, the thickness of the oxide layer 106a is large, the thickness of the oxide semiconductor layer 106b is small, and the thickness of the oxide layer 106c is small. Specifically, the thickness of the oxide layer 106a is 20 nm or larger, preferably 30 nm or larger, further preferably 40 nm or larger, still further 60 nm or larger. With the oxide layer 106a having the thickness of 20 nm or larger, preferably 30 nm or larger, further preferably 40 nm or larger, still further preferably 60 nm or larger, the distance from the interface between the base insulating film 102 and the oxide layer 106a to the oxide semiconductor layer 106b where a channel is formed can be 20 nm or larger, preferably 30 nm or larger, further preferably 40 nm or larger, still further preferably 60 nm or larger. Note that since the productivity of a semiconductor device might be reduced, the thickness of the oxide layer 106a is 200 nm or smaller, preferably 120 nm or smaller, further preferably 80 nm or smaller. The thickness of the oxide semiconductor layer 106b is greater than or equal to 3 nm and less than or equal to 100 nm, preferably greater than or equal to 3 nm and less than or equal to 80 nm, more preferably greater than or equal to 3 nm and less than or equal to 50 nm. Further, the oxide layer 106c has a thickness of greater than or equal to 3 nm and less than or equal to 50 nm, preferably greater than or equal to 3 nm and less than or equal to 20 nm. For example, the oxide layer 106a is thicker than the oxide semiconductor layer 106b, and the oxide semiconductor layer 106b is thicker than the oxide layer 106c.

The oxide stack including three layers, the oxide layer 106a, the oxide semiconductor layer 106b, and the oxide layer 106c has been described above, but one embodiment of the present invention is not limited to the oxide stack including three layers. For example, an oxide stack including two layers, the oxide layer 106a and the oxide semiconductor layer 106b or an oxide stack including two layers, the oxide semiconductor layer 106b and the oxide layer 106c may be employed. Alternatively, an oxide stack having four or more layers including an oxide layer between the oxide layer 106a and the oxide semiconductor layer 106b may be provided. In this case, the oxide layer provided between the oxide layer 106a and the oxide semiconductor layer 106b is, for example, an oxide having an electron affinity that is equal to or higher than the electron affinity of the oxide layer 106a and is equal to or lower than the electron affinity of the oxide semiconductor layer 106b. Alternatively, an oxide stack having four or more layers including an oxide layer between the oxide layer 106c and the oxide semiconductor layer 106b may be provided for example. In this case, the oxide layer provided between the oxide layer 106c and the oxide semiconductor layer 106b is, for example, an oxide having an electron affinity that is equal to or higher than the electron affinity of the oxide layer 106c and is equal to or lower than the electron affinity of the oxide semiconductor layer 106b.

When the oxide layer 106a, the oxide semiconductor layer 106b, and the oxide layer 106c are formed by a sputtering method, targets containing indium are preferably used in order to prevent an increase in the number of particles. In addition, if an oxide target having a high atomic ratio of the element M is used, the conductivity of the target may be decreased. Examples of the element M include aluminum, gallium, yttrium, and tin. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

When the oxide layer 106a is formed by a sputtering method, the atomic ratio of In to M and Zn contained in the target is preferably 1:1:0.5, 1:1:1, 1:1:2, 1:3:1, 1:3:2, 1:3:4, 1:3:6, 1:6:2, 1:6:4, 1:6:6, 1:6:8, 1:6:10, 1:9:2, 1:9:4, 1:9:6, 1:9:8, or 1:9:10 for example.

When the oxide semiconductor layer 106b is formed by a sputtering method, the atomic ratio of In to M and Zn contained in the target is preferably 3:1:1, 3:1:2, 3:1:4, 1:1:0.5, 1:1:1, or 1:1:2, for example.

When the oxide layer 106c is formed by a sputtering method, the atomic ratio of In to M and Zn contained in the target is preferably 1:1:0.5, 1:1:1, 1:1:2, 1:3:1, 1:3:2, 1:3:4, 1:3:6, 1:6:2, 1:6:4, 1:6:6, 1:6:8, 1:6:10, 1:9:2, 1:9:4, 1:9:6, 1:9:8, or 1:9:10, for example.

In the cases where the oxide layer 106a, the oxide semiconductor layer 106b and the oxide layer 106c are formed by a sputtering method, films having atomic ratios different from the atomic ratios of the targets used may be formed. Especially for zinc, the atomic ratio of zinc in a deposited film is smaller than the atomic ratio of the target in some cases. Specifically, the film may have an atomic ratio of zinc of 40 atomic % to 90 atomic % of the atomic ratio of zinc in the target.

An influence of silicon on an oxide is described below. In order to give stable electrical characteristics to a transistor, it is effective to reduce the concentration of impurities in the oxide semiconductor layer 106b so that the oxide semiconductor layer 106b is highly purified to be intrinsic. The carrier density of the oxide semiconductor layer 106b is set to lower than $1\times10^{17}/cm^3$, lower than $1\times10^{15}/cm^3$, or lower than $1\times10^{13}/cm^3$. In the oxide, a light element, a semimetal element, a metal element, and the like other than main components (that is, elements having concentrations lower than 1 atomic %) serve as impurities. For example, hydrogen, lithium, carbon, nitrogen, fluorine, sodium, silicon, chlorine, potassium, calcium, titanium, iron, nickel, copper, germanium, strontium, zirconium, and hafnium might be impurities in the oxide. Accordingly, the concentration of impurities in an adjacent layer is preferably reduced.

For example, as described above, an impurity state might be formed in the case where silicon is contained in the oxide. In particular, when silicon exists on the surface layer of the oxide semiconductor layer 106b, a trap state is formed. For this reason, the concentration of silicon in a region between the oxide semiconductor layer 106b and the oxide layer 106a is set to lower than $1\times10^{19}$ atoms/cm$^3$, preferably lower than $5\times10^{18}$ atoms/cm$^3$, more preferably lower than $2\times10^{18}$ atoms/cm$^3$. Further, the concentration of silicon in a region between the oxide semiconductor layer 106b and the oxide layer 106c is set to lower than $1\times10^{19}$ atoms/cm$^3$, preferably lower than $5\times10^{18}$ atoms/cm$^3$, more preferably lower than $2\times10^{18}$ atoms/cm$^3$.

In addition, hydrogen and nitrogen may form a donor state in the oxide, so that the carrier density is increased. The concentration of hydrogen in the oxide semiconductor layer 106b, which is measured by secondary ion mass spectrometry (SIMS), is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen in the oxide semiconductor layer 106b which is measured by SIMS, can be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is preferable to reduce the concentrations of hydrogen in the oxide layer 106a in order to reduce the concentrations of hydrogen and nitrogen in the oxide semiconductor layer 106b. Specifically, the concentrations of hydrogen and nitrogen in the oxide layer 106a, which are measured by SIMS, can be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen in the oxide layer 106a, which is measured by SIMS, can be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is preferable to reduce the concentrations of hydrogen and nitrogen in the oxide layer 106c in order to reduce the concentration of hydrogen in the oxide semiconductor layer 106b. The concentrations of hydrogen and nitrogen in the oxide layer 106c, which are measured by SIMS, is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen in the oxide layer 106c, which is measured by SIMS, is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

An oxide semiconductor which can be used for the oxide semiconductor layer 106b and the like is described below. An oxide semiconductor may include a non-single-crystal, for example. The non-single-crystal is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM) (hereinafter referred to as a TME image), for example, crystal parts can be found in the CAAC-OS in some cases. In most cases, in the TEM image, crystal parts in the CAAC-OS each fit inside a cube whose one side is less than 100 nm, for example. In the TEM image, a boundary between the amorphous part and the crystal part and a boundary between the crystal parts in the CAAC-OS is not clearly observed in some cases. Further, in the TEM image, a grain boundary in the CAAC-OS is not clearly observed in some cases. In the CAAC-OS, since a clear grain boundary does not exist, for example, segregation of an impurity is unlikely to occur. In the CAAC-OS, since a clear grain boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. Further, for example, spots (luminescent spots) are observed in an electron diffraction pattern of the CAAC-OS in some cases. An electron diffraction pattern obtained with an electron beam having a beam diameter of 10 nmφ or smaller, or 5 nmφ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

Figure 12A:
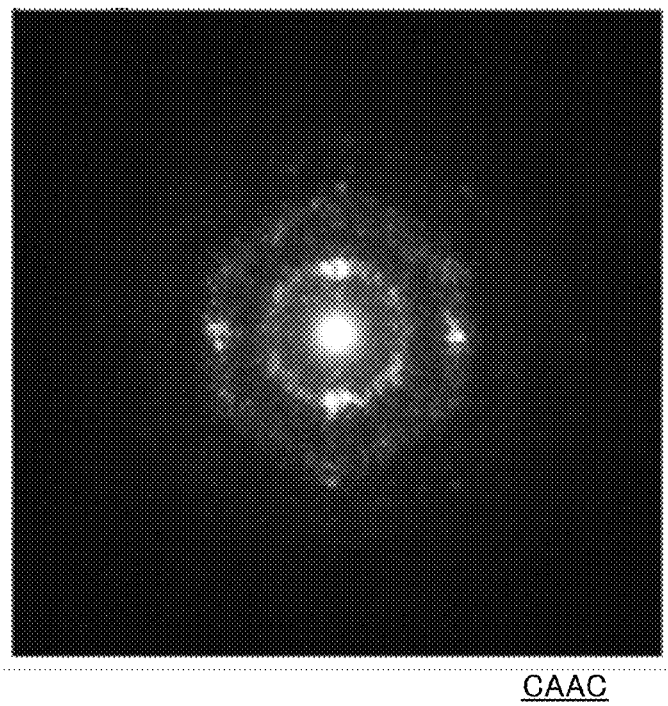
FIGS. 12A and 12B are nanobeam electron diffraction patterns of an oxide semiconductor.

FIG. 12A shows an example of a nanobeam electron diffraction pattern of a sample including CAAC-OS. Here, the sample is cut in the direction perpendicular to a surface where the CAAC-OS is formed and the thickness thereof is reduced to about 40 nm. Further, an electron beam with a diameter of 1 nm enters from the direction perpendicular to the cut surface of the sample. FIG. 12A shows that spots are observed in the nanobeam electron diffraction pattern of the CAAC-OS.

In each of the crystal parts included in the CAAC-OS, for example, a c-axis is aligned in the direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

The CAAC-OS could be obtained by reducing the impurity concentration, for example. The impurity means here an element other than the main components of the oxide semiconductor, such as hydrogen, carbon, silicon, or a transition metal element. In particular, an element such as silicon has a higher strength to bond with oxygen than that of a metal element included in the oxide semiconductor. Therefore, when the element takes oxygen away in the oxide semiconductor, the atomic arrangement in the oxide semiconductor is disrupted, whereby the crystallinity of the oxide semiconductor is lowered in some cases. In addition, a heavy metal such as iron or nickel, argon, carbon dioxide, or the like has a large atomic radius (or molecular radius), and thus disrupts the atomic arrangement in the oxide semiconductor, whereby the crystallinity of the oxide semiconductor is lowered in some cases. Hence, the CAAC-OS is an oxide semiconductor with a low impurity concentration. Note that the impurity included in the oxide semiconductor might serve as a carrier generation source.

In the CAAC-OS film, distribution of crystal parts is not necessarily uniform. For example, in the formation process of the CAAC-OS film, in the case where crystal growth occurs from a surface side of the oxide semiconductor, the proportion of crystal parts in the vicinity of the surface of the oxide semiconductor is higher than that in the vicinity of the surface where the oxide semiconductor is formed in some cases. Further, when an impurity is mixed into the CAAC-OS, the crystal part in a region into which the impurity is mixed becomes amorphous or microcrystalline in some cases.

Further, the CAAC-OS can be formed, for example, by reducing the density of defect states. In an oxide semiconductor, oxygen vacancies for example form defect states. The oxygen vacancies form trap states or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly-purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has a low density of trap states in some cases. Thus, the transistor including the oxide semiconductor in the channel formation region has a small variation in electrical characteristics and high reliability in some cases. Charges trapped by the trap states in the oxide semiconductor take a long time to be released and may behave like fixed charges. Thus, the transistor which includes the oxide semiconductor having a high density of trap states in the channel formation region has unstable electrical characteristics in some cases.

A transistor including the highly purified intrinsic or substantially highly purified intrinsic CAAC-OS has a small variation in the electrical characteristics due to irradiation with visible light or ultraviolet light.

The CAAC-OS can be formed by a sputtering method using a DC power source, for example.

The oxide semiconductor may include polycrystal, for example. Note that an oxide semiconductor including polycrystal is referred to as a polycrystalline oxide semiconductor. A polycrystalline oxide semiconductor includes a plurality of crystal grains. A polycrystalline oxide semiconductor includes, for example, amorphous parts in some cases.

In a TEM image of the polycrystalline oxide semiconductor, for example, crystal grains can be found. In most cases, the size of a crystal grain in the polycrystalline oxide semiconductor is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in the TEM image, a boundary between an amorphous part and a crystal grain and a boundary between crystal grains can be found in the polycrystalline oxide semiconductor in some cases. Also in the TEM image, a grain boundary can be found in the polycrystalline oxide semiconductor in some cases.

The polycrystalline oxide semiconductor may include a plurality of crystal grains, and the alignment of crystals may be different in the plurality of crystal grains. When a polycrystalline oxide semiconductor is analyzed by an out-of-plane method with use of an XRD apparatus, a peak at $2\theta$ of around 31 degrees which shows alignment or plural kinds of peaks showing alignment appears in some cases. Further, spots are observed in an electron diffraction pattern of the polycrystalline oxide semiconductor in some cases.

The polycrystalline oxide semiconductor has high crystallinity and thus has high electron mobility in some cases. Accordingly, a transistor using the polycrystalline oxide semiconductor for a channel formation region has high field-effect mobility. Note that there are cases in which an impurity is segregated at the grain boundary between the crystals in the polycrystalline oxide semiconductor. Moreover, the grain boundary of the polycrystalline oxide semiconductor becomes a defect state. Since the grain boundary of the polycrystalline oxide semiconductor may serve as a carrier trap or a carrier generation source, a transistor using the polycrystalline oxide semiconductor for a channel formation region has larger variation in electrical characteristics and lower reliability than a transistor using a CAAC-OS for a channel formation region in some cases.

The polycrystalline oxide semiconductor can be formed by high-temperature heat treatment or laser light treatment.

The oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc). An oxide semiconductor including nanocrystal is referred to as an nc-OS (nanocrystalline oxide semiconductor). In a TEM image of the nc-OS, for example, a boundary between an amorphous part and a crystal part and a boundary between crystal parts cannot be found clearly in some cases. In a TEM image of the nc-OS, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than that of a crystal part, a peak which shows alignment does not appear in some cases. Further, for example, a halo pattern is shown in some cases in an electron diffraction pattern of the nc-OS obtained by using an electron beam having a diameter larger than that of a crystal part (for example, a beam diameter of 20 nmφ or more, or 50 nmφ or more). For example, spots are shown in some cases in a nanobeam electron diffraction pattern of the nc-OS obtained by using an electron beam having a diameter smaller than or equal to that of a crystal part (for example, a beam diameter of 10 nmφ or less, or 5 nmφ or less). In a nanobeam electron diffraction pattern of the nc-OS, for example, regions with high luminance in a circular pattern are shown in some cases. In a nanobeam electron diffraction pattern of the nc-OS, for example, a plurality of spots are shown in the region in some cases.

Figure 12B:
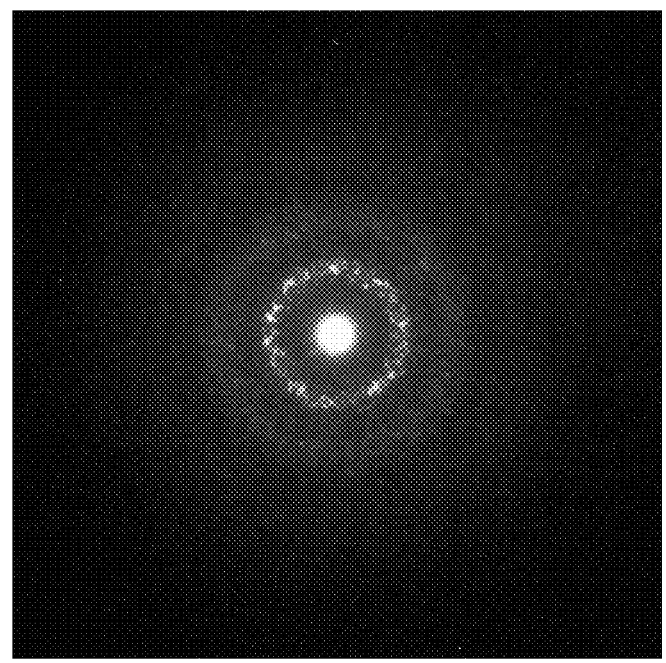

FIG. 12B shows an example of a nanobeam electron diffraction pattern of a sample including nc-OS. Here, the sample is cut in the direction perpendicular to a surface where the nc-OS is formed and the thickness thereof is reduced to about 40 nm. Further, an electron beam with a diameter of 1 nmφ enters from the direction perpendicular to the cut surface of the sample. FIG. 12B shows that in the nanobeam electron diffraction pattern of the nc-OS, regions with high luminance in a circular pattern are shown and a plurality of spots are shown in the region.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Accordingly, the nc-OS has higher carrier density than the CAAC-OS in some cases. An oxide semiconductor with a high carrier density tends to have a high electron mobility. Therefore, a transistor using the nc-OS for a channel formation region has a high field-effect mobility in some cases. On the contrary, the nc-OS has higher density of defect states than the CAAC-OS and thus has higher density of trap states in some cases. Therefore, a transistor using the nc-OS for a channel formation region has larger variation in electrical characteristics and lower reliability than a transistor using the CAAC-OS for a channel formation region. Note that the nc-OS can be obtained even when the amount of impurity contained therein is relatively large; thus, the nc-OS is sometimes preferably used depending on the application. For example, the nc-OS may be formed by a deposition method such as a sputtering method using an AC power supply. The sputtering method using an AC power supply allows a film to be formed with high uniformity over a large substrate, so that a semiconductor device including a transistor using the nc-OS for a channel formation region can be manufactured with high productivity.

An oxide semiconductor may include an amorphous part. Note that an oxide semiconductor including an amorphous part is referred to as an amorphous oxide semiconductor. An amorphous oxide semiconductor, for example, has disordered atomic arrangement and no crystal part. An amorphous oxide semiconductor, for example, does not have a specific shape as in quartz and regularity in atomic arrangement.

In a TEM image of the amorphous oxide semiconductor, for example, crystal parts cannot be found in some cases.

When an amorphous oxide semiconductor is analyzed by an out-of-plane method with an XRD apparatus, a peak which shows alignment does not appear in some cases. Further, a halo pattern is observed in an electron diffraction pattern of the amorphous oxide semiconductor in some cases. In other cases, a halo pattern is observed instead of a spot in a nanobeam electron diffraction pattern of the amorphous oxide semiconductor.

The amorphous oxide semiconductor can be formed in some cases, for example, by introducing a high-concentration impurity such as hydrogen. Hence, the amorphous oxide semiconductor is, for example, an oxide semiconductor containing a high-concentration impurity.

When an oxide semiconductor contains a high-concentration impurity, a defect state such as an oxygen vacancy is formed in the oxide semiconductor in some cases. This means that an amorphous oxide semiconductor with a high-concentration impurity has a high density of defect states. In addition, since the amorphous oxide semiconductor has low crystallinity, the density of defect states of the amorphous oxide semiconductor is higher than that of the CAAC-OS or the nc-OS.

Thus, the amorphous oxide semiconductor has a much higher carrier density than the nc-OS in some cases. Therefore, a transistor using the amorphous oxide semiconductor for a channel formation region tends to be normally on, and sometimes can be preferably used for a transistor which needs to have such electrical characteristics. The amorphous oxide semiconductor has a high density of defect states and thus has a high density of trap states in some cases. Therefore, a transistor using the amorphous oxide semiconductor for a channel formation region has larger variation in electrical characteristics and lower reliability than a transistor using the CAAC-OS or the nc-OS for a channel formation region in some cases. Note that the amorphous oxide semiconductor can be formed by a deposition method in which a relatively large amount of impurity is contained, and thus can be easily obtained and preferably used depending on the application. For example, the amorphous oxide semiconductor may be formed by a deposition method such as a spin coating method, a sol-gel method, an immersion method, a spray method, a screen printing method, a contact printing method, an ink-jet printing method, a roll coating method, or a mist CVD method. Hence, a semiconductor device including a transistor using the amorphous oxide semiconductor for a channel formation region can be manufactured with high productivity.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a layered structure of two or more of an amorphous oxide semiconductor region, a microcrystalline oxide semiconductor region, a polycrystalline oxide semiconductor region, and a CAAC-OS region in some cases.

An oxide semiconductor may include a single crystal, for example. Note that an oxide semiconductor including a single crystal is referred to as a single crystal oxide semiconductor.

The single crystal oxide semiconductor has, for example, a low impurity concentration and a low density of defect states (a small number of oxygen vacancies), and thus has a low carrier density. Therefore, a transistor using the single crystal oxide semiconductor for a channel formation region is unlikely to be normally on. Further, the single crystal oxide semiconductor has a low density of defect states and thus has a low density of trap states in some cases. Therefore, a transistor using the single crystal oxide semiconductor for a channel formation region has a small variation in electrical characteristics and a high reliability in some cases.

The oxide semiconductor has a high density if including few defects, for example. The oxide semiconductor has a high density if having a high crystallinity, for example. The oxide semiconductor has a high density if including a low-concentration impurity such as hydrogen. For example, the density of a single crystal oxide semiconductor is higher than that of a CAAC-OS in some cases. For example, the density of a CAAC-OS is higher than that of a microcrystalline oxide semiconductor in some cases. For example, the density of a polycrystalline oxide semiconductor is higher than that of a microcrystalline oxide semiconductor in some cases. For example, the density of a microcrystalline oxide semiconductor is higher than that of an amorphous oxide semiconductor in some cases.

Localized states in the oxide semiconductor layer 106b are described below. By reducing the density of localized states due to defect states of the oxide semiconductor layer 106b, a transistor including the oxide semiconductor layer 106b can have stable electric characteristics. The density of localized states in the oxide semiconductor layer 106b can be measured by a constant photocurrent method (CPM).

In order that the transistor can have stable electrical characteristics, the absorption coefficient due to the localized states in the oxide semiconductor layer 106b measured by CPM is preferably lower than $1\times10^{-3}$ cm$^{-1}$, further preferably lower than $3\times10^{-4}$ cm$^{-1}$. Further, when the absorption coefficient due to the localized states in the oxide semiconductor layer 106b measured by CPM is lower than $1\times10^{-3}$ cm$^{-1}$, preferably lower than $3\times10^{-4}$ cm$^{-1}$, the field-effect mobility of the transistor can be increased. In order that the absorption coefficient due to the localized states in the oxide semiconductor layer 106b measured by CPM can be lower than $1\times10^{-3}$ cm$^{-1}$, preferably lower than $3\times10^{-4}$ cm$^{-1}$, the concentrations of elements forming a localized state such as hydrogen, lithium, carbon, nitrogen, fluorine, sodium, silicon, chlorine, potassium, calcium, titanium, iron, nickel, copper, germanium, strontium, zirconium, and hafnium in the oxide are lower than $2\times10^{19}$ atoms/cm$^3$, preferably lower than $2\times10^{18}$ atoms/cm$^3$, further preferably lower than $2\times10^{17}$ atoms/cm$^3$.

The density of state (DOS) of a sample where the oxide layer 106a, the oxide semiconductor layer 106b and the oxide layer 106c are stacked over a substrate is evaluated by CPM.

The oxide layer 106a is an oxide layer formed by a sputtering method using an In—Ga—Zn oxide (having an atomic ratio of In:Ga:Zn=1:3:2) target. Note that the oxide layer 106a is formed in such a manner that an argon gas at a flow rate of 30 sccm and an oxygen gas at a flow rate of 15 sccm are used as a film formation gas, the pressure is set to be 0.4 Pa, the substrate temperature is set to be 200° C., and a DC power of 0.5 kW is applied.

The oxide semiconductor layer 106b is an oxide semiconductor layer formed by a sputtering method using an In—Ga—Zn oxide (having an atomic ratio of In:Ga:Zn=1:1:1) target. Note that the oxide semiconductor layer 106b is formed in such a manner that an argon gas at a flow rate of 30 sccm and an oxygen gas at a flow rate of 15 sccm are used as a film formation gas, the pressure is set to be 0.4 Pa, the substrate temperature is set to be 200° C., and a DC power of 0.5 kW is applied.

The oxide layer 106c is formed by a sputtering method using an In—Ga—Zn oxide (the atomic ratio of In to Ga and Zn is 1:3:2) target. Note that the oxide layer 106c is formed in such a manner that an argon gas at a flow rate of 30 sccm and an oxygen gas at a flow rate of 15 sccm are used as a film formation gas, the pressure is set to be 0.4 Pa, the substrate temperature is set to be 200° C., and a DC power of 0.5 kW is applied.

Here, the thicknesses of the oxide layer 106a, the oxide semiconductor layer 106b, and the oxide layer 106c are set to 30 nm, 100 nm, and 30 nm, respectively for increasing the accuracy in the CPM measurement.

In the CPM measurement, the amount of light with which a surface of the sample between terminals is irradiated is adjusted so that a photocurrent value is kept constant in the state where voltage is applied between a first electrode and a second electrode provided in contact with the oxide semiconductor layer 106b that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the DOS of the sample can be obtained.

Figure 13:
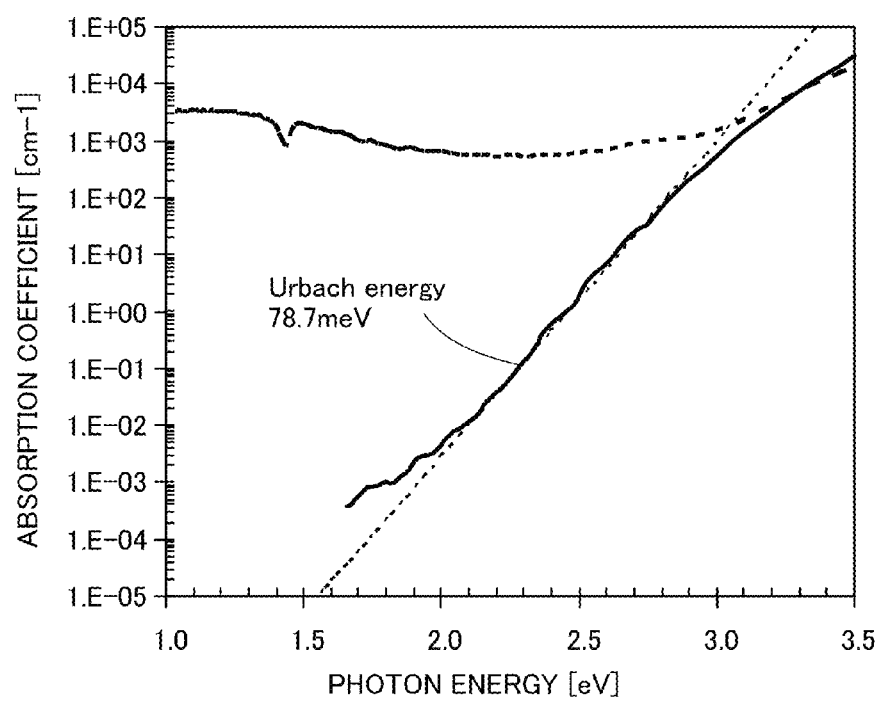
FIG. 13 is a graph showing an absorption coefficient measured by CPM.

FIG. 13 shows results of fitting the absorption coefficient (dotted line) measured using a spectrophotometer and the absorption coefficient (solid line) measured by CPM in the range of energy higher than or equal to the energy gap of the oxide semiconductor layer 106b. Note that the Urbach energy obtained based on the absorption coefficient measured by CPM was 78.7 meV. The integral value of the absorption coefficient is calculated in such a manner that a background (thin dotted line) is subtracted from the absorption coefficient measured by CPM in FIG. 13. As a result, the absorption coefficient due to DOS of this sample is found to be $2.02\times10^{-4}$ cm$^{-1}$.

The base insulating film 102 illustrated in FIGS. 3A to 3C may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The base insulating film 102 is, for example, a multilayer film including a silicon nitride layer as a first layer and a silicon oxide layer as a second layer. In this case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is lower than or equal to $3\times10^{17}$ spins/cm$^3$, preferably lower than or equal to $5\times10^{16}$ spins/cm$^3$ is used. As the silicon nitride layer, a silicon nitride layer from which a hydrogen gas and an ammonia gas are less likely to be released is used. The amount of discharge of the hydrogen gas or the ammonia gas may be measured by thermal desorption spectroscopy (TDS). Further, as the silicon nitride layer, a silicon nitride layer which does not transmit or hardly transmits hydrogen, water, and oxygen is used.

The base insulating film 102 may be, for example, a multilayer film including a silicon nitride layer as a first layer, a first silicon oxide layer as a second layer, and a second silicon oxide layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide layer, a silicon oxide layer having excess oxygen is used. As the silicon nitride layer, a silicon nitride layer from which a hydrogen gas and an ammonia gas are less likely to be released is used. Further, as the silicon nitride layer, a silicon nitride layer which does not transmit or hardly transmits hydrogen, water, and oxygen is used.

The silicon oxide layer having excess oxygen means a silicon oxide layer from which oxygen can be released by heat treatment or the like. An insulating film having excess oxygen means an insulating film from which oxygen is released by heat treatment.

The insulating film containing excess oxygen is capable of reducing oxygen vacancies in the oxide semiconductor layer 106b. Such an oxygen vacancy forms defect states in the oxide semiconductor layer 106b and some of the defect states serves as a trap state. In addition, hydrogen comes into the site of such an oxygen vacancy and forms an electron serving as a carrier. Thus, by a reduction in the number of oxygen vacancies in the oxide semiconductor layer 106b, the transistor can have stable electric characteristics.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis (converted into the number of oxygen atoms) in the range of a film surface temperature of from 100° C. to 700° C. or from 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from the measurement sample can be calculated based on Equation (22) using the TDS results of a silicon wafer containing hydrogen at a predetermined density, which is a reference sample, and the TDS results of the measurement sample. Here, all gases having a mass number of 32 which are obtained in the TDS analysis are assumed to originate from an oxygen molecule. A CH$_3$OH gas, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal

[Equation 22]

$$N_{O2} = \frac{N_{H2}}{S_{H2}} \times S_{O2} \times \alpha \quad (22)$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value $\alpha$ is a coefficient affecting the ion intensity in the TDS analysis. Refer to Japanese Published Patent Application No. H6-275697 for details of Equation 22. The amount of released oxygen is measured with a thermal desorption spectroscopy apparatus produced by ESCO Ltd., EMD-WA1000S/W using a silicon wafer containing hydrogen atoms at $1\times10^{16}$ atoms/cm$^2$ as the reference sample.

Further, in the TDS analysis, oxygen is partly detected as an oxygen atom. The ratio between oxygen molecules and oxygen atoms can be calculated from the ionization rate of the oxygen molecules. Note that since the above $\alpha$ includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Further, a film from which oxygen is released by heat treatment may contain a peroxide radical. Specifically, the spin density attributed to the peroxide radical is greater than or equal to $5\times10^{17}$ spins/cm$^3$. Note that the film containing a peroxide radical may have an asymmetric signal with a g factor of approximately 2.01 in ESR.

The insulating film containing excess oxygen may be oxygen-excess silicon oxide (SiO$_X$(X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry (RBS).

The source electrode 116a and the drain electrode 116b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten, for example. The source electrode 116a and the drain electrode 116b are each preferably a multilayer film including a layer containing copper. The source electrode 116a and the drain electrode 116b are each a multilayer film including a layer containing copper, whereby wiring resistance can be reduced in the case where a wiring is formed in the same layer as the source electrode 116a and the drain electrode 116b. Note that the compositions of the source electrode 116a and the drain electrode 116b are either the same as or different from each other.

In the case where a multilayer film including a layer containing copper is used for the source electrode 116a and the drain electrode 116b, copper comes into the oxide semiconductor layer 106b and thereby the carrier density of the oxide semiconductor layer 106b may be increased. Alternatively, copper forms an impurity state in the oxide semiconductor layer 106b and the impurity state serves as a charge trap in some cases. In this case, when the oxide layer 106c can block copper, the increase in off-state current and the variation of the threshold voltage of the transistor due to the entry of copper into the oxide semiconductor layer 106b can be inhibited.

Figure 4A:
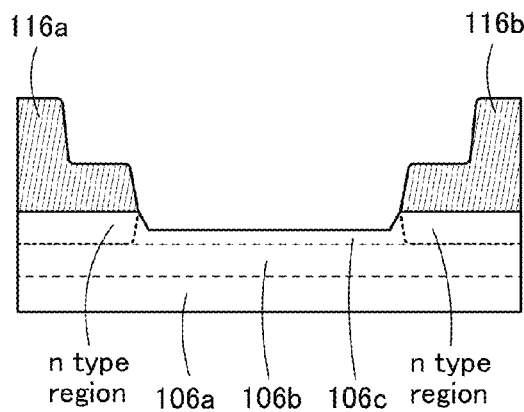
FIGS. 4A to 4C are each a cross-sectional view of a region near a source electrode and a drain electrode of a transistor in accordance with one embodiment of the present invention as an example.
Figure 4B:
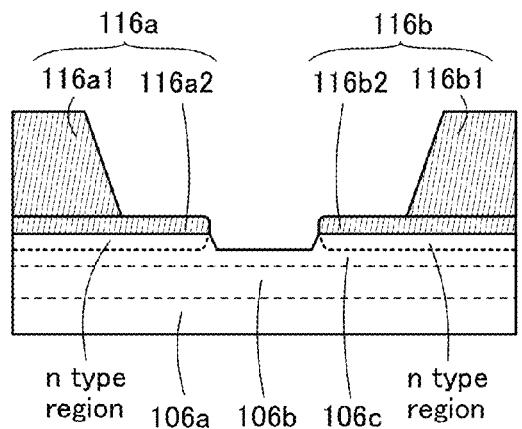
Figure 4C:
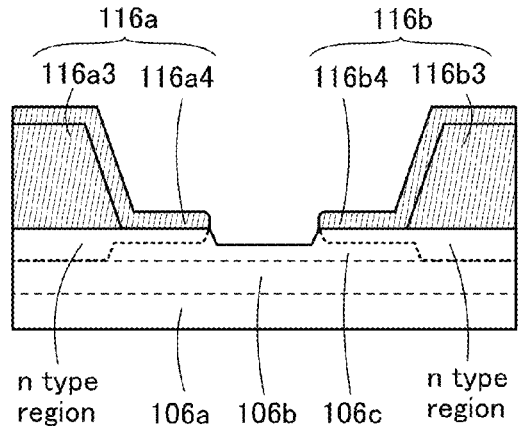

FIGS. 4A to 4C are cross-sectional views of the vicinities of the source electrode 116a and the drain electrode 116b of the transistor. The source electrode 116a and the drain electrode 116b may have any structure illustrated in FIGS. 4A to 4C. In FIGS. 4A to 4C, the top surface of the oxide layer 106c is hollowed as a result of the formation of the source electrode 116a and the drain electrode 116b.

FIG. 4A illustrates a structure where steps are formed in the source electrode 116a and the drain electrode 116b. N-type regions are formed in regions represented by dotted line in the oxide layer 106c. The n-type regions are formed resulting from generation of oxygen vacancies in the oxide layer 106c due to damages when the source electrode 116a and the drain electrode 116b are formed over the oxide layer 106c or action of the conductive film serving as the source electrode 116a and the drain electrode 116b. Due to entry of hydrogen into the site of oxygen vacancies, an electron serving as a carrier may be generated. Note that the n-type regions are formed down to the vicinity of the boundary between the oxide layer 106c and the oxide semiconductor layer 106b as a non-limiting example illustrated in FIG. 4A. For example, the n-type regions may be formed in the oxide layer 106c and the oxide semiconductor layer 106b, or only in the oxide layer 106c.

In the structure illustrated in FIG. 4B, a conductive layer 116a2 which is not easily oxidized and a conductive layer 116a1 provided over the conductive layer 116a2 are used as the source electrode 116a, and a conductive layer 116b2 which is not easily oxidized and a conductive layer 116b1 provided over the conductive layer 116b2 are used as the drain electrode 116b. Note that the conductive layer which is not easily oxidized is unlikely to reduce the oxide layer 106c. When the source electrode 116a and the drain electrode 116b have a structure illustrated in FIG. 4B, the n-type regions are formed only in the oxide layer 106c. Further, diffusion of oxygen vacancies in the channel length direction is small, so that the channel formation region is less likely to have n-type conductivity. Further, owing to the conductive layer 116a1 and the conductive layer 116b1, it is acceptable that the conductive layer 116a2 and the conductive layer 116b2 have low conductivity. Thus, the thicknesses of the conductive layer 116a2 and the conductive layer 116b2 can be small, which leads to easy microfabrication. In other words, the structure illustrated in FIG. 4B is favorable for a miniaturized transistor having a small channel length.

Note that the conductive layer 116a1 and the conductive layer 116a2 may be the same conductive layer. In addition, the conductive layer 116b1 and the conductive layer 116b2 may be the same conductive layer.

In the structure illustrated in FIG. 4C, a conductive layer 116a3 and a conductive layer 116a4 which is not easily oxidized and is provided over the conductive layer 116a3 are used as the source electrode 116a, and a conductive layer 116b3 and a conductive layer 116b4 which is not easily oxidized and is provided over the conductive layer 116b3 are used as the drain electrode 116b. When the source electrode 116a and the drain electrode 116b have a structure illustrated in FIG. 4C, parts of the n-type regions formed in the oxide layer 106c are formed down to the vicinity of the boundary between the oxide semiconductor layer 106b and the oxide layer 106c and a part of the n-type regions is formed in only the oxide layer 106c. In that case, diffusion of oxygen vacancies in the channel length direction is small, so that the channel formation region is less likely to have n-type conductivity. Since the n-type regions are formed so as to reach the oxide semiconductor layer 106b below the conductive layer 116a3 and the conductive layer 116b3, the resistance between the source electrode 116a and the drain electrode 116b is small; as a result, the field-effect mobility of the transistor can be increased. Further, owing to the conductive layer 116a3 and the conductive layer 116b3, it is acceptable that the conductive layer 116a4 and the conductive layer 116b4 can have low conductivity. Thus, the thicknesses of the conductive layer 116a4 and the conductive layer 116b4 can be small, which leads to easy microfabrication. In other words, the structure illustrated in FIG. 4C is favorable for a miniaturized transistor having a small channel length.

Note that the conductive layer 116a3 and the conductive layer 116a4 may be the same conductive layer. In addition, the conductive layer 116b3 and the conductive layer 116b4 may be the same conductive layer.

The gate insulating film 112 illustrated in FIGS. 3A to 3C may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 112 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is lower than or equal to $3 \times 10^{17}$ spins/cm$^3$, preferably lower than or equal to $5 \times 10^{16}$ spins/cm$^3$ is used. As the silicon oxide layer, a silicon oxide layer having excess oxygen is preferably used. As the silicon nitride layer, a silicon nitride layer from which a hydrogen gas and an ammonia gas are less likely to be released is used. The amount of released hydrogen gas or ammonia gas may be measured by TDS.

When at least one of the gate insulating film 112 and the base insulating film 102 includes an insulating film containing excess oxygen, oxygen vacancies in the oxide semiconductor layer 106b are reduced, so that the transistor can have stable electrical characteristics.

The gate electrode 104 may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten, for example.

The protective insulating film 108 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The protective insulating film 108 includes, for example, a silicon nitride layer. The silicon nitride layer may be a silicon nitride oxide layer. As the silicon nitride layer, a silicon nitride layer from which a hydrogen gas and an ammonia gas are less likely to be released is preferred. The amount of released the hydrogen gas or the ammonia gas may be measured by TDS. Further, as the silicon nitride layer, a silicon nitride layer which does not transmit or hardly transmits hydrogen, water, and oxygen is preferably used.

The protective insulating film 108 includes, for example, an aluminum oxide layer. As the aluminum oxide layer, an aluminum oxide layer from which a hydrogen gas is less likely to be released is preferred. The amount of released hydrogen gas may be measured by TDS. As the aluminum oxide layer, an aluminum oxide layer which does not transmit or hardly transmits hydrogen, water, and oxygen is preferably used.

The protective insulating film 118 may be formed using a single layer or a stacked layer of an insulating film containing one or more kinds of silicon oxide, silicon oxynitride, germanium oxide, yttrium oxide, zirconium oxide, lanthanum oxide, neodymium oxide, hafnium oxide, and tantalum oxide, for example. Owing to the protective insulating film 118, the protective insulating film 108 is not necessarily provided.

There is no particular limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is difficult in some cases due to the shrinkage of the substrate 100, which is caused by heat treatment or the like in a manufacturing process of the semiconductor device. Therefore, in the case where the above-described large glass substrate is used as the substrate 100, a substrate whose shrinkage due to heat treatment is as less as possible is preferably used. For example, as the substrate 100, it is possible to use a large glass substrate in which the amount of shrinkage by heat treatment for one hour at 400° C., preferably 450° C., more preferably 500° C. is less than or equal to 10 ppm, preferably less than or equal to 5 ppm, more preferably less than or equal to 3 ppm.

Still alternatively, a flexible substrate may be used as the substrate 100. As a method of providing a transistor over a flexible substrate, there is a method in which a transistor is formed over a non-flexible substrate, and then the transistor is separated and transferred to the substrate 100 which is a flexible substrate. In that case, a separation layer is preferably provided between the non-flexible substrate and the transistor.

<Manufacturing Method of Transistor Structure (1)>

An example of a method for fabricating a transistor structure (1) is described below.

FIGS. 5A to 5D and FIGS. 6A to 6D are cross-sectional views corresponding to FIG. 3B.

First, the substrate 100 is prepared.

Next, the base insulating film 102 is formed. The base insulating film 102 can be deposited by a sputtering method, a chemical vapor deposition (CVD) method, a molecular beam epitaxy (MBE) method, an atomic layer deposition (ALD) method, or a pulsed laser deposition (PLD) method.

Alternatively, when a silicon wafer is used as the substrate 100, the base insulating film 102 can be formed by a thermal oxidation method.

Then, in order to planarize the surface of the base insulating film 102, chemical mechanical polishing (CMP) may be performed. By CMP, the average surface roughness (Ra) of the base insulating film 102 is preferably 1 nm or less, further preferably 0.3 nm or less, still preferably 0.1 nm or less. Ra that is 1 nm or less can increase the crystallinity of the oxide semiconductor layer 106b in some cases. Note that the average surface roughness (Ra) is obtained by expanding, into three dimensions, arithmetic mean surface roughness that is defined by JIS B 0601:2001 (ISO4287:1997) so as to apply it to a curved surface. Ra can be expressed as an "average value of the absolute values of deviations from a reference surface to a designated surface" and is defined by Equation (23).

[Equation 23]

$$Ra = \frac{1}{S_0}\int_{y_1}^{y_2}\int_{x_1}^{x_2} |f(x, y) - Z_0| dx dy \qquad (23)$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). $S_0$ represents the area of a rectangle which is obtained by projecting the specific surface on the xy plane, and $Z_0$ represents the height of the reference surface (the average height of the specific surface). Ra can be measured using an atomic force microscope (AFM).

Then, oxygen ions may be added into the base insulating film 102 so that an insulating film containing excess oxygen can be formed. The addition of oxygen ions is preferably performed by an ion-implantation method at acceleration voltage of 2 kV to 100 kV and at a dose of $5\times10^{14}$ ions/cm$^2$ to $5\times10^{16}$ ions/cm$^2$ for example.

Figure 5A:
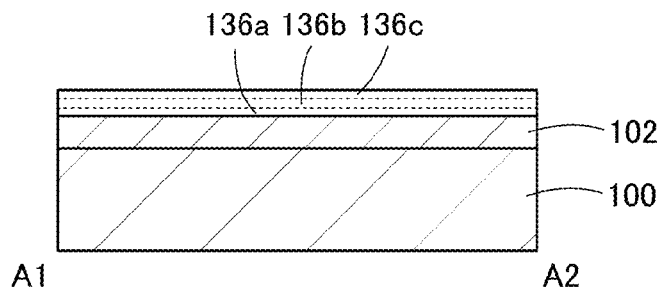
FIGS. 5A to 5D are cross-sectional views illustrating an example of a method for manufacturing a transistor in accordance with one embodiment of the present invention.

Next, the oxide layer 136a, the oxide semiconductor layer 136b, and the oxide layer 136c are formed in this order (see FIG. 5A). The oxide layer 136a, the oxide semiconductor layer 136b, and the oxide layer 136c can be formed using any of oxides listed for the oxide layer 106a, the oxide semiconductor layer 106b, and the oxide layer 106c. The oxide semiconductor layer 136b and the oxide layer 136c can be deposited by a sputtering method, a CVD method, an MBE method, an ALD method, or a PLD method.

A model of sputtering formation of an oxide layer having crystallinity even over an amorphous surface, an amorphous insulating surface, or an amorphous oxide surface is described below. The formation method of the oxide layer described below can be applied to the formation methods of the oxide layer 136a, the oxide semiconductor layer 136b, and the oxide layer 136c.

Figure 14A:
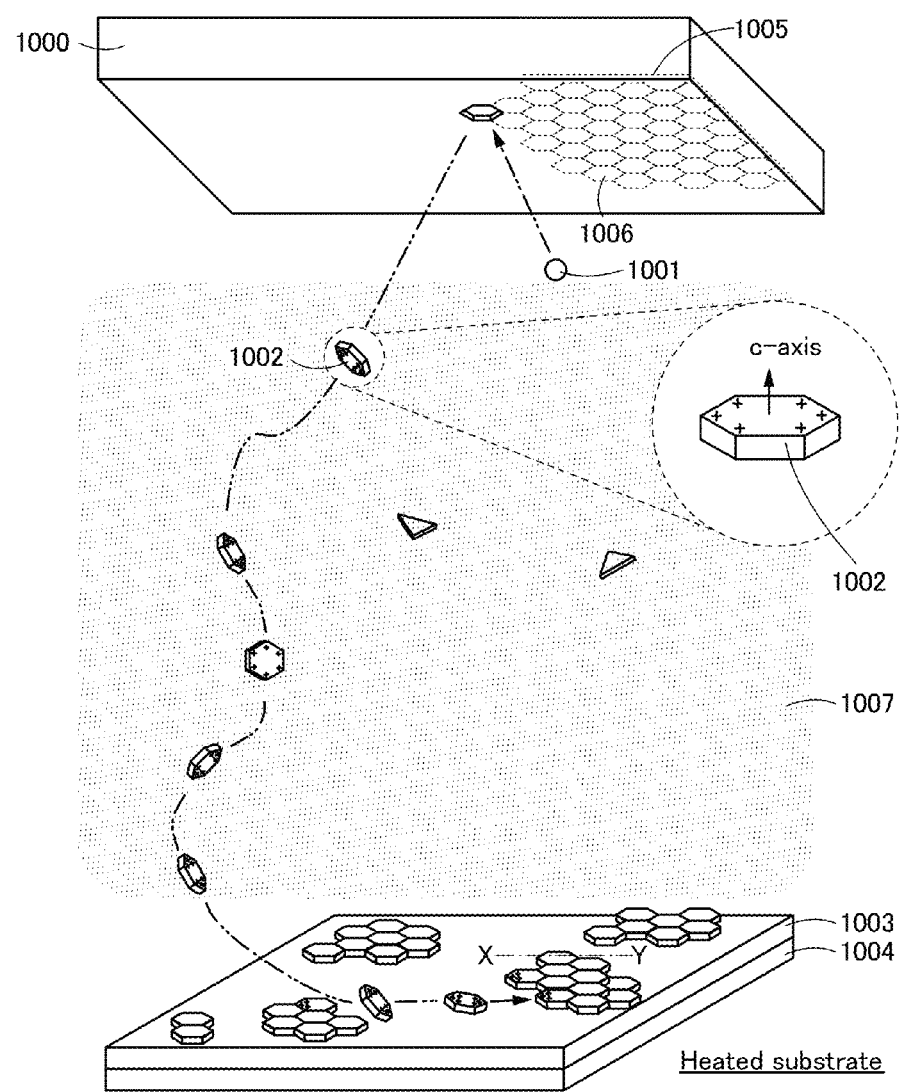
FIGS. 14A and 14B are schematic views illustrating a state in which sputtered particles are separated from a target and the sputtered particles reach a deposition surface.

FIG. 14A is a schematic diagram illustrating a state in which an ion 1001 collides with a target 1000 containing a polycrystalline oxide, a sputtered particle 1002 with crystallinity is separated from the target 1000 and deposited on an amorphous film 1004, so that an oxide layer 1003 is formed. A crystal grain contained in the target has a cleavage plane 1005 parallel to the a-b plane of a crystal. The crystal grain contained in the target has a portion 1006 with a weak interatomic bond.

When the ion 1001 collides with the crystal grain contained in the target, the interatomic bonds in the cleavage plane 1005 and the portion 1006 are cut, so that a sputtered particle 1002 blasts off.

Alternatively, when the ion 1001 collides with the crystal grain contained in the target, the interatomic bond is broken in the cleavage plane 1005 and a particle having crystallinity that is cut into a round slice from the crystal grain contained in the target blasts off. Then, the particle blasting off the target is subjected to the plasma 1007 and the interatomic bond in the portion 1006 is broken, so that a plurality of sputtered particles 1002 are generated.

Figure 14B:
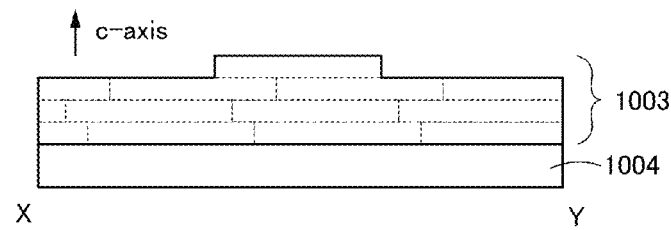

The sputtering particle 1002 has a flat-plate like shape, for example. The term "flat-plate" has two planes that are parallel with each other (each plane can be said to be a flat-plate), for example. In particular, a flat-plate having two parallel planes that are hexagons (regular hexagons) with all the internal angles of 120° is referred to as a pellet. The sputtered particle 1002 that is pellet-like has an a-b plane parallel with the hexagonal plane, for example. In addition, the pellet-like sputtered particle 1002 has a c-axis direction of a crystal that is perpendicular to the plane of the hexagon, for example (see FIG. 14B). In addition, the diameter of the hexagonal plane of the pellet-like sputtered particle 1002 is from 1 nm to 100 nm, from 1 nm to 30 nm, or from 1 nm to 10 nm. Note that the shape of the sputtered particle 1002 is not limited to the flat-plate like shape in which parallel two planes are hexagonal in the model described below. The sputtered particle 1002 appears and disappears instantly. Therefore, it is extremely difficult to directly observe the sputtered particle 1002 itself. Based on the assumption that the sputtered particle 1002 has a flat-plate like shape having two parallel hexagonal planes, description is made below.

The ion 1001 is, for example, a cation of oxygen. With use of an oxygen cation as the ion 1001, plasma damage at deposition can be alleviated. In addition, the use of the ion 1001 having an oxygen cation can inhibit the crystallinity of the target from being decreased or being made into amorphous at the time of collision of the ion 1001 to the target, for example. Further, in some cases, the use of the ion 1001 having an oxygen cation can increase the crystallinity of the target at the time of collision of the ion 1001 to the target surface, for example. Note that the ion 1001 may have, for example, a cation of a rare gas (such as helium, neon, argon, krypton, or xenon).

Figure 15A:
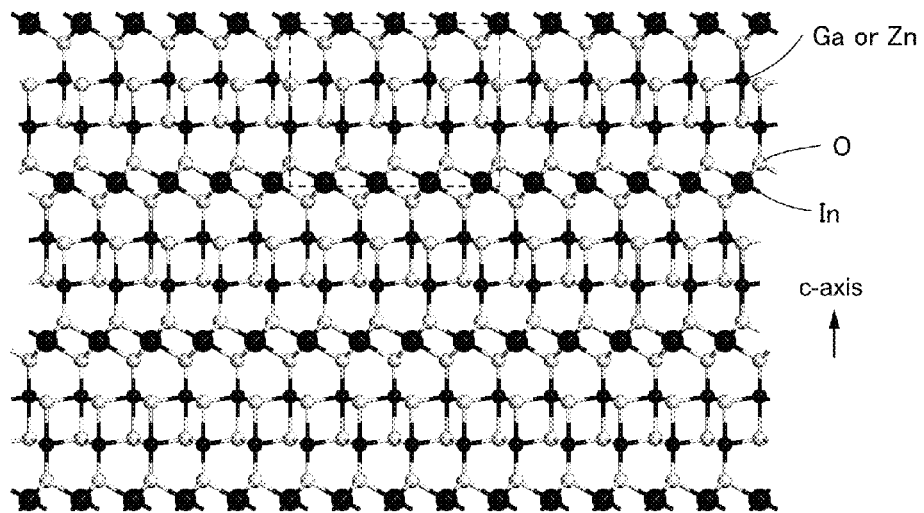
FIGS. 15A and 15B are diagrams illustrating a crystal structure of a homologous compound represented by $InGaO_3(ZnO)_m$ (m is a natural number) where m is 1.

An example of a crystal contained in the target, in a homologous compound represented by $InGaO_3(ZnO)_m$ (m is a natural number), the crystal structure when m is 1 is illustrated as viewed parallel with the a-b plane (see FIG. 15A). Further, FIG. 15B illustrates an enlarged portion surrounded by a dashed line in FIG. 15A.

Figure 15B:
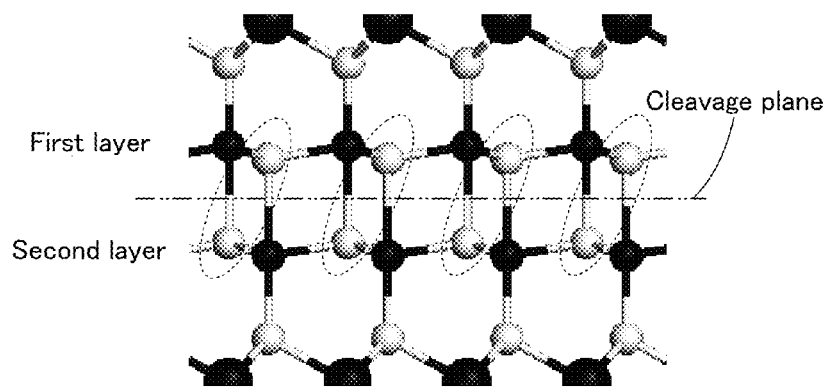

For example, in a crystal grain contained in the target, a cleavage plane is a plane between a first layer and a second layer as illustrated in FIG. 15B. The first layer includes a gallium atom and/or zinc atom and an oxygen atom, and the second layer includes a gallium atom and/or zinc atom and an oxygen atom. This is because oxygen atoms in the first layer and oxygen atoms in the second layer are close to each other (see surrounded portions in FIG. 15B). For example, since the oxygen atoms have negative charge, the bonding between layers can be weakened by the oxygen atoms closer to each other. In this manner, the cleavage plane is a plane parallel to an a-b plane. In addition, the crystal structure illustrated in FIGS. 15A and 15B has a triangular or hexagonal (regular triangular, or regular hexagonal) atomic arrangement of metal atoms when viewed from a direction perpendicular to the a-b plane. Therefore, in the case where the target having the crystal structure illustrated in FIGS. 15A and 15B is used, the probability of the sputtered particle 1002 becoming a pellet-shape having hexagonal planes with the internal angles of 120° or triangle planes with the internal angles of 60° is thought to be high.

It is preferable that the separated sputtered particles 1002 be charged as illustrated in FIG. 14A. Note that it is preferable that corner portions of the sputtered particles 1002 have charges with the same polarity because interaction between the sputtered particles occurs (the sputtered particles repel with each other) such that the shapes of the sputtered particles 1002 maintain. For example, the sputtered particles 1002 may be positively charged. However, there is no particular limitation on the timing at which the sputtered particles 1002 are positively charged. The sputtered particle 1002 can be charged positively by receiving a charge at collision of the ion 1001, for example. In addition, the sputtered particle 1002 can be charged positively by being subjected to the plasma 1007, for example. Further alternatively, the ion 1001 which is an oxygen cation is preferably bonded to a side surface, a top surface, or a bottom surface of the sputtered particle 1002, whereby the sputtered particle 1002 is positively charged.

It is preferable to use a direct-current (DC) power source to positively charge the corner portions of the sputtered particle 1002. Note that a radio frequency (RF) power source or an alternating-current (AC) power source can also be used. Note that it is difficult to discharge plasma uniformly over a wide area by a sputtering method using an RF source. Therefore, the sputtering method using an RF source is difficult to be applied to deposition over the large area of a substrate. In addition, a DC power source is preferred to an AC power source on the basis of aspects described below depending on cases.

In a sputtering method using a DC source, a direct current is applied between a target and a substrate, for example, as illustrated in FIG. 16A1. Accordingly, the potential difference between the target and the substrate while a direct-current voltage is being applied is constant as illustrated in FIG. 16B1. The sputtering method using a DC source can maintain persistent plasma discharge.

In the sputtering method using a DC source, the sputtered particle 1002 is being subjected to an electric field and thus a charge at the corner portion of the sputtered particle 1002 is not lost. The shape of the sputtered particle 1002 can be maintained by a charge held at the corner portion (FIG. 16C1).

On the other hand, in the sputtering method using an AC source, for example, as illustrated in FIG. 16A2, a cathode and an anode of adjacent targets are switched between Period A and Period B. For example, in Period A as illustrated in FIG. 16B2, a target (1) serves as a cathode and a target (2) serves as an anode. In addition, for example, in Period B illustrated in FIG. 16B2, the target (1) serves as an anode and the target (2) serves as a cathode. The sum of Period A and Period B is about 20 microseconds to 50 microseconds, for example. As described above, in the sputtering method using an AC source, Period A and Period B are switched alternately to discharge plasma.

In the sputtering method using an AC source, the sputtered particle 1002 is not subjected to an electric field instantly, and thus the charge at the corner portion may be lost. Thus, the shape of the sputtered particle 1002 may be broken by the loss of the charge at the corner portion (FIG. 16C2). Accordingly, the DC source is preferred to maintain the shape of the sputtered particle 1002, as compared with the AC source.

As illustrated in FIG. 14A, the sputtered particle 1002 that has blasted off from the target flies in the plasma 1007 like a kite. Then, the sputtered particle 1002 flutters down on a deposition surface. Then, the sputtered particle 1002 glides over the deposition surface like a hang glider when the deposition surface is at high temperatures (e.g., 150° C. or higher) by substrate heating. At this time, the sputtered particle 1002 has a charge at the corner portion of the sputtered particle 1002, and thus repulsion between the sputtered particle 1002 and another sputtered particle 1002 that have been deposited is generated, for example. In addition, migration of the sputtered particle 1002 occurs over the high-temperature deposition surface, for example. Therefore, the sputtered particle 1002 migrates to an area where no sputtered particle 1002 is deposited on an outer surface and bonds to the side of another sputtered particle 1002, thereby being deposited. In this manner, the sputtered particles 1002 are spread with flat plate planes so as to be parallel with the deposition surface. The oxide layer 1003 formed in this manner has, for example, crystals with c-axes aligned in the direction perpendicular to the deposition surface (c-axis aligned crystal, CAAC). In addition, the oxide layer 1003 is, for example, an oxide layer having a uniform thickness and aligned orientations of crystals.

The oxide layer formed in this manner has a high crystallinity even over an amorphous surface, an amorphous insulating surface, an amorphous oxide surface, or the like.

Next, a formation method of an oxide layer when the temperature of a deposition surface is low by no substrate heating or the like is described with reference to FIG. 17 (for example, the temperature is lower than 130° C., lower than 100° C., lower than 70° C. or at room temperatures (20° C. to 25° C.).

Figure 17:
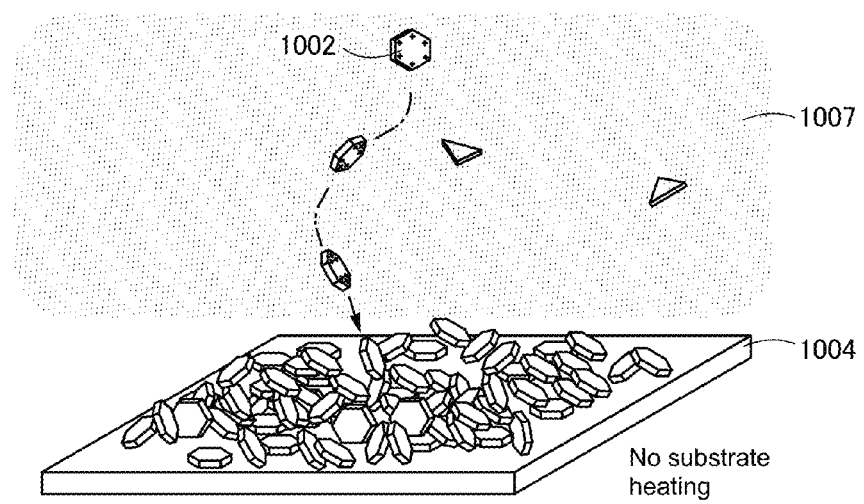
FIG. 17 is a diagram illustrating a crystal structure of an oxide.

In FIG. 17, when the deposition surface has a low temperature, the sputtered particle 1002 flutters down on the deposition surface randomly. The sputtered particle 1002 does not migrate and thus is deposited at random in areas including an area where another sputtered particle 1002 is deposited, for example. In other words, the thickness of the deposited oxide layer is not uniform and the orientation of crystals is irregular in some cases. The oxide layer deposited in this manner has a crystal part (nanocrystal) because the crystallinity of the sputtered particle 1002 has been maintained to some degree.

In addition, for example, when the pressure during deposition is high, the sputtered particle 1002 that is flying collides with another particle (such as atom, molecule, ion, radical, or the like) of argon or the like in higher frequency. The crystal structure of the sputtered particle 1002 may be broken when the sputtered particle 1002 that is flying collides with another particle (the sputtered particle 1002 is re-sputtered). For example, when the sputtered particle 1002 collides with another particle, the flat-plate shape of the sputtered particle 1002 cannot be maintained to be broken into pieces (separated into atoms) in some cases. At this time, each atom separated from the sputtered particle 1002 is deposited on the deposition surface so that an amorphous oxide layer is formed in some cases.

In addition, when a process in which a liquid is used or a process in which a solid target is vaporized is employed instead of a sputtering method using a target having a polycrystalline oxide as a starting point, separated atoms fly and are deposited on a deposition surface and thus an amorphous oxide layer is formed in some cases. In addition, for example, in a laser ablation method, atoms, molecules, ions, radicals, clusters, or the like released from a target fly and are deposited on the deposition surface so that an amorphous oxide layer is formed in some cases.

Through the process described above, the oxide layer can be formed. The detail of a sputtering apparatus with which the oxide layer is formed is described below.

After the oxide layer 136c is formed, first heat treatment is preferably formed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more, or under reduced pressure. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor layer 136b can be improved, and in addition, impurities such as hydrogen and water can be removed from the oxide insulating film 136b. In addition, by the first heat treatment, the density of defect states in the oxide semiconductor layer 106b is reduced.

Figure 5B:
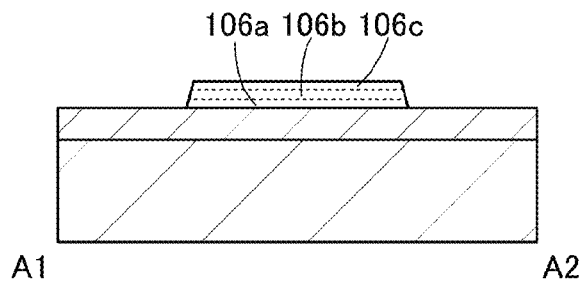
Figure 5C:
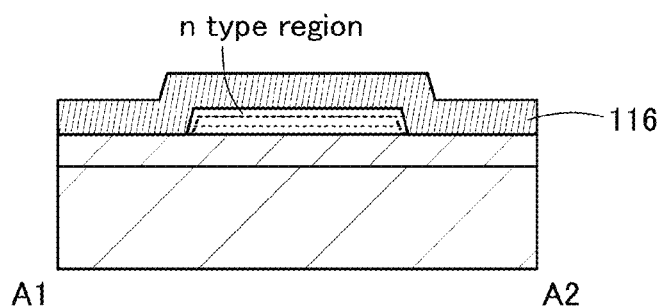

Next, the oxide layer 136a, the oxide semiconductor layer 136b, and the oxide layer 136c are partly etched, so that an island-like oxide layer 106a, an island-like oxide semiconductor layer 106b, and an island-like oxide layer 106c are formed (see FIG. 5B).

Then, a conductive film 116 is formed. The conductive film 116 may be a conductive film selected from the conductive films listed for the source electrode 116a and the drain electrode 116b. The conductive film 116 can be deposited by a sputtering method, a CVD method, an MBE method, an ALD method, or a PLD method. At this time, n-type regions are formed in regions represented by broken lines in the oxide layer 106a, the oxide semiconductor layer 106b, and the oxide layer 106c in some cases. The n-type regions are formed resulting from generation of oxygen vacancies in the oxide layer 106c due to damages when the conductive film 116 is formed over the oxide layer 106c or action of the conductive film 116. For example, due to entry of hydrogen into the site of oxygen vacancies, an electron serving as a carrier is generated. Note that the n-type regions are formed up to the vicinity of the boundary between the oxide layer 106c and the oxide semiconductor layer 106b as a non-limiting example illustrated in FIG. 4A. For example, the n-type regions may be formed in the oxide layer 106c and the oxide semiconductor layer 106b, or only in the oxide layer 106c (see FIG. 5C).

Figure 5D:
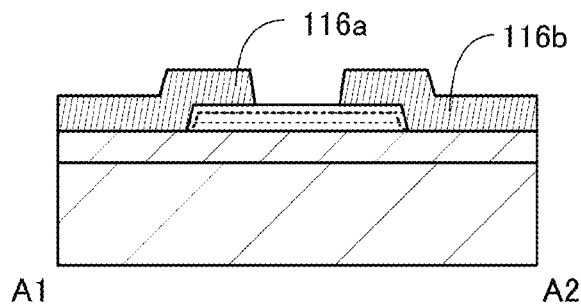

Then, the conductive film 116 is partially etched so that the source electrode 116a and the drain electrode 116b are formed (see FIG. 5D).

Then, second heat treatment is preferably performed. The second heat treatment is preferably performed under conditions selected from the conditions listed for the first heat treatment. By the second heat treatment, the n-type region where the oxide layer 106c is exposed can be turned into an i-type region (see FIG. 6A). Therefore, in the oxide layer 106c, the n-type regions can be formed only just under the source electrode 116a and the drain electrode 116b. Due to the n-type regions, the contact resistance between the oxide layer 106c and the source electrode 116a and the drain electrode 116b can be reduced, so that the amount of on-state current of a transistor can be increased. In addition, the second heat treatment can serve as also the first heat treatment.

Figure 6A:
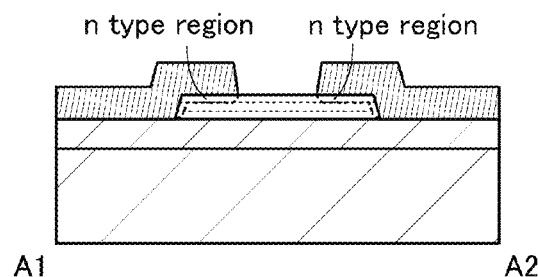
FIGS. 6A to 6D are cross-sectional views illustrating an example of a method for manufacturing a transistor in accordance with one embodiment of the present invention.
Figure 6B:
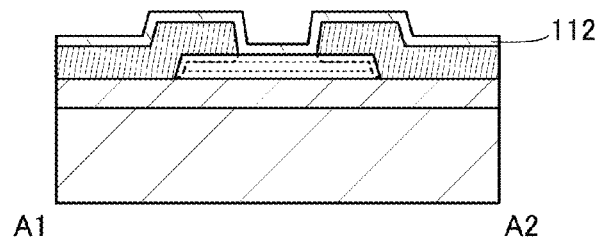

Next, the gate insulating film 112 is formed (see FIG. 6B). The gate insulating film 112 may be formed by a sputtering method, a CVD method, an MBE method, an ALD method, or a PLD method.

Then, a conductive film to serve as the gate electrode 104 is formed. The conductive film to serve as the gate electrode 104 can be selected from the conductive films listed for the gate electrode 104. The conductive film to serve as the gate electrode 104 may be formed by a sputtering method, a CVD method, an MBE method, an ALD method, or a PLD method.

Figure 6C:
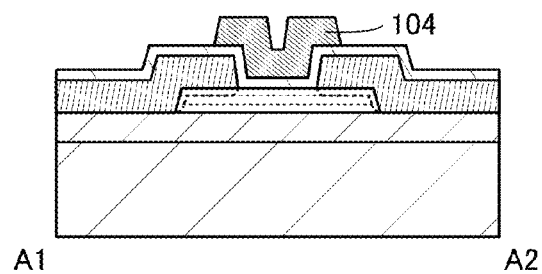

Next, the conductive film to serve as the gate electrode 104 is partly etched to form the gate electrode 104 (see FIG. 6C).

Then, the protective insulating film 108 is formed. The protective insulating film 108 may be formed by a sputtering method, a CVD method, an MBE method, an ALD method, or a PLD method.

Figure 6D:
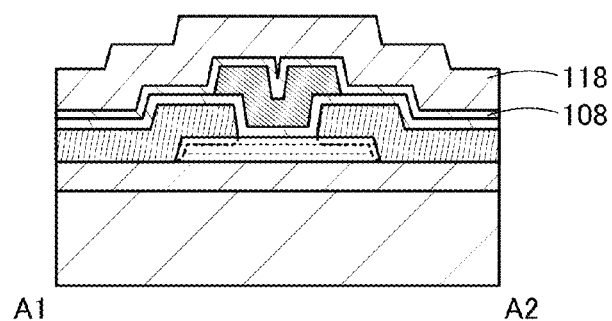

Then, the protective insulating film 118 is formed (see FIG. 6D). The protective insulating film 118 can be deposited by a sputtering method, a CVD method, an MBE method, an ALD method, or a PLD method.

Next, third heat treatment is preferably performed. The third heat treatment may be performed under any of the conditions listed for the first heat treatment or may be performed at temperature lower than the temperatures for the first heat treatment and the second heat treatment.

Through the above steps, the transistor illustrated in FIGS. 3A to 3C can be fabricated.

(Manufacturing Apparatus)

When the concentration of impurities contained in the oxide semiconductor layer 106b is low, the electric characteristics of the transistor are stable. Moreover, the oxide semiconductor layer 106b with high crystallinity has electric characteristics more stable than those of the oxide semiconductor layer 106b with an amorphous structure. A deposition apparatus for forming the oxide semiconductor layer 106b with low impurity concentration and high crystallinity is described below. The deposition apparatus described below can be used for formation of components other than transistors. With use of the deposition apparatus, the impurity concentrations of other components can be reduced.

First, a structure of a deposition apparatus which allows the entry of few impurities at the time of deposition is described with reference to FIGS. 18A and 18B.

Figure 18A:
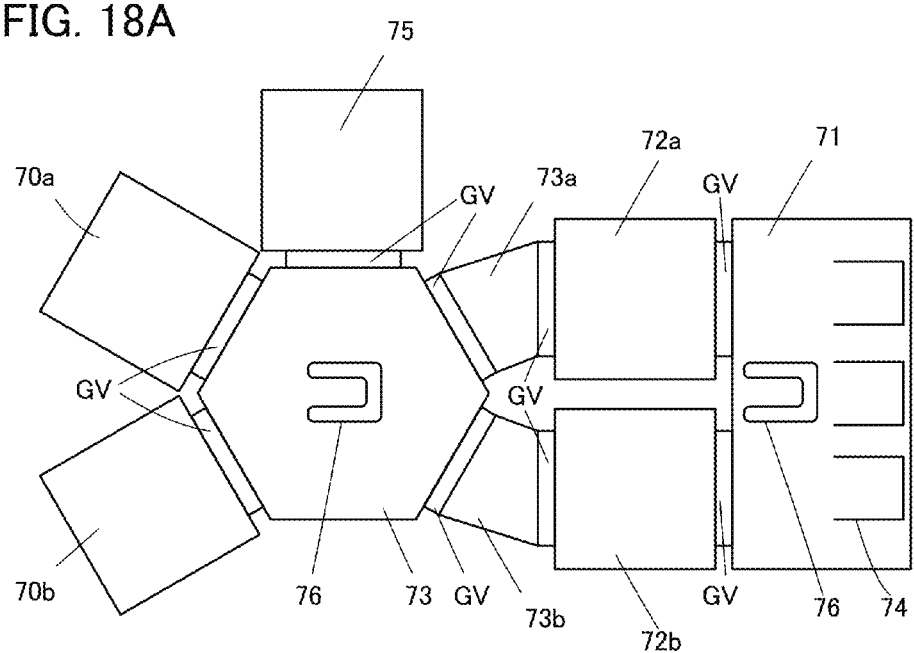
FIGS. 18A and 18B are each a top view illustrating an example of a deposition apparatus.

FIG. 18A is a top view of a multi-chamber deposition apparatus. The deposition apparatus includes an atmosphere-side substrate supply chamber 71 provided with three cassette ports 74 for holding substrates, a load lock chamber 72a, an unload lock chamber 72b, a transfer chamber 73, a transfer chamber 73a, a transfer chamber 73b, a substrate heating chamber 75, a deposition chamber 70a, and a deposition chamber 70b. The atmosphere-side substrate supply chamber 71 is connected to the load lock chamber 72a and the unload lock chamber 72b. The load lock chamber 72a and the unload lock chamber 72b are connected to the transfer chamber 73 through the transfer chamber 73a and the transfer chamber 73b, respectively. The substrate heating chamber 75, the deposition chamber 70a, and the deposition chamber 70b are connected only to the transfer chamber 73. Gate valves (GV) are provided for connecting portions between chambers so that each chamber except the atmosphere-side substrate supply chamber 71 can be independently kept under vacuum. Moreover, the atmosphere-side substrate supply chamber 71 and the transfer chamber 73 each include one or more substrate transfer robots 76, with which a substrate can be transferred. Here, it is preferable that the substrate heating chamber 75 also serve as a plasma treatment chamber. With a multi-chamber deposition apparatus, it is possible to transfer a substrate without exposure to the air between treatment and treatment, and adsorption of impurities to a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and can be determined as appropriate depending on the space for placement or the process.

Figure 18B:
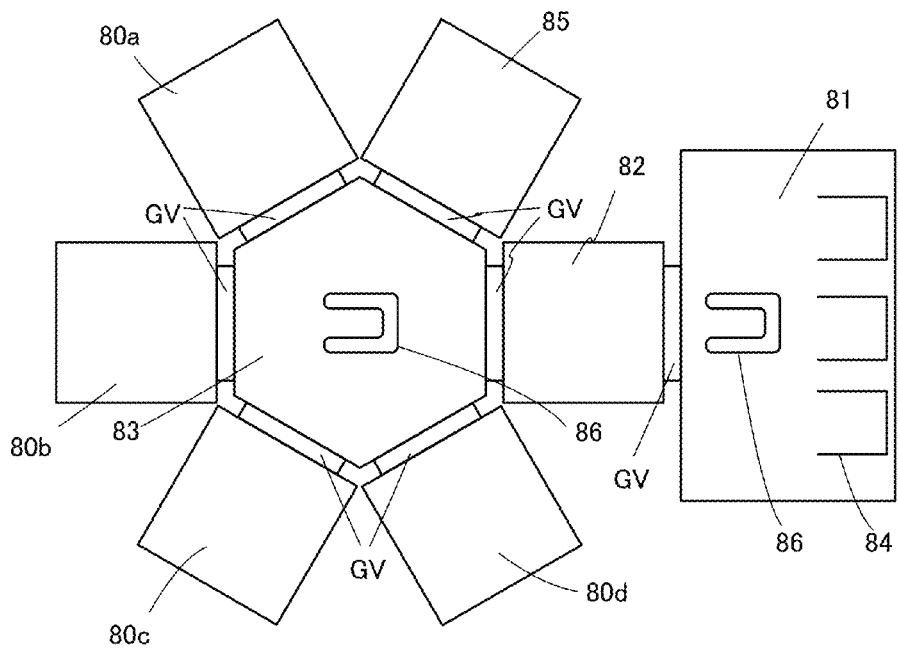

FIG. 18B is a top view of a multi-chamber deposition apparatus having a structure different from that illustrated in FIG. 18A. The deposition apparatus includes an atmosphere-side substrate supply chamber 81 including cassette ports 84, a load and unload lock chamber 82, a transfer chamber 83, a substrate heating chamber 85, substrate transfer robots 86, a deposition chamber 80a, a deposition chamber 80b, a deposition chamber 80c, and a deposition chamber 80d. The atmosphere-side substrate supply chamber 81, the substrate heating chamber 85, the deposition chamber 80a, the deposition chamber 80b, the deposition chamber 80c, and the deposition chamber 80d are connected to one another through the transfer chamber 83.

Here, an example of the deposition chamber (sputtering chamber) illustrated in FIG. 18B is described with reference to FIG. 19A. The deposition chamber 80b includes a target 87, an attachment protection plate 88, and a substrate stage 90, for example. Note that here, a glass substrate 89 is set on the substrate stage 90. Although not illustrated, the substrate stage 90 may include a substrate holding mechanism which holds the glass substrate 89, a rear heater which heats the glass substrate 89 from the back surface, or the like. The attachment protection plate 88 can suppress deposition of a particle which is sputtered from the target 87 on a region where deposition is not needed.

Figure 19A:
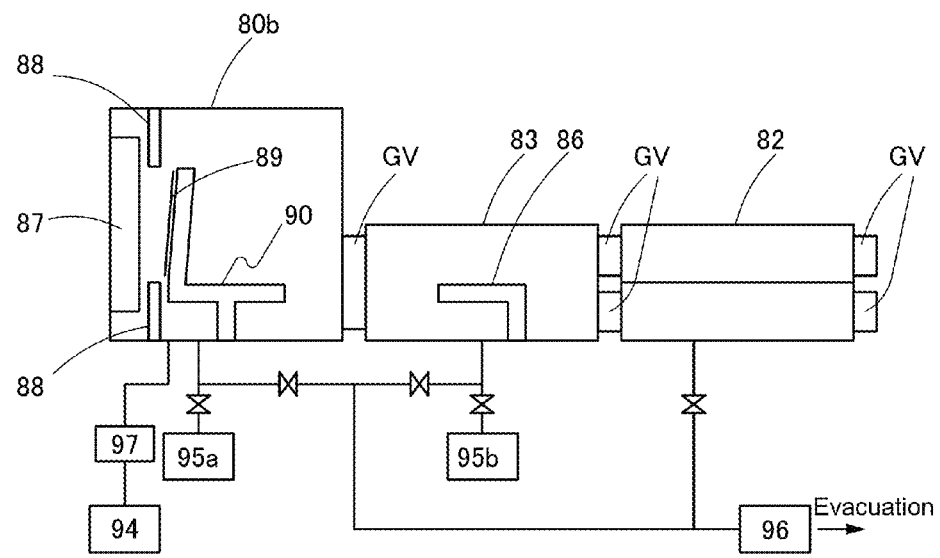
FIGS. 19A and 19B are each a cross-sectional view illustrating an example of a deposition chamber.

The deposition chamber 80b illustrated in FIG. 19A is connected to a refiner 94 through a mass flow controller 97. Note that although the refiner 94 and the mass flow controller 97 are provided in accordance with the number of kinds of gases, only one refiner 94 and one mass flow controller 97 are illustrated for simplicity. As a gas introduced to the deposition chamber 80b or the like, a gas whose dew point is lower than or equal to −80° C., preferably lower than or equal to −100° C., more preferably lower than or equal to −120° C. is used. With the use of an oxygen gas, a rare gas (e.g., an argon gas), or the like whose dew point is low, moisture entering a film at the time of deposition can be reduced.

Note that a vacuum pump 96 may be, for example, a pump in which a dry pump and a mechanical booster pump are connected in series. With such a structure, the deposition chamber 80b and the transfer chamber 83 are evacuated from atmospheric pressure to a low vacuum (about 0.1 Pa to 10 Pa) by the vacuum pump 96, and then evacuated from the low vacuum to a high vacuum ($1 \times 10^{-7}$ Pa to $1 \times 10^{-4}$ Pa) by a cryopump 95a or 95b after the valves are switched.

Next, another example of the deposition chamber illustrated in FIG. 18B is described with reference to FIG. 19B.

Figure 19B:
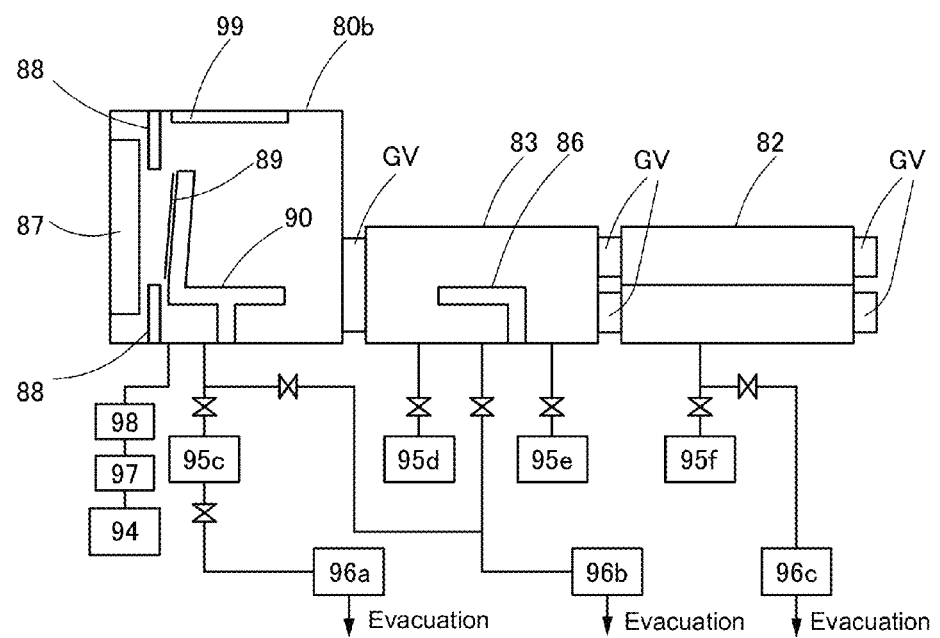

The deposition chamber 80b illustrated in FIG. 19B is connected to the transfer chamber 83 through the gate valve, and the transfer chamber 83 is connected to the load/unload lock chamber 82 through the gate valves.

The deposition chamber 80b in FIG. 19B is connected to the mass flow controller 97 through a gas heating system 98, and the gas heating system 98 is connected to the refiner 94 through the mass flow controller 97. With the gas heating system 98, a gas used in the deposition chamber 80b can be heated to a temperature higher than or equal to 40° C. and lower than or equal to 400° C. or higher than or equal to 50° C. and lower than or equal to 200° C. Note that although the gas heating system 98, the refiner 94, and the mass flow controller 97 are provided in accordance with the number of kinds of gases, only one gas heating system 98, one refiner 94, and one mass flow controller 97 are provided for simplicity.

The deposition chamber 80b in FIG. 19B is connected to a turbo molecular pump 95c and a vacuum pump 96b each through a valve. Note that as an auxiliary pump, a vacuum pump 96a is provided for the turbo molecular pump 95c through a valve. The vacuum pump 96a and the vacuum pump 96b can have structures similar to that of the vacuum pump 96. In addition, the deposition chamber 80b in FIG. 19B is provided with a cryotrap 99.

It is known that the turbo molecular pump 95c is capable of stably evacuating a large-sized molecule (atom), needs low frequency of maintenance, and thus enables high productivity, whereas it has a low capability in evacuating hydrogen and water. Hence, the cryotrap 99 having a high capability in evacuating a molecule (atom) having a relatively high melting point, such as water, is connected to the deposition chamber 80b. The temperature of a refrigerator of the cryotrap 99 is set to be lower than or equal to 100 K, preferably lower than or equal to 80 K. When the cryotrap 99 includes a plurality of refrigerators, the refrigerators preferably have different temperatures, in which case efficient evacuation can be performed. For example, the temperatures of a first-stage refrigerator and a second-stage refrigerator may be set at 100 K or lower and 20 K or lower, respectively.

The transfer chamber 83 in FIG. 19B is connected to the vacuum pump 96b, a cryopump 95d, and a cryopump 95e each through a valve. In the case of one cryopump, evacuation cannot be performed while the cryopump is in regeneration; however, in the case of two or more cryopumps which are connected in parallel, even when one of the cryopumps is in regeneration, evacuation can be performed using any of the other cryopumps. Note that regeneration of a cryopump refers to treatment for discharging molecules (atoms) entrapped in the cryopump. When molecules (or atoms) are entrapped too much in a cryopump, the evacuation capability of the cryopump is lowered; therefore, regeneration is performed regularly.

The load/unload lock chamber 82 in FIG. 19B is connected to a cryopump 95f and a vacuum pump 96c each through a valve. Note that the vacuum pump 96c may have a structure similar to that of the vacuum pump 96.

In the deposition chamber 80b, a target-facing-type sputtering apparatus may be employed. Note that a parallel-plate-type sputtering device or an ion beam sputtering apparatus may be provided in the deposition chamber 80b.

Next, an evacuation example of the substrate heating chamber in FIG. 18B is described with reference to FIG. 20.

Figure 20:
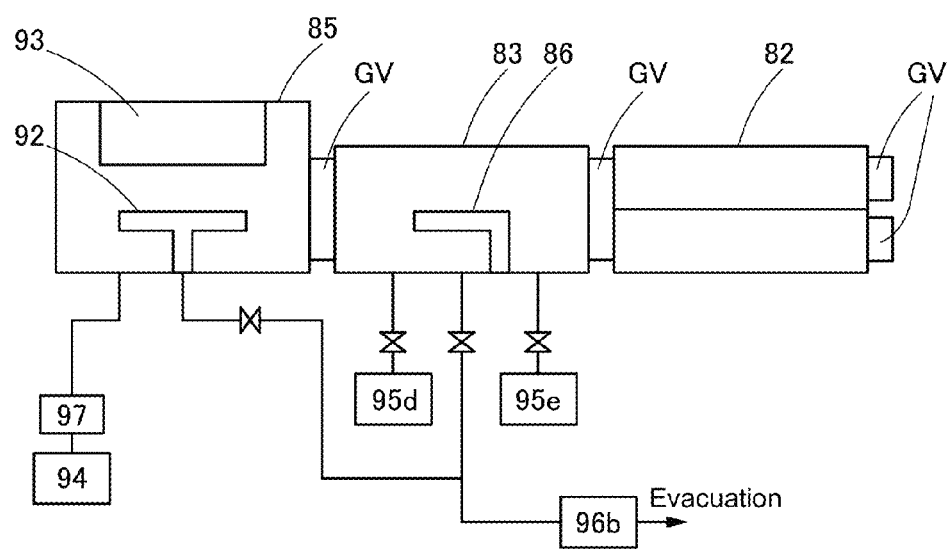
FIG. 20 is a diagram illustrating an example of a heat treatment chamber.

The substrate heating chamber 85 illustrated in FIG. 20 is connected to the transfer chamber 83 through a gate valve. Note that the transfer chamber 83 is connected to the load/unload lock chamber 82 through a gate valve.

The substrate heating chamber 85 in FIG. 20 is connected to the refiner 94 through the mass flow controller 97. Note that although the refiner 94 and the mass flow controller 97 are provided in accordance with the number of kinds of gases, only one refiner 94 and one mass flow controller 97 are illustrated for simplicity. In addition, the substrate heating chamber 85 is connected to the vacuum pump 96b through a valve.

In addition, the substrate heating chamber 85 includes a substrate stage 92. At least one substrate is set on the substrate stage 92, and a substrate stage on which a plurality of substrates can be set may be used as the substrate stage 92. The substrate heating chamber 85 also includes a heating mechanism 93. The heating mechanism 93 may be the one using a resistance heater for heating, for example. Alternatively, heat conduction or heat radiation from a medium such as a heated gas may be used as the heating mechanism. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas. The RTA apparatus enables heat treatment in a short time; thus, the amount of bending of the substrate caused by the heat treatment can be reduced. In particular, in a large glass substrate, bending may cause a reduction in yield of a semiconductor device even in a small amount. Accordingly, the RTA apparatus is preferably used for heat treatment at a high temperature such that a substrate is bent.

Note that the back pressure of each of the deposition chamber 80b and the substrate heating chamber 85 is lower than or equal to $1 \times 10^{-4}$ Pa, preferably lower than or equal to $3 \times 10^{-5}$ Pa, further preferably lower than or equal to $1 \times 10^{-5}$ Pa. In each of the deposition chamber 80b and the substrate heating chamber 85, the partial pressure of a gas molecule (atom) having a mass-to-charge ratio (m/z) of 18 is lower than or equal to $3 \times 10^{-5}$ Pa, preferably lower than or equal to $1 \times 10^{-5}$ Pa, further preferably lower than or equal to $3 \times 10^{-6}$ Pa. In each of the deposition chamber 80b and the substrate heating chamber 85, the partial pressure of a gas molecule (atom) having a mass-to-charge ratio (m/z) of 28 is lower than or equal to $3 \times 10^{-5}$ Pa, preferably lower than or equal to $1 \times 10^{-5}$ Pa, further preferably lower than or equal to $3 \times 10^{-6}$ Pa. Moreover, in each of the deposition chamber 80b and the substrate heating chamber 85, the partial pressure of a gas molecule (atom) having a mass-to-charge ratio (m/z) of 44 is lower than or equal to $3 \times 10^{-5}$ Pa, preferably lower than or equal to $1 \times 10^{-5}$ Pa, further preferably lower than or equal to $3 \times 10^{-6}$ Pa.

Further, in each of the deposition chamber 80b and the substrate heating chamber 85, the leakage rate is less than or equal to $3 \times 10^{-6}$ Pa·m$^3$/s, preferably less than or equal to $1 \times 10^{-6}$ Pa·m$^3$/s. In each of the deposition chamber 80b and the substrate heating chamber 85, the leakage rate of a gas molecule (atom) having a mass-to-charge ratio (m/z) of 18 is less than or equal to $1 \times 10^{-7}$ Pa·m$^3$/s, preferably less than or equal to $3 \times 10^{-8}$ Pa·m$^3$/s. In each of the deposition chamber 80b and the substrate heating chamber 85, the leakage rate of a gas molecule (atom) having a mass-to-charge ratio (m/z) of 28 is less than or equal to $1 \times 10^{-5}$ Pa·m$^3$/s, preferably less than or equal to $1 \times 10^{-6}$ Pa·m$^3$/s. Moreover, in each of the deposition chamber 80b and the substrate heating chamber 85, the leakage rate of a gas molecule (atom) having a mass-to-charge ratio (m/z) of 44 is less than or equal to $3 \times 10^{-6}$ Pa·m$^3$/s, preferably less than or equal to $1 \times 10^{-6}$ Pa·m$^3$/s.

Note that the total pressure and the partial pressure in the vacuum chambers such as the deposition chamber, the substrate heating chamber, and the transfer chamber can be measured using a mass analyzer. For example, Qulee CGM-051, a quadruple mass analyzer (also referred to as Q-mass) manufactured by ULVAC, Inc. may be used. Note that a leakage rate can be derived from the total pressure and partial pressure measured using the mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be lower than or equal to the above value.

When an adsorbate is present in the deposition chamber, the adsorbate does not affect the pressure in the deposition chamber because it is adsorbed onto an inner wall or the like; however, the adsorbate causes gas to be released when the inside of the deposition chamber is evacuated. Therefore, it is important that the adsorbate present in the deposition chamber be desorbed as much as possible with the use of a pump having high evacuation capability. Note that the deposition chamber may be baked to promote desorption of the adsorbate.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbate in the deposition chamber, and the impurities present in the deposition chamber can be reduced.

The rate of desorption of the adsorbate can be further increased also by dummy deposition. Here, the dummy deposition refers to deposition on a dummy substrate by a sputtering method or the like, in which a film is formed on the dummy substrate and the inner wall of the deposition chamber so that impurities in the deposition chamber and an adsorbate on the inner wall of the deposition chamber are confined in the film. As the dummy substrate, a substrate which releases a smaller amount of gas is preferably used, and for example, a substrate similar to the substrate 100 described later may be used. By performing dummy deposition, the concentration of impurities in a film to be formed later can be reduced. Note that the dummy deposition may be performed at the same time as the baking of the deposition chamber.

The oxide semiconductor layer 106b is formed with the use of the above deposition apparatus, so that the entry of impurities into the oxide semiconductor layer 106b can be suppressed. Further, a film in contact with the oxide semiconductor layer 106b is formed with the use of the above deposition apparatus, so that the entry of impurities into the oxide semiconductor layer 106b from the film in contact with the oxide semiconductor layer 106b can be suppressed.

Next, a method for successively depositing the oxide layer 106a, the oxide semiconductor layer 106b, and the oxide layer 106c using the above deposition apparatus is described.

First, the oxide layer 106a is formed. As the heating temperature at the time of deposition increases, the concentration of impurities in the oxide layer 106a decreases. Further, a substrate temperature at the time of deposition is higher than or equal to 150° C. and lower than or equal to 500° C., preferably higher than or equal to 170° C. and lower than or equal to 450° C., for example. The oxide layer 106a is formed after the following steps: a substrate is transferred to the deposition chamber; a deposition gas is flown; and the deposition pressure is kept for longer than or equal to 10 seconds and shorter than or equal to 1000 seconds, preferably longer than or equal to 15 seconds and shorter than or equal to 720 seconds to be stabilized. The substrate is held for the above period of time in order to stabilize the pressure, whereby the amount of impurities entering the oxide layer 106a at the time of the deposition can be reduced.

Then, the substrate is put into another deposition chamber, so that the oxide semiconductor layer 106b is formed. As the heating temperature at the time of deposition increases, the concentration of impurities in the oxide semiconductor layer 106b decreases. Further, a substrate temperature at the time of deposition is higher than or equal to 150° C. and lower than or equal to 500° C., preferably higher than or equal to 170° C. and lower than or equal to 450° C., for example. The oxide semiconductor layer 106b is formed after the following steps: a substrate is transferred to the deposition chamber; a deposition gas is flown; and the deposition pressure is kept for longer than or equal to 10 seconds and shorter than or equal to 1000 seconds, preferably longer than or equal to 15 seconds and shorter than or equal to 720 seconds to be stabilized. The substrate is held for the above period of time in order to stabilize the pressure, whereby the amount of impurities entering the oxide semiconductor layer 106b at the time of the deposition can be reduced.

Then, the substrate is put into another deposition chamber, so that the oxide layer 106c is formed. As the heating temperature at the time of deposition increases, the concentration of impurities in the oxide layer 106c decreases. Further, a substrate temperature at the time of deposition is higher than or equal to 150° C. and lower than or equal to 500° C., preferably higher than or equal to 170° C. and lower than or equal to 450° C., for example. The oxide layer 106c is formed after the following steps: a substrate is transferred to the deposition chamber; a deposition gas is flown; and the deposition pressure is kept for longer than or equal to 10 seconds and shorter than or equal to 1000 seconds, preferably longer than or equal to 15 seconds and shorter than or equal to 720 seconds to be stabilized. The substrate is held for the above period of time in order to stabilize the pressure, whereby the amount of impurities entering the oxide layer 106c at the time of the deposition can be reduced.

Note that in the case where the oxide layer 106a, the oxide semiconductor layer 106b, and the oxide layer 106c are formed over a plurality of substrates, it is preferable that a rare gas, an oxygen gas, or the like be continuously supplied in a small amount even in a period during which the formation is not performed. In that case, the pressure of the deposition chamber can be kept high; thus, counter flow of impurities from the vacuum pump or the like can be reduced. Release of impurities from a pipe, another member, or the like can be suppressed. Accordingly, entry of impurities into the oxide layer 106a, the oxide semiconductor layer 106b, and the oxide layer 106c can be reduced. For example, the flow rate of argon is greater than or equal to 1 sccm and less than or equal to 500 sccm, preferably greater than or equal to 2 sccm and less than or equal to 200 sccm, further preferably greater than or equal to 5 sccm and less than or equal to 100 sccm.

Next, heat treatment is performed. The heat treatment is performed in an inert atmosphere or an oxidation atmosphere. The heat treatment may be performed under a reduced pressure. The heat treatment can decrease the impurity concentration of the oxide layer 106a, the oxide semiconductor layer 106b, and the oxide layer 106c.

The heat treatment is preferably performed in such a manner that heat treatment is performed in an inert atmosphere, and then the atmosphere is switched to an oxidation atmosphere with the temperature maintained, and heat treatment is further performed. When the heat treatment is performed in an inert atmosphere, the concentration of impurities in the oxide layer 106a, the oxide semiconductor layer 106b, and the oxide layer 106c can be reduced; however, oxygen vacancies are caused at the same time in some cases. By the heat treatment in an oxidation atmosphere, the caused oxygen vacancies can be reduced.

The concentration of hydrogen in each of the oxide layer 106a, the oxide semiconductor layer 106b, and the oxide layer 106c that are obtained in this manner, which is measured by SIMS, is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

The concentration of carbon in each of the oxide layer 106a, the oxide semiconductor layer 106b, and the oxide layer 106c, which is measured by SIMS, is set to be lower than $5 \times 10^{19}$ atoms/cm$^3$, preferably lower than or equal to $5 \times 10^{18}$ atoms/cm$^3$, further preferably lower than or equal to $2 \times 10^{18}$ atoms/cm$^3$, still further preferably lower than or equal to $5 \times 10^{17}$ atoms/cm$^3$.

The oxide layer 106a, the oxide semiconductor layer 106b, and the oxide layer 106c are formed as described above, whereby the crystallinity of the oxide semiconductor layer 106b can be improved, and the concentrations of impurities in the oxide layer 106a, the oxide semiconductor layer 106b, and the oxide layer 106c and at the interface between the oxide layer 106a and the oxide semiconductor layer 106b and the interface between the oxide semiconductor layer 106b and the oxide layer 106c can be reduced.

<Transistor Structure (2)>

Next, a top-gate and top-contact transistor having a structure different from that of the transistor structure (1) is described as an example.

Figure 7A:
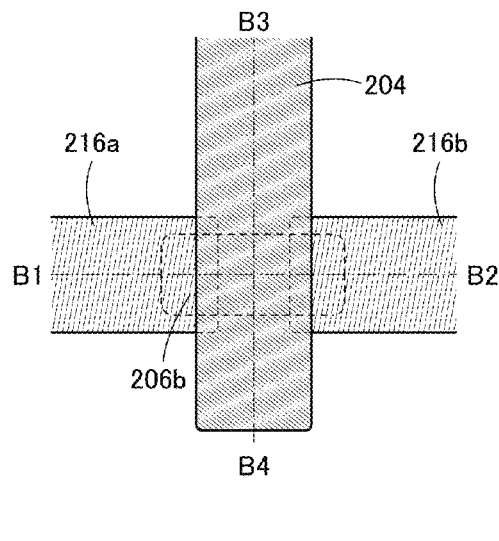
FIGS. 7A to 7C are a top view and cross-sectional views illustrating an example of a transistor in accordance with one embodiment of the present invention.
Figure 7C:
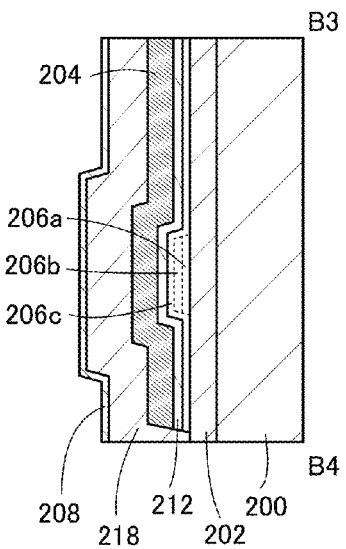
Figure 7B:
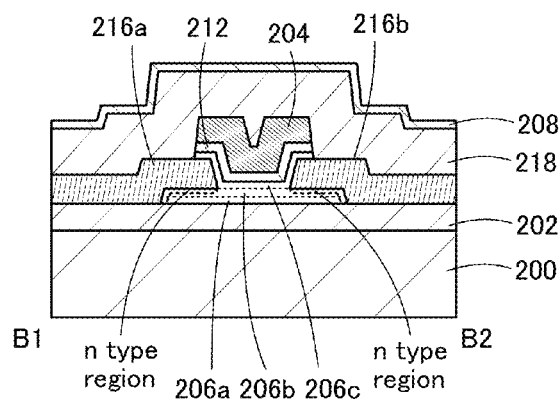

FIGS. 7A to 7C are a top view and cross-sectional views of the transistor. FIG. 7A is a top view of the transistor. FIG. 7B is the cross-sectional view taken along dashed-dotted line B1-B2 in FIG. 7A. FIG. 7C is the cross-sectional view taken along dashed-dotted line B3-B4 in FIG. 7A.

The transistor illustrated in FIG. 7B includes a base insulating film 202 over a substrate 200, an oxide layer 206a over the base insulating film 202, an oxide semiconductor layer 206b over the oxide layer 206a, a source electrode 216a and a drain electrode 216b in contact with the oxide semiconductor layer 206b, an oxide layer 206c over the oxide semiconductor layer 206b and the source electrode 216a and the drain electrode 216b, a gate insulating film 212 over the oxide layer 206c, and a gate electrode 204 over the gate insulating film 212. Note that it is preferable to provide a protective insulating film 218 over the gate insulating film 212 and the gate electrode 204 and provide a protective insulating film 208 over the protective insulating film 218. Note that the transistor does not necessarily include the base insulating film 202.

The base insulating film 202 of the transistor illustrated in FIGS. 7A to 7C corresponds to the gate insulating film (bg) of the transistor in FIG. 1A. The transistor illustrated in FIGS. 7A to 7C may have, for example, the gate electrode (bg) of the transistor in FIG. 1A. The transistor illustrated in FIGS. 7A to 7C may have, for example, a back gate electrode that is opposite to the gate electrode 204 and in contact with the bottom surface of the base insulating film 202. In addition, in the transistor illustrated in FIGS. 7A to 7C, when the substrate 200 has a conductivity, the substrate 200 can correspond to the gate insulating film (bg) of the transistor in FIG. 1A, for example. In addition, in the transistor illustrated in FIGS. 7A to 7C, when a conductive film of a wiring or the like is located below the base insulating film 202, the conductive film can correspond to the gate insulating film (bg) of the transistor in FIG. 1A.

In the example illustrated in FIGS. 7A to 7C, the gate electrode 204, the gate insulating film 212, and the oxide layer 206c have substantially the same top shape (shapes in the top view illustrated), but the present invention is not limited to the example. For example, the oxide layer 206c and/or the gate insulating film 212 may be provided outside the gate electrode 204.

Note that a conductive film used for the source electrode 216a and the drain electrode 216b takes oxygen away from part of the oxide semiconductor layer 206b or forms a mixed layer depending on its kind, which results in formation of n-type regions in the oxide semiconductor layer 206b.

Note that as illustrated in the top view of FIG. 7A, part of the oxide semiconductor layer 206b is provided outside the gate electrode 204. However, the oxide semiconductor layer 206b may be provided inside the gate electrode 204. With such a structure, when light irradiation is performed from the gate electrode 204 side, generation of carriers in the oxide semiconductor layer 206b due to light can be suppressed. In other words, the gate electrode 204 functions as a light-blocking film.

The positions of the protective insulating film 218 and the protective insulating film 208 may be reversed. For example, the protective insulating film 218 may be provided over the protective insulating film 208.

The description of the oxide layer 106a, the oxide semiconductor layer 106b, and the oxide layer 106c can be referred to for the description of the oxide layer 206a, the oxide semiconductor layer 206b, and the oxide layer 206c. For the base insulating film 202, the description of the base insulating film 102 is referred to. For the source electrode 216a and the drain electrode 216b, the description of the source electrode 116a and the drain electrode 116b is referred to. For the gate insulating film 212, the description of the gate insulating film 112 is referred to. For the gate electrode 204, the description of the gate electrode 104 is referred to. For the protective insulating film 218, the description of the protective insulating film 118 is referred to. For the protective insulating film 208, the description of the protective insulating film 108 is referred to. For the substrate 200, the description of the substrate 100 is referred to.

<Manufacturing Method of Transistor Structure (2)>

An example of a manufacturing method of the transistor structure (2) is described below.

FIGS. 8A to 8D and FIGS. 9A to 9D are cross-sectional views corresponding to FIG. 7B.

First, the substrate 200 is prepared.

Next, the base insulating film 202 is formed. For the base insulating film 202, refer to the description of the method for forming the base insulating film 102.

Figure 8A:
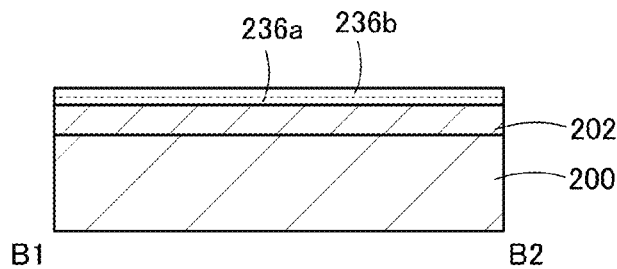
FIGS. 8A to 8D are cross-sectional views illustrating an example of a method for manufacturing a transistor in accordance with one embodiment of the present invention.

Next, the oxide layer 236a and the oxide semiconductor layer 236b are formed in this order (see FIG. 8A). For the formation methods of the oxide layer 236a and the oxide semiconductor layer 236b, the description of the oxide layer 136a and the oxide semiconductor layer 136b is referred to.

Next, first heat treatment is preferably performed. For the first heat treatment, the description of the manufacturing method of the transistor structure (1) is referred to.

Figure 8B:
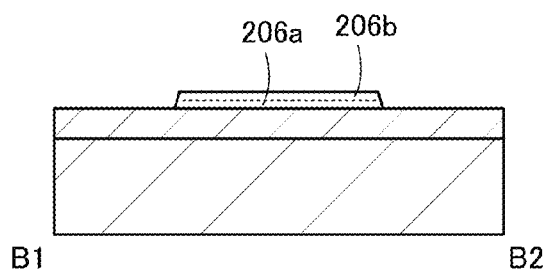

Then, the oxide layer 236a and the oxide semiconductor layer 236b are partially etched to form the oxide layer 206a and the oxide semiconductor layer 206b that have an island-shape (see FIG. 8B).

Figure 8C:
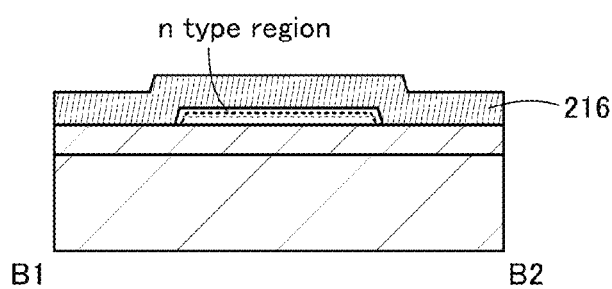
Figure 8D:
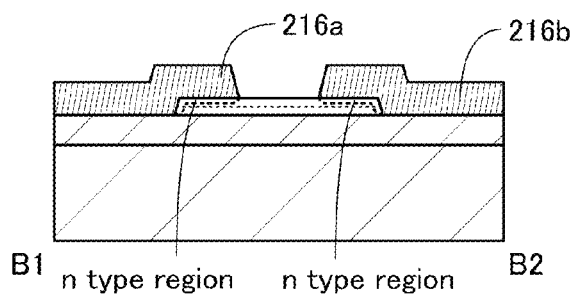

Next, a conductive film 216 is formed (see FIG. 8C). The formation method of the conductive film 116 can be referred to for the formation method of the conductive film 216.

Next, the conductive film 216 is partly etched to form the source electrode 216a and the drain electrode 216b.

Then, second heat treatment is preferably performed. Description made on the manufacturing method of the transistor structure (1) can be referred to for the second heat treatment. By the second heat treatment, the n-type region in the oxide semiconductor layer 206b that is exposed can be turned into an i-type region in some cases (see FIG. 8D).

Figure 9A:
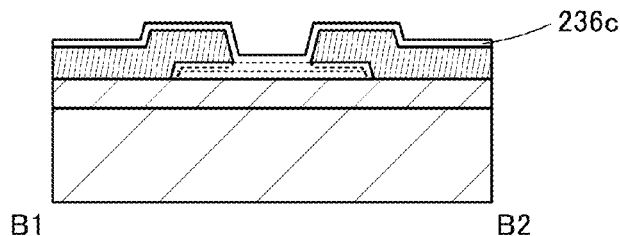
FIGS. 9A to 9D are cross-sectional views illustrating an example of a method for manufacturing a transistor in accordance with one embodiment of the present invention.

Then, an oxide semiconductor layer 236c is formed (see FIG. 9A). For the formation method of the oxide layer 236c, the description of the oxide layer 136c is referred to.

Next, an insulating film 242 is formed. For the formation method of the insulating film 242, the description of the gate insulating film 112 is referred to.

The insulating film 242 can be formed by a plasma CVD method, for example. By the CVD method, a denser insulating film having a lower density of defects can be provided as a substrate temperature is higher. Because the insulating film 242 after being processed serves as the gate insulating film 212, a transistor can have more stable electric characteristics, as the insulating film 242 is denser and has a lower density of defects. On the other hand, when the base insulating film 202 contains excess oxygen, a transistor can have stable electric characteristics. However, by raising the substrate temperature when the base insulating film 202 is exposed, oxygen is released from the base insulating film 202, so that excess oxygen is reduced. Here, because the base insulating film 202 is covered with the oxide layer 236c at the time of formation of the insulating film 242, oxygen can be prevented from being released from the base insulating film 202. Therefore, the insulating film 242 can be dense and have a low density of defects, without reducing excess oxygen contained in the base insulating film 202. For this reason, the reliability of the transistor can be improved.

Figure 9B:
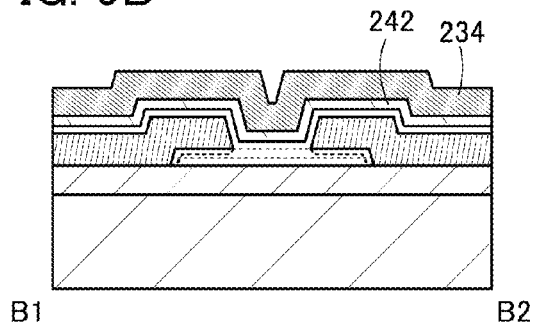

Next, a conductive film 234 is formed (see FIG. 9B). For the formation method of the conductive film 234, the description of the conductive film to be the gate electrode 104 is referred to.

Figure 9C:
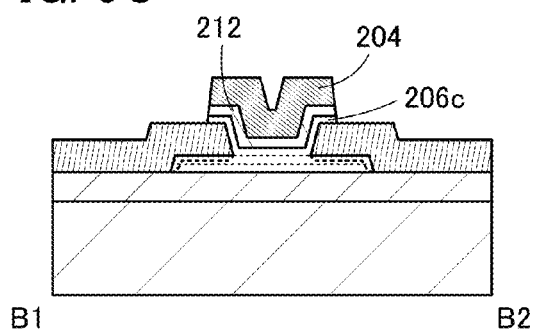

Then, the oxide layer 236c, the insulating film 242, and the conductive film 234 are partially etched to form the oxide layer 206c, the gate insulating film 212, and the gate electrode 204 (see FIG. 9C).

Next, the protective insulating film 218 is formed. For the formation method of the protective insulating film 218, the description of the protective insulating film 118 is referred to.

Figure 9D:
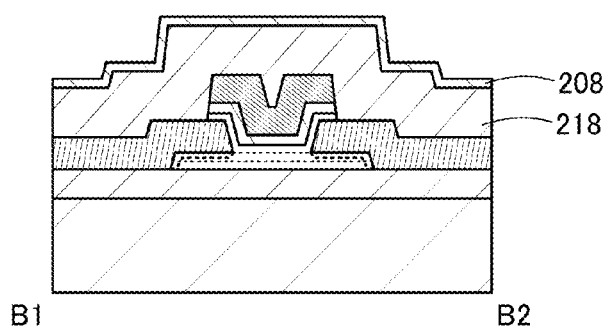

Next, the protective insulating film 208 is formed (see FIG. 9D). For the formation method of the protective insulating film 208, the description of the protective insulating film 108 is referred to.

Next, third heat treatment is preferably performed. For the third heat treatment, the description of the manufacturing method of the transistor structure (1) is referred to.

Through the above steps, the transistor illustrated in FIGS. 7A to 7C can be fabricated.

<Transistor Structure (3)>

Next, an example of a bottom-gate top-contact transistor is described.

Figure 10A:
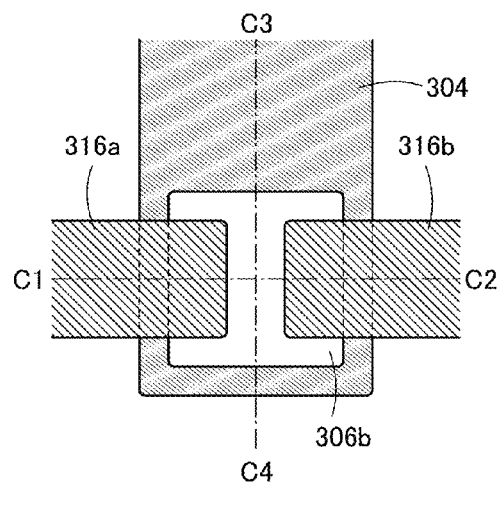
FIGS. 10A to 10D are a top view and cross-sectional views illustrating an example of a transistor in accordance with one embodiment of the present invention.
Figure 10C:
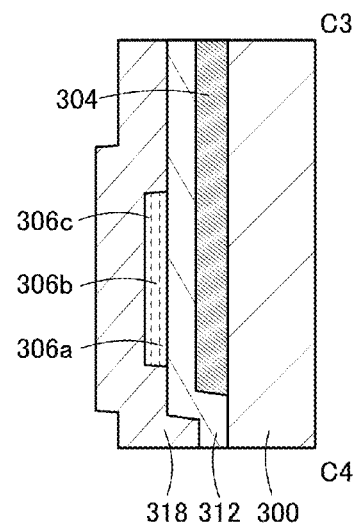
Figure 10B:
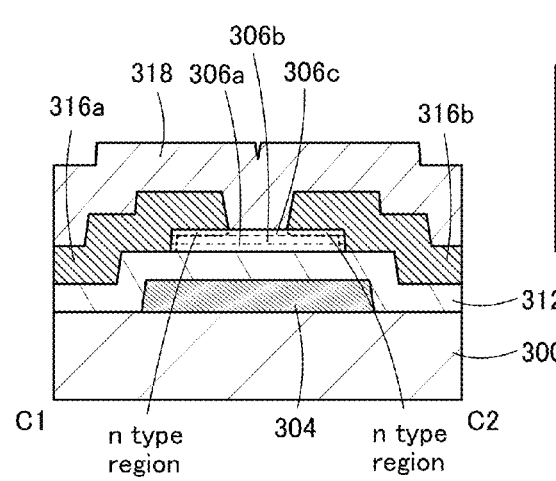

FIGS. 10A to 10D are a top view and cross-sectional views of the transistor. FIG. 10A is a top view of the transistor. FIG. 10B is the cross-sectional view taken along dashed-dotted line C1-C2 in FIG. 10A. FIG. 10C is the cross-sectional view taken along dashed-dotted line C3-C4 in FIG. 10A.

The transistor illustrated in FIG. 10B includes a gate electrode 304 over a substrate 300, a gate insulating film 312 over the gate electrode 304, an oxide layer 306a over the gate insulating film 312, an oxide semiconductor layer 306b over the oxide layer 306a, an oxide layer 306c over the oxide semiconductor layer 306b, and a source electrode 316a and a drain electrode 316b in contact with the oxide layer 306c. Note that it is preferable to provide a protective insulating film 318 over the oxide layer 306c, and the source electrode 316a and the drain electrode 316b.

The protective insulating film 318 of the transistor illustrated in FIGS. 10A to 10D corresponds to, for example, the gate insulating film (bg) of the transistor illustrated in FIG. 1A. The transistor illustrated in FIGS. 10A to 10D may have, for example, the gate electrode (bg) of the transistor in FIG. 1A. The transistor illustrated in FIGS. 10A to 10D may have, for example, a back gate electrode in contact with the top surface of the protective insulating film 318, facing with the gate electrode 304. In addition, in the transistor illustrated in FIGS. 10A to 10D, when a conductive film of a wiring or the like is located above the protective insulating film 318, the conductive film can correspond to the gate insulating film (bg) of the transistor in FIG. 1A.

Note that a conductive film used for the source electrode 316a and the drain electrode 316b takes oxygen away from part of the oxide semiconductor layer 306b and the oxide layer 306c or forms a mixed layer depending on its kind, which results in formation of n-type regions (low-resistance regions) in the oxide semiconductor layer 306b and the oxide layer 306c.

Note that as illustrated in FIG. 10A, the gate electrode 304 is provided such that the whole the oxide semiconductor layer 306b is located inside the gate electrode 304 in the top view. With such a structure, when light irradiation is performed from the gate electrode 304 side, generation of carriers in the oxide semiconductor layer 306b due to light can be suppressed. In other words, the gate electrode 304 functions as a light-blocking film. Note that the oxide semiconductor layer 306b may be provided outside the gate electrode 304.

The descriptions of the oxide layer 106c, the oxide semiconductor layer 106b, and the oxide layer 106a can be referred to for the oxide layer 306a, the oxide semiconductor layer 306b, and the oxide layer 306c. In other words, the bottom-gate and top-contact transistor has a reverse stacked structure of the top-gate and top-contact transistor.

The protective insulating film 318 may be formed to have a single-layer structure or a stacked-layer structure using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The protective insulating film 318 may be, for example, a multilayer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon nitride layer, a silicon nitride layer from which a hydrogen gas and an ammonia gas are less likely to be released is used. The amount of released hydrogen gas or ammonia gas may be measured by TDS. Further, as the silicon nitride layer, a silicon nitride layer which does not transmit or hardly transmits hydrogen, water, and oxygen is used.

Figure 10D:
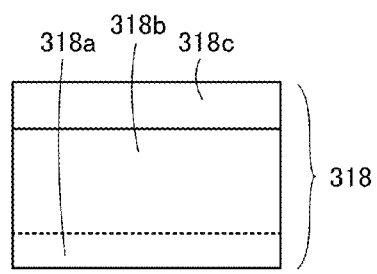

Alternatively, the protective insulating film 318 may be, for example, a multilayer film including a first silicon oxide layer 318a as a first layer, a second silicon oxide layer 318b as a second layer, and a silicon nitride layer 318c as a third layer (see FIG. 10D). In that case, the first silicon oxide layer 318a and/or the second silicon oxide layer 318b may be a silicon oxynitride layer. In addition, the silicon nitride layer may be a silicon nitride oxide layer. As the first silicon oxide layer 318a, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide layer 318b, a silicon oxide layer containing excess oxygen is used. As the silicon nitride layer 318c, a silicon nitride layer from which a hydrogen gas and an ammonia gas are less likely to be released is used. Further, as the silicon nitride layer 318c, a silicon nitride layer which does not transmit or hardly transmits hydrogen, water, and oxygen is used.

The silicon oxide layer containing excess oxygen means a silicon oxide layer from which oxygen can be released by heat treatment or the like. An insulating film containing excess oxygen means an insulating film from which oxygen is released by heat treatment.

The insulating film containing excess oxygen is capable of reducing oxygen vacancies in the oxide semiconductor layer 306b. The oxygen vacancies form defect states in the oxide semiconductor layer 306b, and some of the defect states become donor states. Thus, by reducing the oxygen vacancies in the oxide semiconductor layer 306b, the transistor can have stable electrical characteristics.

For the source electrode 316a and the drain electrode 316b, the description of the source electrode 116a and the drain electrode 116b is referred to. For the gate insulating film 312, the description of the gate insulating film 112 is referred to. For the gate electrode 304, the description of the gate electrode 104 is referred to. For the substrate 300, the description of the substrate 100 is referred to.

Note that an example of a method for manufacturing the transistor illustrated in FIGS. 10A to 10D is briefly described.

First, the gate electrode 304 is formed over the substrate 300. Next, the gate insulating film 312 is formed over the gate electrode 304. Then, the oxide layer 306a, the oxide semiconductor layer 306b, and the oxide layer 306c are formed over the gate insulating film 312 in this order. After that, the source electrode 316a and the drain electrode 316b are formed over the oxide layer 306c. Subsequently, the protective insulating film 318 is formed over the oxide layer 306c, the source electrode 316a, and the drain electrode 316b. Thus, the transistor illustrated in FIGS. 10A to 10D may be manufactured.

Note that heat treatment may be performed at any of the following timings: after formation of the oxide layer 306a, the oxide semiconductor layer 306b, and the oxide layer 306c; after formation of the source electrode 316a and the drain electrode 316b; after formation of the protective insulating film 318; and the like. Description made on the manufacturing method of the transistor structure (1) can be referred to for the conditions for the heat treatment.

<Application Product>

Application products using the above transistor are described below.

<Microcomputer>

The transistor described above can be applied to microcomputers which are mounted on variety of electronic appliances.

A structure and operation of a fire alarm that is an example of the electronic appliance using a microcomputer are described with reference to FIG. 21 and FIGS. 22A and 22B.

A fire alarm in this specification refers to any device which raises an alarm over fire occurrence instantly, and for example, a residential fire alarm, an automatic fire alarm system, and a fire detector used for the automatic fire alarm system are included in its category.

Figure 21:
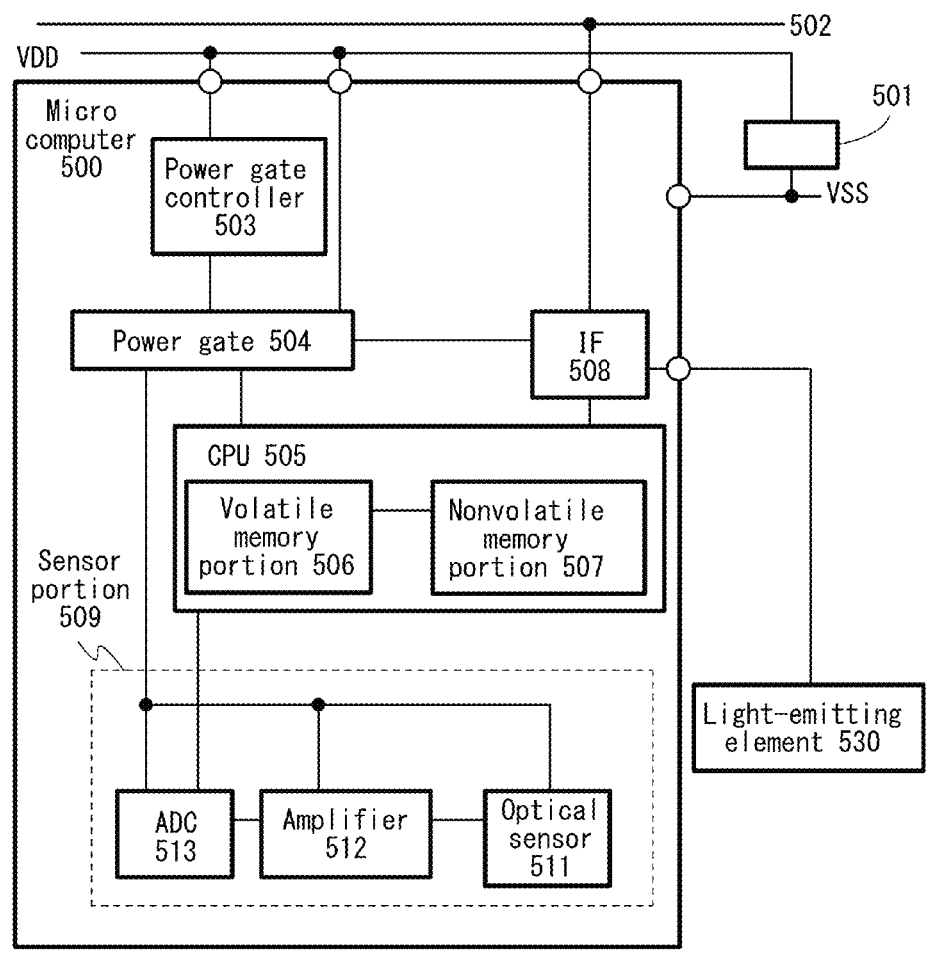
FIG. 21 is a block diagram illustrating an example of a semiconductor device in accordance with one embodiment of the present invention.

An alarm device illustrated in FIG. 21 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a CPU (central processing unit) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 are electrically connected to the power gate 504. As a bus standard of the interface 508, an I²C bus can be used, for example. A light-emitting element 530 electrically connected to the power gate 504 through the interface 508 is provided in the alarm device.

The light-emitting element 530 is preferably an element which emits light with high directivity, and for example, an organic EL element, an inorganic EL element, or an LED can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby a reduction in power consumption of the alarm device can be achieved compared with that of the case where power is continuously supplied to the above structures.

In the case where a transistor is used as the power gate 504, it is preferable to use a transistor which has an extremely low off-state current and is used for the nonvolatile memory portion 507, for example, the above transistor which includes an oxide semiconductor layer. With the use of such a transistor, a leakage current can be reduced when supply of power is stopped by the power gate 504, so that a reduction in power consumption of the alarm device can be achieved.

A direct-current power source 501 may be provided in the alarm device so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case including an electrode electrically connected to the high potential power supply line VDD, an electrode electrically connected to the low potential power supply line VSS, and a housing which can hold the battery is provided in a housing. Note that the alarm device does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided so that the secondary battery can be charged.

The sensor portion 509 measures a physical quantity relating to an abnormal situation and transmits a measurement value to the CPU 505. A physical quantity relating to an abnormal situation depends on the usage of the alarm device, and in an alarm device functioning as a fire alarm, a physical quantity relating to a fire is measured. Accordingly, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

Figure 22A:
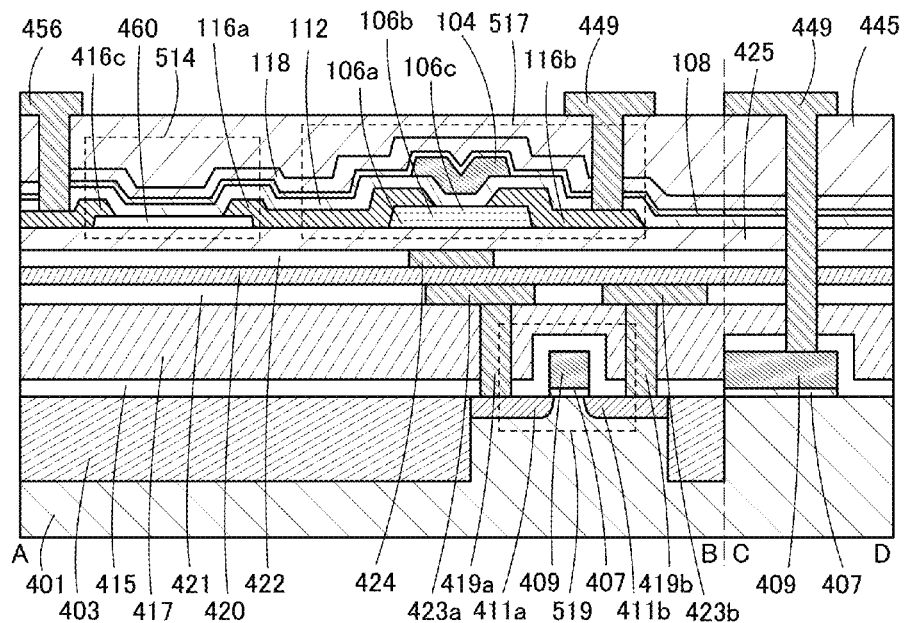
FIGS. 22A and 22B are a cross-sectional view and a circuit diagram illustrating an example of a semiconductor device in accordance with one embodiment of the present invention.

FIG. 22A illustrates part of the cross section of the alarm device. In the cross-sectional view of FIG. 22A, the cross section taken along A-B in the channel length direction and the cross section taken along C-D perpendicular to the channel length direction are illustrated. Element isolation regions 403 are formed in a p-type semiconductor substrate 401, and a transistor 519 including a gate insulating film 407, a gate electrode 409, n-type impurity regions 411a and 411b, an insulating film 415, and an insulating film 417 is formed. Here, the transistor 519 is formed using a semiconductor such as single crystal silicon, so that the transistor 519 can operate at high speed. Accordingly, a volatile memory portion of a CPU that can achieve high-speed access can be formed.

In addition, contact plugs 419a and 419b are formed in openings which are formed by partly etching the insulating films 415 and 417, and an insulating film 421 having groove portions is formed over the insulating film 417 and the contact plugs 419a and 419b. Wirings 423a and 423b are formed in the groove portions of the insulating film 421. An insulating film 420 is formed over the insulating film 421 and the wirings 423a and 423b by a sputtering method, a CVD method, or the like, and an insulating film 422 having a groove portion is formed over the insulating film 420. An electrode 424 is formed in the groove portion of the insulating film 422. The electrode 424 functions as a back gate electrode of a transistor 517. The electrode 424 can control the threshold voltage of the transistor 517.

Moreover, an insulating film 425 is formed over the insulating film 422 and the electrode 424 by a sputtering method, a CVD method, or the like.

The transistor 517 and a photoelectric conversion element 514 are provided over the insulating film 425. The transistor 517 includes an oxide layer 106a, an oxide semiconductor layer 106b, and an oxide layer 106c; a source electrode 116a and a drain electrode 116b; a gate insulating film 112; a gate electrode 104; a protective insulating film 108; and a protective insulating film 118. Moreover, an insulating film 445 cover the photoelectric conversion element 514 and the transistor 517, and a wiring 449 is formed over the insulating film 445 and so as to be in contact with the drain electrode 116b. The wiring 449 electrically connects the drain electrode 116b of the transistor 517 to the gate electrode 409 of the transistor 519.

Figure 22B:
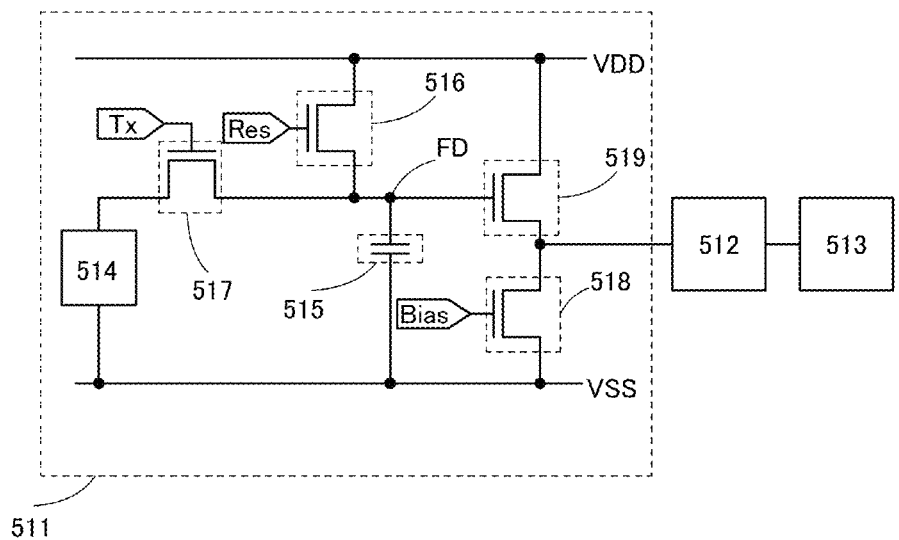

FIG. 22B is a circuit diagram of a detection portion. The detection portion includes the optical sensor 511, the amplifier 512, and the AD converter 513. The optical sensor 511 includes the photoelectric conversion element 514, a capacitor 515, a transistor 516, the transistor 517, a transistor 518, and the transistor 519. As the photoelectric conversion element 514, a photodiode can be used here, for example.

One of terminals of the photoelectric conversion element 514 is electrically connected to the low potential power supply line VSS, and the other of the terminals thereof is electrically connected to one of the source electrode and the drain electrode of the transistor 517. The gate electrode of the transistor 517 is supplied with an electric charge accumulation control signal Tx, and the other of the source electrode and the drain electrode thereof is electrically connected to one of a pair of electrodes of the capacitor 515, one of a source electrode and a drain electrode of the transistor 516, and the gate electrode of the transistor 519 (hereinafter the node is referred to as a node FD in some cases). The other of the pair of electrodes of the capacitor 515 is electrically connected to the low potential power supply line VSS. A gate electrode of the transistor 516 is supplied with a reset signal Res, and the other of the source electrode and the drain electrode thereof is electrically connected to the high potential power supply line VDD. One of a source electrode and a drain electrode of the transistor 519 is electrically connected to one of a source electrode and a drain electrode of the transistor 518 and the amplifier 512. The other of the source electrode and the drain electrode of the transistor 519 is electrically connected to the high potential power supply line VDD. A gate electrode of the transistor 518 is supplied with a bias signal Bias, and the other of the source electrode and the drain electrode thereof is electrically connected to the low potential power supply line VSS.

Note that the capacitor 515 is not necessarily provided. For example, in the case where parasitic capacitance of the transistor 519 or the like is sufficiently large, a structure without the capacitor may be employed.

Further, as each of the transistor 516 and the transistor 517, the transistor having an extremely low off-state current is preferably used. As the transistor having an extremely low off-state current, the above transistor is preferably used. With such a structure, the potential of the node FD can be held for a long time.

In the structure in FIG. 22A, the photoelectric conversion element 514 is electrically connected to the transistor 517 and is provided over the insulating film 425.

The photoelectric conversion element 514 includes a semiconductor film 460 provided over the insulating film 425, and the source electrode 116a and an electrode 416c which are in contact with a top surface of the semiconductor film 460. The source electrode 116a is an electrode functioning as the source electrode or the drain electrode of the transistor 517 and electrically connects the photoelectric conversion element 514 to the transistor 517.

Over the semiconductor film 460, the source electrode 116a, and the electrode 416c, the gate insulating film 112, the protective insulating film 108, the protective insulating film 118, and the insulating film 445 are provided. Further, a wiring 456 is provided over the insulating film 445 and is in contact with the electrode 416c through an opening provided in the gate insulating film 112, the protective insulating film 108, the protective insulating film 118, and the insulating film 445.

The electrode 416c can be formed in steps similar to those of the source electrode 116a and the drain electrode 116b, and the wiring 456 can be formed in steps similar to those of the wiring 449.

As the semiconductor film 460, a semiconductor film which can perform photoelectric conversion is provided, and for example, silicon or germanium can be used. In the case of using silicon, the semiconductor film 460 functions as an optical sensor which senses visible light. Further, there is a difference, between silicon and germanium, in wavelengths of electromagnetic waves that can be absorbed. When the semiconductor film 460 includes germanium, a sensor which mainly senses an infrared ray can be obtained.

In the above manner, the sensor portion 509 including the optical sensor 511 can be incorporated into the microcomputer 500, so that the number of components can be reduced and the size of the housing of the alarm device can be reduced.

In the fire alarm including the above-described IC chip, the CPU 505 in which a plurality of circuits including any of the above transistors are combined and mounted on one IC chip is used.

<CPU>

Figure 23A:
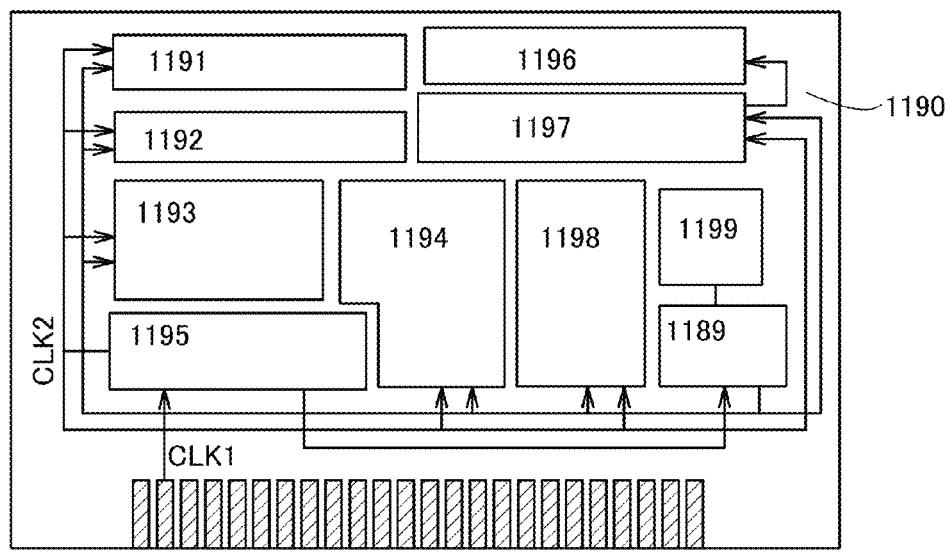
FIGS. 23A to 23C are block diagrams illustrating an example of a CPU in accordance with one embodiment of the present invention.
Figure 23B:
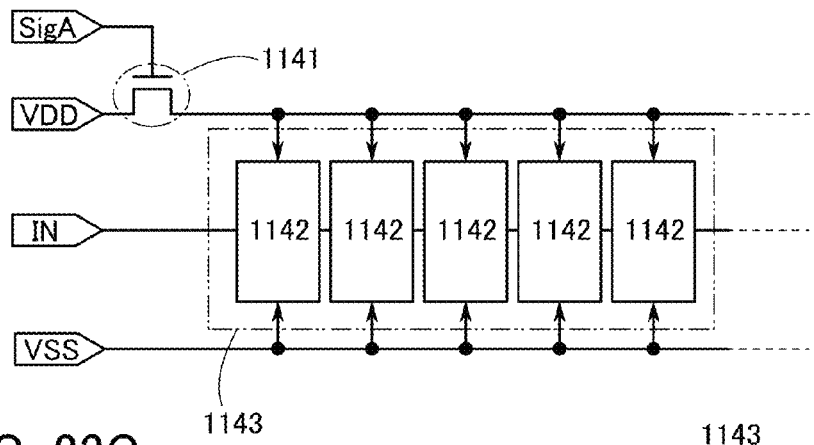
Figure 23C:
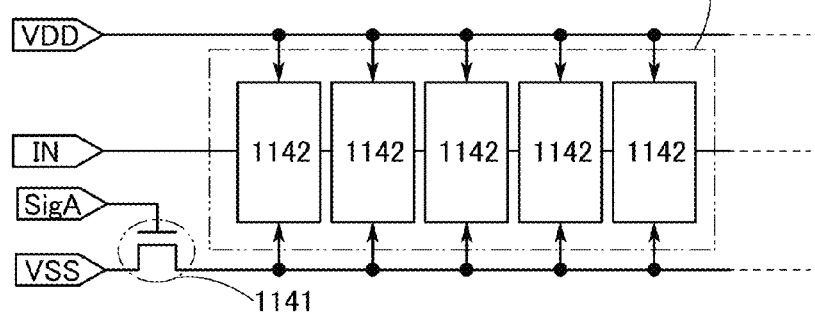

FIGS. 23A to 23C are block diagrams illustrating a specific configuration of a CPU at least partly including any of the above transistors.

The CPU illustrated in FIG. 23A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 23A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 23A, a memory cell is provided in the register 1196. As the memory cell of the register 1196, any of the above transistors can be used.

In the CPU illustrated in FIG. 23A, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 23B or FIG. 23C. Circuits illustrated in FIGS. 23B and 23C are described below.

FIGS. 23B and 23C each illustrate a memory device in which any of the above transistors is used as a switching element which controls supply of a power supply potential to a memory cell.

The memory device illustrated in FIG. 23B includes a switching element 1141 and a memory cell group 1143 including a plurality of memory cells 1142. Specifically, as each of the memory cells 1142, any of the above transistors can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 23B, any of the above transistors is used as the switching element 1141, and the switching of the transistor is controlled by a signal SigA supplied to a gate electrode layer thereof.

Note that FIG. 23B illustrates the configuration in which the switching element 1141 includes only one transistor; however, one of embodiment of the present invention is not particularly limited to such configuration and the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 23B, the switching element 1141 may control the supply of the low-level power supply potential VSS.

In FIG. 23C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be retained even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, any of the above transistors can also be applied to an LSI such as a digital signal processor (DSP), a custom LSI, or a field programmable gate array (FPGA).

<Display Device>

In this section, a display device including any of the above transistors is described.

As a display element provided in the display device, a liquid crystal element (also referred to as a liquid crystal display element), a light-emitting element (also referred to as a light-emitting display element), or the like can be used. The light-emitting element includes, in its category, an element whose luminance is controlled by current or voltage, specifically an inorganic electroluminescent (EL) element, an organic EL element, and the like. Furthermore, a display medium whose contrast is changed by an electric effect, such as electronic ink or an electrophoretic element, can be used as the display element. A display device including an EL element and a display device including a liquid crystal element are described below as examples of the display device.

The display device described below includes in its category a panel in which a display element is sealed, and a module in which an IC such as a controller or the like is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

<EL Display Device>

First, a display device including an EL element (also referred to as an EL display device) is described.

Figure 25A:
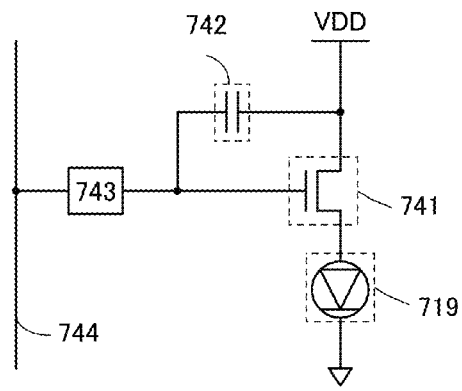
FIGS. 25A, 25B, and 25C are a circuit diagram, a top view, a cross-sectional view, respectively, illustrating an example of an EL display device in accordance with one embodiment of the present invention.

FIG. 25A is an example of the circuit diagram of a pixel of an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which a terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear and it can be determined in some cases that one embodiment of the present invention is disclosed in this specification and the like. Therefore, when a connection portion of a circuit is specified, the circuit is disclosed as one embodiment of the invention even when a function of the circuit is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device shown in FIG. 25A includes a switching element 743, a transistor 741, a capacitor 742, and a light-emitting element 719.

Note that FIG. 25A and the like each illustrate a circuit configuration example; thus, a transistor can be additionally provided. In each node in FIG. 25A, it is also possible not to provide an additional transistor, switch, passive element, or the like. For example, it is possible not to increase the number of transistors directly connected to the node A, the node B, the node C, the node D, the node E, the node F, and/or the node G. Accordingly, for example, the following structure can be used: only the transistor 741 is directly connected to the node C and the other transistors are not directly connected to the node C.

A gate of the transistor 741 is electrically connected to one terminal of the switching element 743 and one terminal of the capacitor 742. A source of the transistor 741 is electrically connected to the other terminal of the capacitor 742 and one terminal of the light-emitting element 719. A power supply potential VDD is supplied to a drain of the transistor 741. The other terminal of the switching element 743 is electrically connected to a signal line 744. A constant potential is supplied to the other terminal of the light-emitting element 719. The constant potential is a ground potential GND or a potential lower than the ground potential GND.

The above transistor including the oxide semiconductor layer is used as the transistor 741. The transistor has stable electrical characteristics. Accordingly, an EL display device having high display quality can be provided.

It is preferable to use a transistor as the switch element 743. When the transistor is used as the switching element, the area of a pixel can be reduced, so that the EL display device can have high resolution. Alternatively, the above transistor including the oxide semiconductor layer may be used as the switching element 743; accordingly, the switching element 743 can be formed by the same process as the transistor 741, which leads to an improvement in the productivity of the EL display device.

Figure 25B:
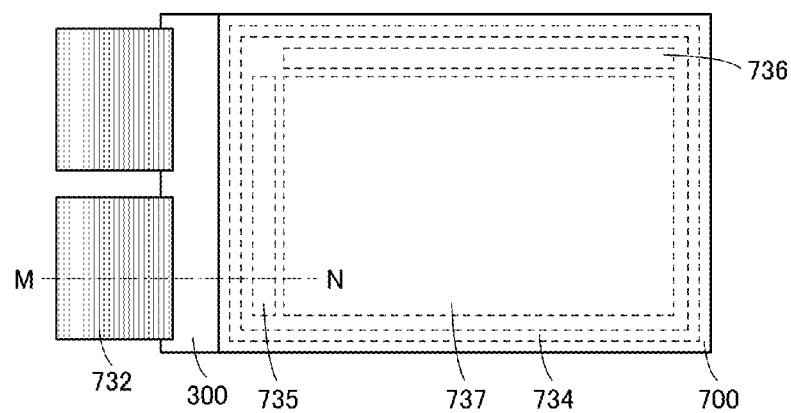

FIG. 25B is a top view of the EL display device. The EL display device includes a substrate 300, a substrate 700, a seal material 734, a driver circuit 735, a driver circuit 736, a pixel 737, and an FPC 732. The seal material 734 is provided between the substrate 300 and the substrate 700 so as to surround the pixel 737, the driver circuit 735, and the driver circuit 736. The driver circuit 735 and/or the driver circuit 736 may be provided outside the seal material 734.

Figure 25C:
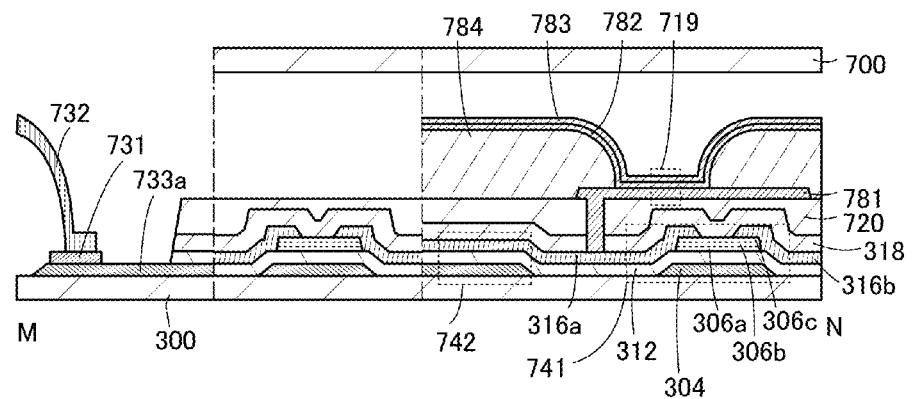

FIG. 25C is a cross-sectional view of the EL display device taken along dashed-dotted line M-N in FIG. 25B. The FPC 732 is connected to a wiring 733a through a terminal 731. The wiring 733a is formed in the same layer as the gate electrode 304.

FIG. 25C illustrates the example in which the transistor 741 and the capacitor 742 are provided in the same plane. With such a structure, the capacitor 742 can be formed in the same planes as the gate electrode, the gate insulating film, and the source (drain) electrode of the transistor 741. Such provision of the transistor 741 and the capacitor 742 in the same plane leads to shortening of the manufacturing process of the EL display device and an improvement of the productivity.

FIG. 25C illustrates the example in which a transistor having a structure similar to that of the transistor illustrated in FIGS. 10A to 10D is applied to the transistor 741.

The transistor illustrated in FIGS. 10A to 10D is a transistor with a small shift in threshold voltage. Accordingly, the transistor is preferred for EL display devices where gray scales are varied even with the small shift of the threshold voltage.

An insulating film 720 is provided over the transistor 741 and the capacitor 742. Here, an opening reaching the source electrode 316a of the transistor 741 is provided in the insulating film 720 and the protective insulating film 318.

An electrode 781 is provided over the insulating film 720. The electrode 781 is in contact with the source electrode 316a of the transistor 741 though the opening provided in the insulating film 720 and the protective insulating film 318.

Over the electrode 781, a bank 784 having an opening reaching the electrode 781 is provided. Over the bank 784, a light-emitting layer 782 in contact with the electrode 781 through the opening provided in the bank 784 is provided. An electrode 783 is provided over the light-emitting layer 782. A region where the electrode 781, the light-emitting layer 782, and the electrode 783 overlap with one another serves as the light-emitting element 719.

<Liquid Crystal Display Device>

Next, a display device including a liquid crystal element (also referred to as a liquid crystal display device) is described.

Figure 26A:
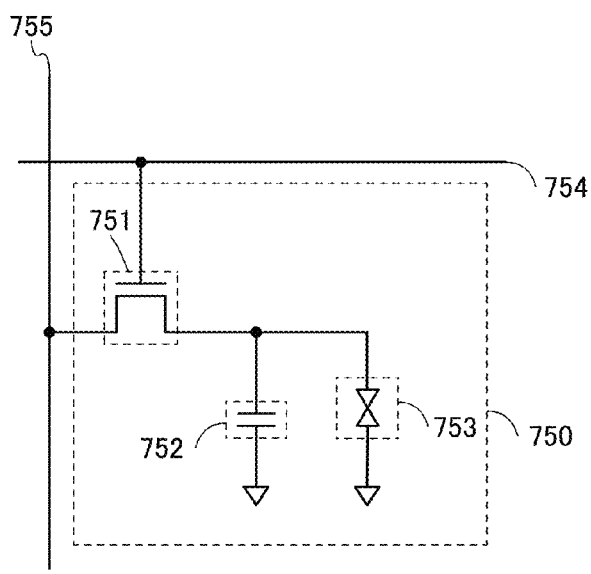
FIGS. 26A and 26B are a circuit diagram and a cross-sectional view, respectively, illustrating an example of a liquid crystal display device in accordance with one embodiment of the present invention.

FIG. 26A is a circuit diagram illustrating a configuration example of the pixel of a liquid crystal display device. A pixel 750 shown in FIG. 26A includes a transistor 751, a capacitor 752, and an element (hereinafter also referred to as liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the wiring electrically connected to the other electrode of the liquid crystal element 753.

Figure 26B:
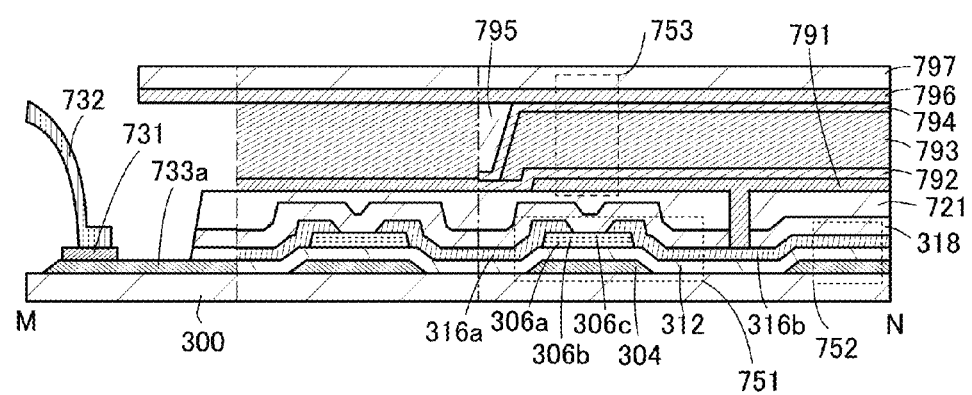

The top view of the liquid crystal display device is similar to that of the EL display device. A cross-sectional view of the liquid crystal display device taken along dashed-dotted line M-N in FIG. 25B is illustrated in FIG. 26B. In FIG. 26B, the FPC 732 is connected to the wiring 733a through the terminal 731. The wiring 733a is formed in the same layer as the gate electrode 304.

FIG. 26B illustrates the example in which the transistor 751 and the capacitor 752 are provided in the same plane. With such a structure, the capacitor 752 can be formed in the same planes as the gate electrode, the gate insulating film, and the source (drain) electrode of the transistor 751. Such provision of the transistor 751 and the capacitor 752 in the same plane leads to shortening of the manufacturing process of the liquid crystal display device and an improvement of the productivity.

Any of the above transistors can be applied to the transistor 751. FIG. 26B illustrates the example in which a transistor having a structure similar to that of the transistor illustrated in FIGS. 10A to 10D is applied to the transistor 751.

The off-state current of the transistor 751 can be made extremely small. Therefore, charge stored in the capacitor 752 is unlikely to leak, so that the voltage applied to the liquid crystal element 753 can be maintained for a long period. Accordingly, the transistor 751 can be kept off during a period in which moving images with few motions or a still image are/is displayed, whereby power for the operation of the transistor 751 can be saved in that period; accordingly a liquid crystal display device with low power consumption can be provided.

An insulating film 721 is provided over the transistor 751 and the capacitor 752. Here, an opening reaching the drain electrode 316b of the transistor 751 is provided in the insulating film 721 and the protective insulating film 318.

An electrode 791 is provided over the insulating film 721. The electrode 791 is in contact with the drain electrode 316b of the transistor 751 though the opening provided in the insulating film 721 and the protective insulating film 318.

An insulating film 792 which functions as an alignment film is provided over the electrode 791. A liquid crystal layer 793 is provided over the insulating film 792. An insulating film 794 which functions as an alignment film is provided over the liquid crystal layer 793. A spacer 795 is provided over the insulating film 794. An electrode 796 is provided over the spacer 795 and the insulating film 794. A substrate 797 is provided over the electrode 796.

<Installation Example>

Figure 24A:
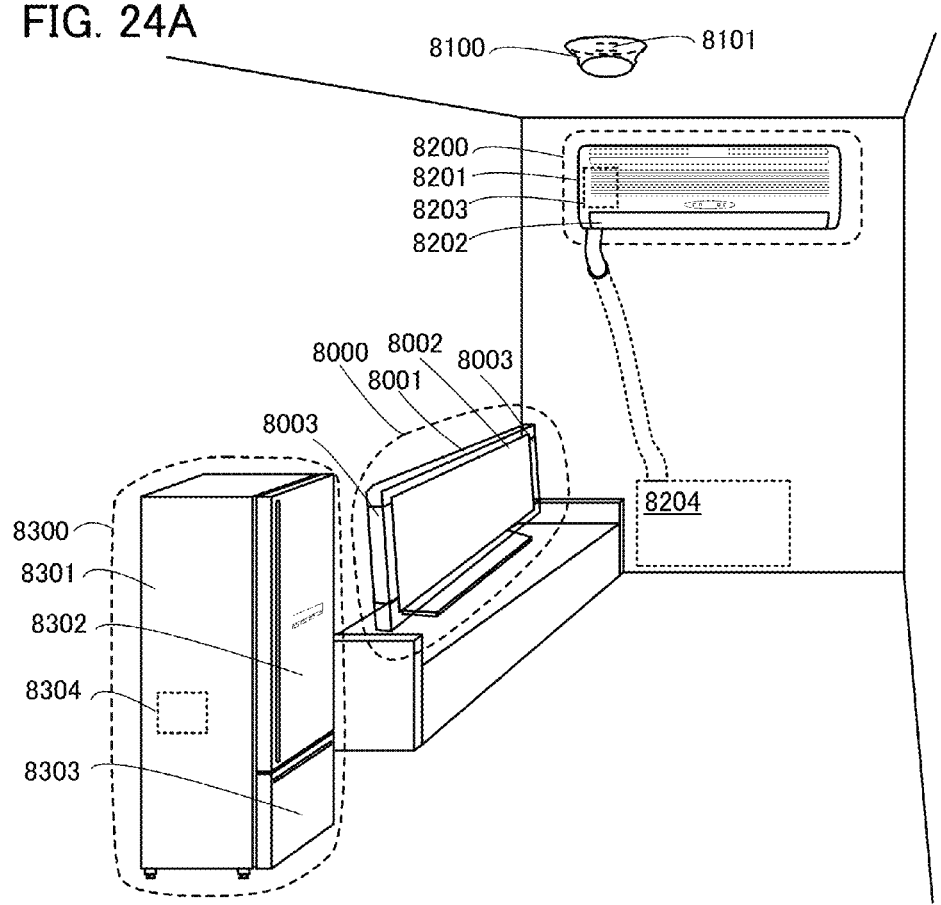
FIGS. 24A to 24C are diagrams illustrating examples of electronic appliances in accordance with one embodiment of the present invention.

In a television set 8000 in FIG. 24A, a display portion 8002 is incorporated in a housing 8001. The display portion 8002 displays an image and a speaker portion 8003 can output sound. The above display device can be used for the display portion 8002.

The television set 8000 may be provided with a receiver, a modem, and the like. With the receiver, the television set 8000 can receive general television broadcasting. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a memory or a CPU for performing information communication. The above memory or CPU can be used for the television set 8000.

In FIG. 24A, an alarm device 8100 is a residential fire alarm, which includes a sensor portion and a microcomputer 8101. Note that the microcomputer 8101 includes a CPU in which any of the above transistors is used.

In FIG. 24A, an air conditioner which includes an indoor unit 8200 and an outdoor unit 8204 includes the CPU in which any of the above transistors is used. Specifically, the indoor unit 8200 includes a housing 8201, an air outlet 8202, a CPU 8203, and the like. Although the CPU 8203 is provided in the indoor unit 8200 in FIG. 24A, the CPU 8203 may be provided in the outdoor unit 8204. Alternatively, the CPU 8203 may be provided in both the indoor unit 8200 and the outdoor unit 8204. When the air conditioner includes the CPU in which any of the above transistors is used, a reduction in power consumption of the air conditioner can be achieved.

In FIG. 24A, an electric refrigerator-freezer 8300 includes the CPU in which any of the above transistors is used. Specifically, the electric refrigerator-freezer 8300 includes a housing 8301, a door for a refrigerator 8302, a door for a freezer 8303, a CPU 8304, and the like. In FIG. 24A, the CPU 8304 is provided in the housing 8301. When the electric refrigerator-freezer 8300 includes the CPU 8304 in which any of the above transistors is used, a reduction in power consumption of the electric refrigerator-freezer 8300 can be achieved.

Figure 24B:
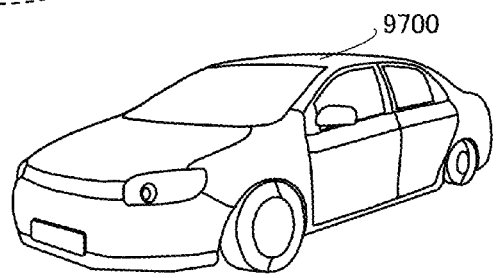
Figure 24C:
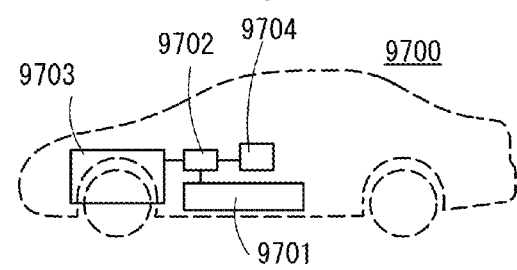

FIGS. 24B and 24C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the electric vehicle 9700 includes the CPU in which any of the above transistors is used, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment shows an example of a basic principle. Thus, part of this embodiment can be freely combined with, applied to, or replaced with another part of this embodiment.

Example 1

In this example, a transistor of one embodiment of the present invention was fabricated, and electric characteristics and variation in the electric characteristics of the transistor were evaluated.

As Example Sample 1 and Example Sample 2, transistors each having a structure similar to the transistor structure (2) were fabricated. The description for FIGS. 7A to 7C, FIGS. 8A to 8D, and FIGS. 9A to 9D can be referred to for the details of Example Samples 1 and 2.

In each of Example Samples 1 and 2, a silicon wafer was used as the substrate 200. As the base insulating film 202, a multilayer film in which a 100-nm-thick silicon oxide film and a 300-nm-thick silicon oxynitride film containing excess oxygen were stacked was used. As the source electrode 216a and the drain electrode 216b, a 100-nm-thick tungsten film was used. As the gate insulating film 212, a 20-nm-thick silicon oxynitride film was used. As the gate electrode 204, a multilayer film in which a 30-nm-thick tantalum nitride film and a 135-nm-thick tungsten film are stacked was used. As the protective insulating film 218, a 300-nm-thick silicon oxynitride film was used. As the protective insulating film 208, a 50-nm-thick silicon nitride film was used.

As the oxide semiconductor layer 206b, a 15-nm-thick In—Ga—Zn oxide film was used. The oxide semiconductor layer 206b was formed by a sputtering method under the following conditions: a target whose atomic ratio of In to Ga and Zn is 1:1:1 was used; a direct-current (DC) power of 0.5 kW was supplied; an argon gas at a flow rate of 30 sccm and an oxygen gas at a flow rate of 15 sccm were used as a deposition gas; the pressure was 0.4 Pa; and the substrate temperature was 300° C.

As the oxide layer 206c, a 5-nm-thick In—Ga—Zn oxide film was used. The oxide layer 206c was formed by a sputtering method under the following conditions: a target whose atomic ratio of In to Ga and Zn is 1:3:2 was used; a direct-current (DC) power of 0.5 kW was supplied; an argon gas at a flow rate of 30 sccm and an oxygen gas at a flow rate of 15 sccm were used as a deposition gas; the pressure was 0.4 Pa; and the substrate temperature was 200° C.

Here, in Example Sample 1, a 20-nm-thick In—Ga—Zn oxide film was used as the oxide layer 206a. The oxide layer 206a was formed by a sputtering method under the following conditions: a target whose atomic ratio of In to Ga and Zn is 1:3:2 was used; a direct-current (DC) power of 0.5 kW was supplied; an argon gas at a flow rate of 30 sccm and an oxygen gas at a flow rate of 15 sccm were used as a deposition gas; the pressure was 0.4 Pa; and the substrate temperature was 200° C.

In Example Sample 2, a 40-nm-thick In—Ga—Zn oxide film was used as the oxide layer 206a. The oxide layer 206a was formed by a sputtering method under the following conditions: a target whose atomic ratio of In to Ga and Zn is 1:3:2 was used; a direct-current (DC) power of 0.5 kW was supplied; an argon gas at a flow rate of 30 sccm and an oxygen gas at a flow rate of 15 sccm were used as a deposition gas; the pressure was 0.4 Pa; and the substrate temperature was 200° C.

Characteristics between the gate voltage (Vg) and the drain current (Id) (hereinafter $V_g$-$I_d$ characteristics) of Example Samples 1 and 2 were measured. The measurement of the $V_g$-$I_d$ characteristics was performed by measuring drain current (Id) when the drain voltage (Vd) was set to 0.1 V or 3 V and the gate voltage (Vg) was swept in the range of −3 V to +3 V. Note that the field-effect mobilities ($\mu_{FE}$) of the transistors with the drain voltage (Vd) of 0.1 V are represented by the right axis of FIGS. 27A and 27B, FIGS. 28A and 28B, FIGS. 29A and 29B, and FIGS. 30A and 30B.

Figure 27A:
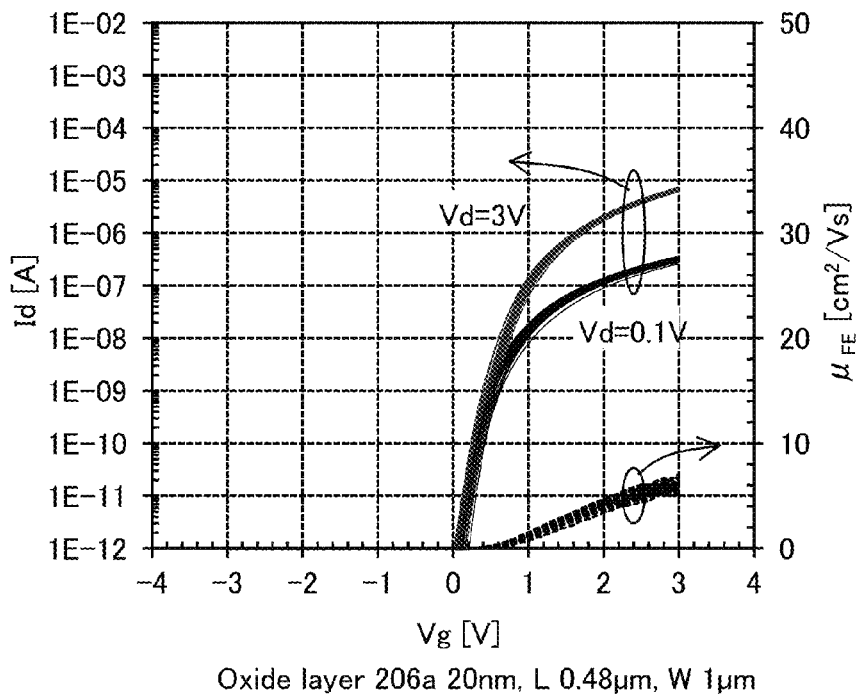
FIGS. 27A and 27B each show the $V_g$-$I_d$ characteristics of a transistor.
Figure 27B:
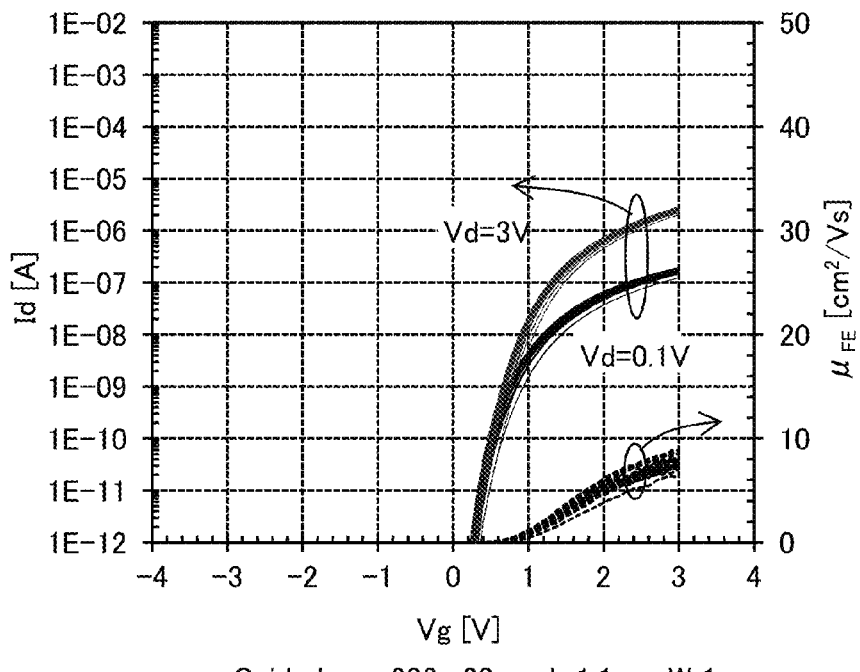

In FIGS. 27A and 27B, 25 points of the $V_g$-$I_d$ characteristics of Example Sample 1 are shown together. Note that FIG. 27A shows the $V_g$-$I_d$ characteristics of a transistor having a channel length (L) of 0.48 μm and a channel width of 1 μm. FIG. 27B shows the $V_g$-$I_d$ characteristics of a transistor having a channel length (L) of 1.1 μm and a channel width (W) of 1 μm.

Figure 28A:
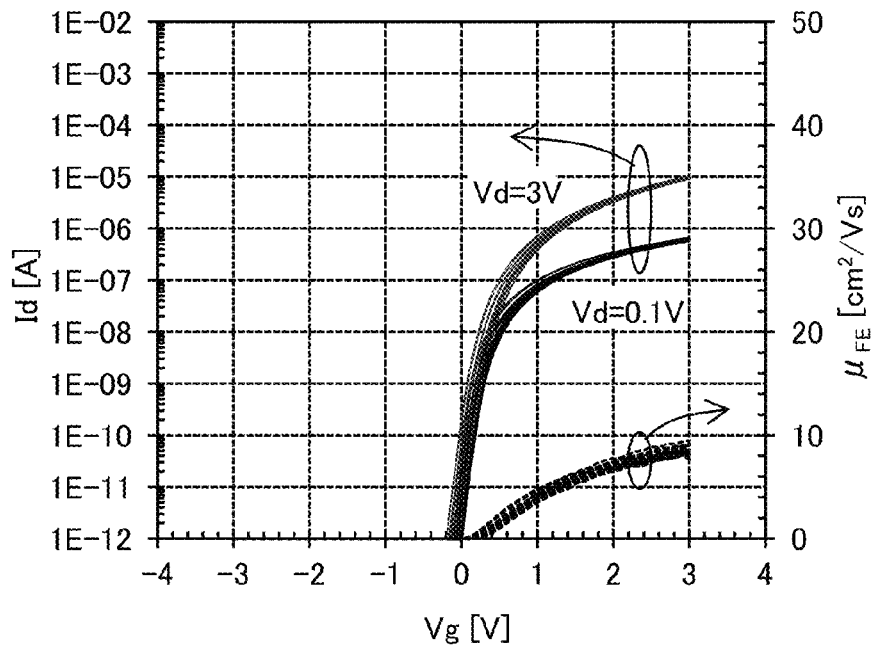
FIGS. 28A and 28B each show the $V_g$-$I_d$ characteristics of a transistor.
Figure 28B:
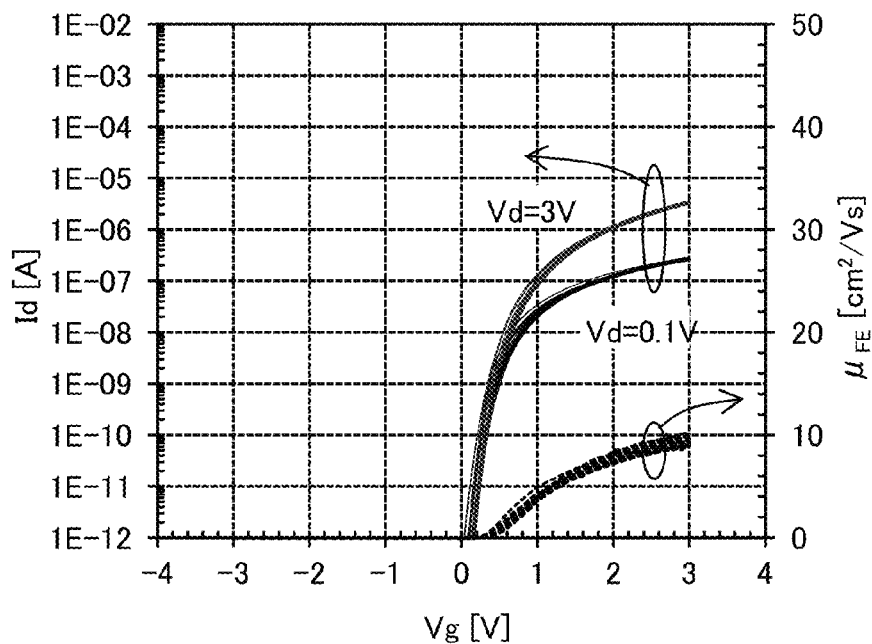

In FIGS. 28A and 28B, 25 points of the $V_g$-$I_d$ characteristics of Example Sample 2 are shown together. Note that FIG. 28A shows the $V_g$-$I_d$ characteristics of a transistor having a channel length (L) of 0.46 μm and a channel width (W) of 1 μm. FIG. 28B shows the $V_g$-$I_d$ characteristics of a transistor having a channel length (L) of 1.1 μm and a channel width (W) of 1 μm.

Average values of the electric characteristics of Example Samples 1 and 2 are shown in Table 1. Note that the threshold voltage (Vth) refers to a gate voltage when a channel is formed (voltage between a source and a gate). In a curve where the horizontal axis represents the gate voltage (Vg) and the vertical axis represents the square root of drain current (Id) and where data are plotted (Vg-√Id characteristics), the threshold voltage (Vth) was defined as a gate voltage (Vg) at a point of intersection of an extrapolated tangent line having the highest inclination with the square root of drain current (Id) of 0 (Id=0 A). In a curve where the horizontal axis represents the gate voltage (Vg) and the vertical axis represents the logarithm of the drain current (Id) and where data are plotted (Vg-Id characteristics), the shift value (Shift) is defined as a gate voltage (Vg) at a point of intersection of an extrapolated tangent line having the highest inclination with a drain current (Id) of 1×10$^{-12}$ A. In Table 1, the field-effect mobility ($\mu_{FE}$) and the subthreshold swing value (S value) were calculated from the $V_g$-$I_d$ characteristics at a drain voltage ($V_d$) of 0.1 V, and the threshold voltage ($V_{th}$) and the shift value (Shift) was calculated from the $V_g$-$I_d$ characteristics at a drain voltage ($V_d$) of 3V.

TABLE 1

|  | Example Sample 1 | | Example Sample 2 | |
|---|---|---|---|---|
| L [μm] | 0.48 | 1.1 | 0.46 | 1.1 |
| $\mu_{FE}$ [cm$^2$/Vs] | 6.06 | 7.63 | 8.51 | 9.16 |
| S value [mV/dec.] | 112.0 | 119.6 | 79.9 | 84.4 |
| Vth [V] | 0.84 | 1.00 | 0.51 | 0.75 |
| Shift [V] | 0.07 | 0.26 | −0.10 | 0.15 |

It is found from FIGS. 27A and 27B, FIGS. 28A and 28B, and Table 1 that each of Example Samples 1 and 2 is a transistor with excellent electrical characteristics. In particular, it is found that Example Sample 2 has higher field-effect mobility ($\mu_{FE}$) and smaller subthreshold swing value (S value) than Example Sample 1, and thus is a transistor with extremely excellent electrical characteristics. Accordingly, it is found that as the oxide layer 206a is thicker, a transistor can have better electrical characteristics.

Next, the $V_g$-$I_d$ characteristics of Example Samples 1 and 2 before and after a gate BT (Bias-Temperature) stress test were measured.

In the positive gate BT stress test, first, the substrate temperature was set to 40° C. and the first measurement of the $V_g$-$I_d$ characteristics was performed. Next, the substrate temperature was set to 150° C., the gate voltage ($V_g$) was set to 3.3 V, and the drain voltage ($V_d$) was set to 0 V, and the transistors were kept in these conditions for an hour. After that, while the gate voltage ($V_g$) was kept at 3.3 V, the substrate temperature was set to 40° C. and the second measurement of the $V_g$-$I_d$ characteristics was performed.

In the negative GBT test, first, the substrate temperature was set to 40° C. and the first measurement of the $V_g$-$I_d$ characteristics was performed. Next, the substrate temperature was set to 150° C., the gate voltage ($V_g$) was set to −3.3 V, and the drain voltage ($V_d$) was set to 0 V, and the transistors were kept in these conditions for an hour. After that, while the gate voltage ($V_g$) was kept at −3.3 V, the substrate temperature was set to 40° C. and the second measurement of the $V_g$-$I_d$ characteristics was performed.

Figure 29A:
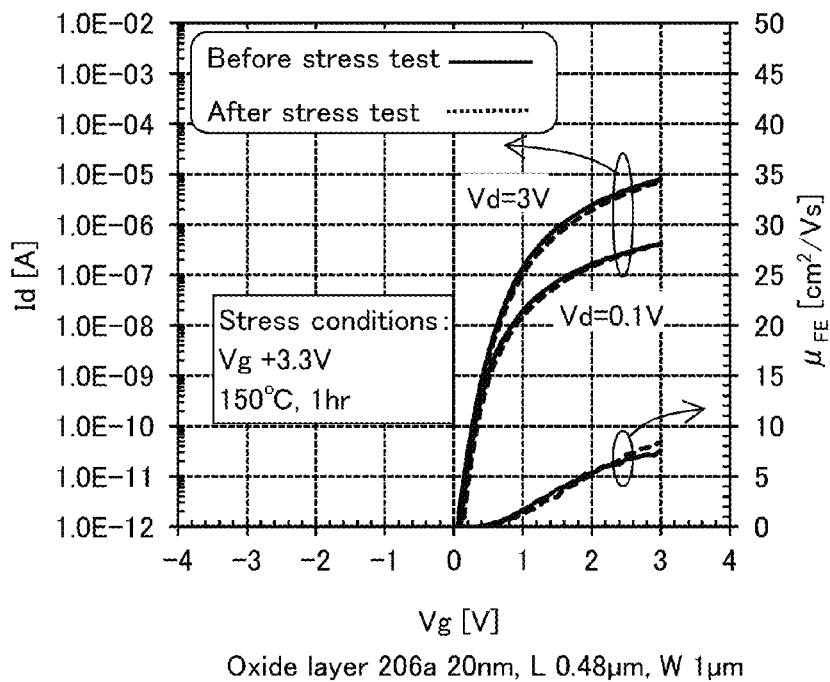
FIGS. 29A and 29B each show the $V_g$-$I_d$ characteristics of a transistor before and after a gate BT stress test.
Figure 29B:
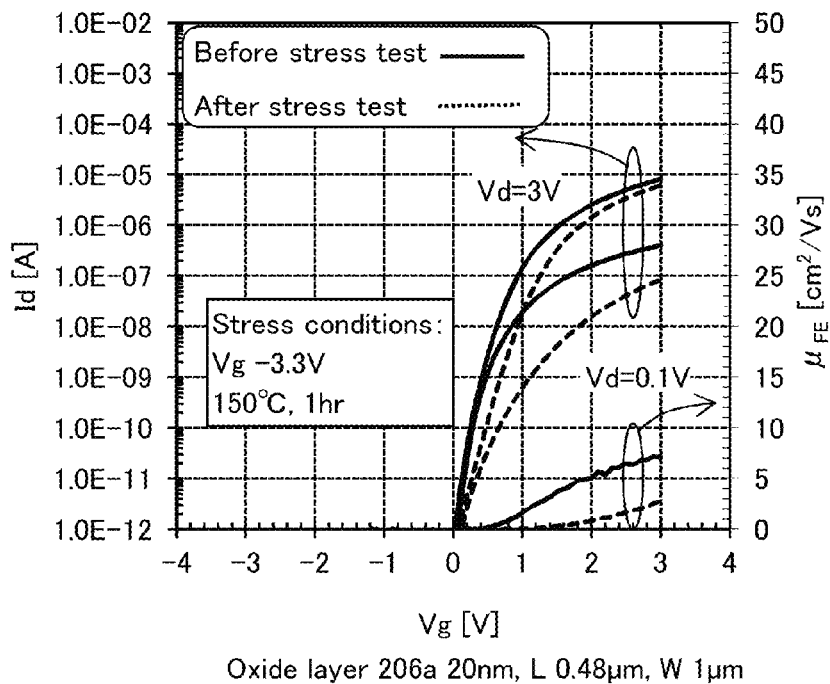

FIGS. 29A and 29B show the $V_g$-$I_d$ characteristics of Example Sample 1 before and after the gate BT stress test. The right axis shows the field-effect mobility ($\mu_{FE}$) of Example Sample 1 at the drain voltage ($V_d$) of 0.1 V. FIG. 29A shows the $V_g$-$I_d$ characteristics of Example Sample 1 before and after the positive gate BT stress test. FIG. 29B shows the $V_g$-$I_d$ characteristics of Example Sample 1 before and after the negative gate BT stress test. Note that the transistor has a channel length (L) of 0.48 μm and a channel width (W) of 1 μm, and the measurement of the $V_g$-$I_d$ characteristics thereof was performed. Further, the measurement of the $V_g$-$I_d$ characteristics was performed by measuring drain current ($I_d$) when the drain voltage ($V_d$) was set to 0.1 V or 3 V and the gate voltage ($V_g$) was swept in the range of −3 V to +3V.

Figure 30A:
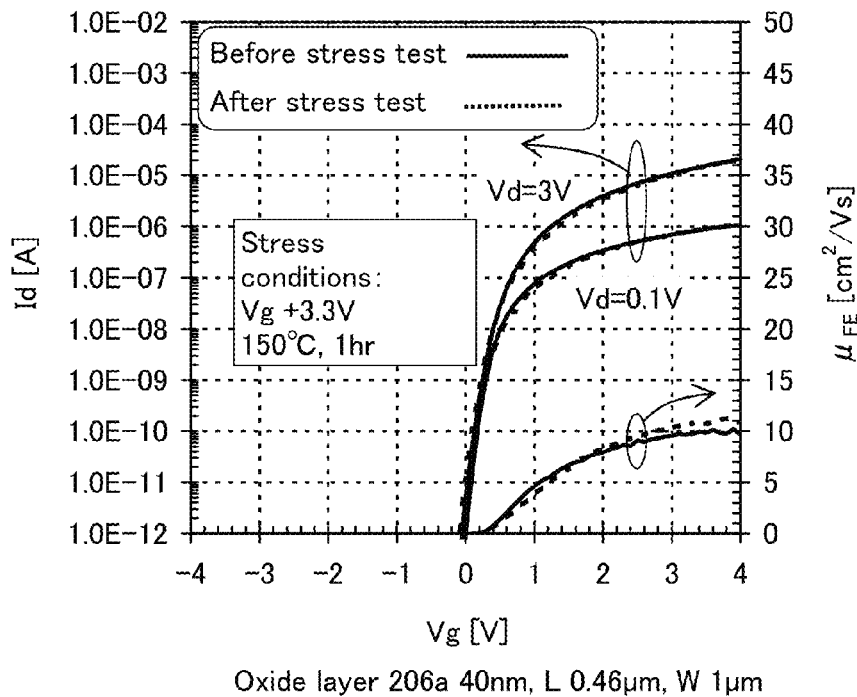
FIGS. 30A and 30B each show the $V_g$-$I_d$ characteristics of a transistor before and after a gate BT stress test.
Figure 30B:
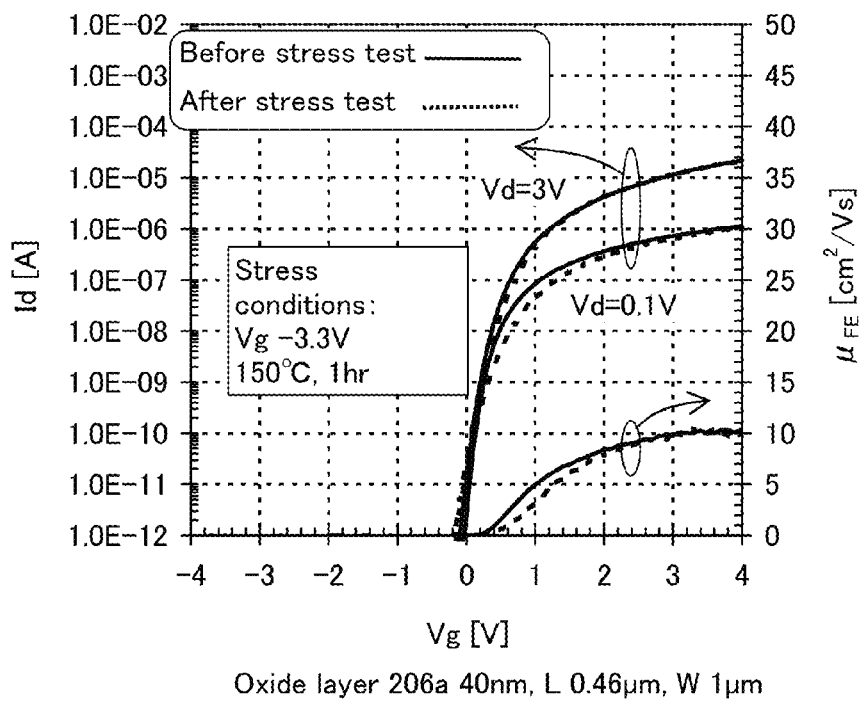

FIGS. 30A and 30B show the $V_g$-$I_d$ characteristics of Example Sample 2 before and after the gate BT stress test. The right axis shows the field-effect mobility ($\mu_{FE}$) of Example Sample 2 with the drain voltage ($V_d$) of 0.1 V. FIG. 30A shows the $V_g$-$I_d$ characteristics of Example Sample 2 before and after the positive gate BT stress test. FIG. 30B shows the $V_g$-$I_d$ characteristics of Example Sample 2 before and after the negative gate BT stress test. Note that the transistor has a channel length (L) of 0.46 μm and a channel width (W) of 1 μm, and the measurement of the $V_g$-$I_d$ characteristics thereof was performed. Note that the measurement of the $V_g$-$I_d$ characteristics was performed by measuring drain current ($I_d$) when the drain voltage ($V_d$) was set to 0.1 V or 3 V and the gate voltage ($V_g$) was swept in the range of −4 V to +4V.

Table 2 shows changes in threshold voltage (ΔVth) and shift values (ΔShift) of Example Samples 1 and 2 between before and after the gate BT stress tests.

TABLE 2

|  | Example Sample 1 | | Example Sample 2 | |
| --- | --- | --- | --- | --- |
| Stress Voltage | +3.3 V | −3.3 V | +3.3 V | −3.3 V |
| ΔVth [V] | 0.17 | 0.31 | 0.11 | 0.04 |
| ΔShift [V] | 0.04 | 0.07 | −0.04 | 0.09 |

It is found from FIGS. 29A and 29B, FIGS. 30A and 30B, and Table 2 that each of Example Samples 1 and 2 is a transistor with stable electrical characteristics. In particular, it is found that Example Sample 2 has a smaller change in threshold voltage (ΔVth) than that of Example Sample 1, which has a relatively large change in threshold voltage (ΔVth) and thus is a transistor with extremely stable electrical characteristics. Accordingly, it is found that as the oxide layer 206a is thicker, a transistor can have higher reliability.

This example shows that a transistor of one embodiment of the present invention has excellent electric characteristics and high reliability.

This application is based on Japanese Patent Application serial no. 2013-007894 filed with Japan Patent Office on Jan. 18, 2013, the entire contents of which are hereby incorporated by reference.

What is claimed is:

1. A semiconductor device comprising:
   an insulating layer;
   a first oxide layer on and in contact with the insulating layer;
   an oxide semiconductor layer on and in contact with the first oxide layer;
   a second oxide layer on and in contact with the oxide semiconductor layer; and
   a conductive layer over the second oxide layer,
   wherein a thickness of the first oxide layer is 20 nm or more,
   wherein the first oxide layer is thicker than the oxide semiconductor layer, and
   wherein the oxide semiconductor layer is thicker than the second oxide layer.

2. The semiconductor device according to claim 1,
   wherein the first oxide layer includes one or more kinds of elements included in the oxide semiconductor layer other than oxygen.

3. The semiconductor device according to claim 1,
   wherein the first oxide layer is formed from oxygen and one or more kinds of elements forming the oxide semiconductor layer other than oxygen.

4. The semiconductor device according to claim 1,
   wherein the first oxide layer and the second oxide layer each include one or more kinds of elements included in the oxide semiconductor layer other than oxygen.

5. The semiconductor device according to claim 1,
   wherein the first oxide layer and the second oxide layer are each formed from oxygen and one or more kinds of elements forming the oxide semiconductor layer other than oxygen.

6. The semiconductor device according to claim 1, further comprising a substrate,
   wherein the insulating layer is interposed between the substrate and the first oxide layer.

7. An electronic appliance including the semiconductor device according to claim 1.

8. A display device including the semiconductor device according to claim 1.

9. A semiconductor device comprising:
   an insulating layer;
   a first oxide layer on and in contact with the insulating layer;
   an oxide semiconductor layer on and in contact with the first oxide layer; and
   a second oxide layer on and in contact with the oxide semiconductor layer; and
   a conductive layer over the second oxide layer,
   wherein the first oxide layer, the second oxide layer, and the oxide semiconductor layer each contain indium, wherein a thickness of the first oxide layer is 20 nm or more,
wherein the first oxide layer is thicker than the oxide semiconductor layer, and
wherein the oxide semiconductor layer is thicker than the second oxide layer.

10. The semiconductor device according to claim 9,
wherein the first oxide layer is formed from oxygen and more than one kind of elements forming the oxide semiconductor layer other than oxygen, including indium.

11. The semiconductor device according to claim 9,
wherein the first oxide layer and the second oxide layer each include more than one kind of elements included in the oxide semiconductor layer other than oxygen, including indium.

12. The semiconductor device according to claim 9,
wherein the first oxide layer and the second oxide layer are each formed from more than one kind of elements forming the oxide semiconductor layer other than oxygen, including indium.

13. The semiconductor device according to claim 9 further comprising a substrate,
wherein the insulating layer is interposed between the substrate and the first oxide layer.

14. An electronic appliance including the semiconductor device according to claim 9.

15. A display device including the semiconductor device according to claim 9.

16. A semiconductor device comprising:
an insulating layer;
a first oxide layer on and in contact with the insulating layer;
an oxide semiconductor layer on and in contact with the first oxide layer;
a second oxide layer on and in contact with the oxide semiconductor layer; and
a conductive layer over the second oxide layer,
wherein the oxide semiconductor layer, the first oxide layer, and the second oxide layer each contain indium, gallium, and zinc,
wherein a thickness of the first oxide layer is 20 nm or more,
wherein the first oxide layer is thicker than the oxide semiconductor layer, and
wherein the oxide semiconductor layer is thicker than the second oxide layer.

17. The semiconductor device according to claim 16,
wherein the first oxide layer and the oxide semiconductor layer are formed from indium, gallium, zinc, and oxygen.

18. The semiconductor device according to claim 16,
wherein the first oxide layer, the oxide semiconductor layer, and the second oxide layer are each formed from indium, gallium, zinc, and oxygen.

19. The semiconductor device according to claim 16 further comprising a substrate,
wherein the insulating layer is interposed between the substrate and the first oxide layer.

20. The semiconductor device according to claim 16, further comprising:
a substrate below the insulating layer;
a first electrode and a second electrode each interposed between the oxide semiconductor layer and the second oxide layer; and
a gate insulating layer on the second oxide layer and between the second oxide layer and the conductive layer,
wherein the first oxide layer, the oxide semiconductor layer, and the second oxide layer are each formed from indium, gallium, and zinc.

21. The semiconductor device according to claim 16,
wherein the first oxide layer and the second oxide layer have energy gaps wider than the oxide semiconductor layer.

22. An electronic appliance including the semiconductor device according to claim 16.

23. A display device including the semiconductor device according to claim 16.

24. A method for manufacturing a semiconductor device comprising the steps of:
forming a first oxide layer over a first insulating film from which oxygen can be released by heat treatment;
forming an oxide semiconductor layer over the first oxide layer;
forming a second oxide layer so as to cover the first insulating film, the first oxide layer, and the oxide semiconductor layer and then performing a heat treatment;
forming a second insulating film over the second oxide layer;
forming a conductive film over the second insulating film; and
forming a gate electrode by etching part of the conductive film,
wherein the first oxide layer is thicker than the oxide semiconductor layer, and
wherein the oxide semiconductor layer is thicker than the second oxide layer.

25. The method for manufacturing a semiconductor device according to claim 24, further comprising the steps of:
forming a source electrode and a drain electrode over the oxide semiconductor layer prior to forming the second oxide layer;
forming a gate insulating film by etching part of the second insulating film; and
forming a third oxide layer by etching part of the second oxide layer.

26. The method for manufacturing a semiconductor device according to claim 25, further comprising the steps of:
forming a third insulating film over the first insulating film, the first oxide layer, the oxide semiconductor layer, the source electrode, the drain electrode, the third oxide layer, the gate insulating film, and the gate electrode; and
forming a fourth insulating film having a function of blocking oxygen over the third insulating film.

27. The semiconductor device according to claim 1, further comprising:
a first electrode and a second electrode each interposed between the oxide semiconductor layer and the second oxide layer; and
a gate insulating layer on the second oxide layer and between the second oxide layer and the conductive layer.

28. The semiconductor device according to claim 9, further comprising:
a first electrode and a second electrode each interposed between the oxide semiconductor layer and the second oxide layer; and
a gate insulating layer on the second oxide layer and between the second oxide layer and the conductive layer.

29. The semiconductor device according to claim 1,
wherein an energy gap of the first oxide layer and an energy gap of the second oxide layer are wider than an energy gap of the oxide semiconductor layer.

30. The semiconductor device according to claim 9,
wherein an energy gap of the first oxide layer and an energy gap of the second oxide layer are wider than an energy gap of the oxide semiconductor layer.

31. The semiconductor device according to claim 16,
wherein an energy gap of the first oxide layer and an energy gap of the second oxide layer are wider than an energy gap of the oxide semiconductor layer.

32. The method for manufacturing a semiconductor device according to claim 24,
wherein an energy gap of the first oxide layer and an energy gap of the second oxide layer are wider than an energy gap of the oxide semiconductor layer.

33. The semiconductor device according to claim 1,
wherein an energy at a bottom of a conduction band of the first oxide layer and an energy at a bottom of a conduction band of the second oxide layer are each higher than an energy at a bottom of a conduction band of the oxide semiconductor layer.

34. The semiconductor device according to claim 9,
wherein an energy at a bottom of a conduction band of the first oxide layer and an energy at a bottom of a conduction band of the second oxide layer are each higher than an energy at a bottom of a conduction band of the oxide semiconductor layer.

35. The semiconductor device according to claim 16,
wherein an energy at a bottom of a conduction band of the first oxide layer and an energy at a bottom of a conduction band of the second oxide layer are each higher than an energy at a bottom of a conduction band of the oxide semiconductor layer.

36. The method for manufacturing a semiconductor device according to claim 24,
wherein an energy at a bottom of a conduction band of the first oxide layer and an energy at a bottom of a conduction band of the second oxide layer are each higher than an energy at a bottom of a conduction band of the oxide semiconductor layer.

37. The semiconductor device according to claim 1,
wherein the oxide semiconductor layer has a higher atomic proportion of indium than the first oxide layer and the second oxide layer.

38. The semiconductor device according to claim 9,
wherein the oxide semiconductor layer has a higher atomic proportion of indium than the first oxide layer and the second oxide layer.

39. The semiconductor device according to claim 16,
wherein the oxide semiconductor layer has a higher atomic proportion of indium than the first oxide layer and the second oxide layer.

40. The method for manufacturing a semiconductor device according to claim 24,
wherein the oxide semiconductor layer has a higher atomic proportion of indium than the first oxide layer and the second oxide layer.

* * * * *